(12) United States Patent
Newman

(10) Patent No.: US 8,187,907 B1
(45) Date of Patent: May 29, 2012

(54) SOLDER STRUCTURES FOR FABRICATION OF INVERTED METAMORPHIC MULTIJUNCTION SOLAR CELLS

(75) Inventor: Fred Newman, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 162 days.

(21) Appl. No.: 12/775,946

(22) Filed: May 7, 2010

(51) Int. Cl.
*H01L 21/00* (2006.01)

(52) U.S. Cl. ............ 438/66; 438/67; 438/464; 438/692; 438/959; 257/619; 257/772; 257/779; 257/E21.23; 257/E21.237; 257/E21.483; 257/E27.124; 257/E27.125; 257/E27.126; 257/E25.007; 257/E25.009; 257/E29.295

(58) Field of Classification Search ............ 438/66, 438/67, 692, 464, 959
See application file for complete search history.

(56) References Cited

U.S. PATENT DOCUMENTS

| | | | |
|---|---|---|---|
| 3,488,834 A | 1/1970 | Baird | |
| 3,964,155 A | 6/1976 | Leinkram et al. | |
| 4,001,864 A | 1/1977 | Gibbons et al. | |
| 4,255,211 A | 3/1981 | Fraas | |
| 4,338,480 A | 7/1982 | Antypas et al. | |
| 4,393,576 A | 7/1983 | Dahlberg | |
| 4,612,408 A | 9/1986 | Moddel et al. | |
| 4,881,979 A | 11/1989 | Lewis | |
| 5,019,177 A | 5/1991 | Wanlass | |
| 5,021,360 A | 6/1991 | Melman et al. | |
| 5,053,083 A | 10/1991 | Sinton et al. | |
| 5,217,539 A | 6/1993 | Fraas et al. | |
| 5,322,572 A | 6/1994 | Wanlass et al. | |
| 5,342,453 A | 8/1994 | Olson | |
| 5,376,185 A | 12/1994 | Wanlass | |
| 5,479,032 A | 12/1995 | Forrest et al. | |
| 5,510,272 A | 4/1996 | Morikawa et al. | |
| 5,944,913 A | 8/1999 | Hou et al. | |
| 6,165,873 A | 12/2000 | Hamada | |
| 6,180,432 B1 | 1/2001 | Freeouf | |
| 6,239,354 B1 | 5/2001 | Wanlass et al. | |
| 6,252,287 B1 | 6/2001 | Kurtz et al. | |
| 6,281,426 B1 | 8/2001 | Olson et al. | |
| 6,300,557 B1 | 10/2001 | Wanlass et al. | |
| 6,300,558 B1 | 10/2001 | Takamoto et al. | |
| 6,340,788 B1 | 1/2002 | King et al. | |

(Continued)

FOREIGN PATENT DOCUMENTS

EP    1 109 230 A2    6/2001

(Continued)

OTHER PUBLICATIONS

Miller ("Controlled Collapse Reflow Chip Joining", Hybrid Microelectronic Symposium, Chicago, IL, pp. 239-250, Feb. 13, 1969).*

(Continued)

*Primary Examiner* — Charles Garber
*Assistant Examiner* — Yasser Abdelaziez

(57) ABSTRACT

A method of manufacturing a solar cell by providing a first substrate; depositing on the first substrate a sequence of layers of semiconductor material forming a solar cell including a top subcell and a bottom subcell; forming a metal back contact over the bottom subcell; forming a group of discrete, spaced-apart first bonding elements over the surface of the back metal contact; attaching a surrogate substrate on top of the back metal contact using the bonding elements; and removing the first substrate to expose the surface of the top subcell.

14 Claims, 54 Drawing Sheets

U.S. PATENT DOCUMENTS

| | | | |
|---|---|---|---|
| 6,482,672 B1 | 11/2002 | Hoffman et al. | |
| 6,660,928 B1 | 12/2003 | Patton et al. | |
| 6,690,041 B2 | 2/2004 | Armstrong et al. | |
| 6,951,819 B2 | 10/2005 | Iles et al. | |
| 7,071,407 B2 | 7/2006 | Fatemi et al. | |
| 7,166,520 B1 | 1/2007 | Henley | |
| 7,727,795 B2 | 6/2010 | Stan | |
| 7,741,146 B2 | 6/2010 | Cornfeld | |
| 7,785,989 B2 | 8/2010 | Sharps | |
| 7,842,881 B2 | 11/2010 | Cornfeld | |
| 2002/0117675 A1 | 8/2002 | Mascarenhas | |
| 2003/0226952 A1 | 12/2003 | Clark | |
| 2004/0079408 A1 | 4/2004 | Fetzer | |
| 2004/0166681 A1 | 8/2004 | Iles et al. | |
| 2004/0200523 A1 | 10/2004 | King et al. | |
| 2005/0042838 A1* | 2/2005 | Garyainov et al. | 438/455 |
| 2005/0211291 A1 | 9/2005 | Bianchi | |
| 2005/0274411 A1 | 12/2005 | King et al. | |
| 2006/0021565 A1 | 2/2006 | Zahler et al. | |
| 2006/0112986 A1 | 6/2006 | Atwater, Jr. et al. | |
| 2006/0144435 A1 | 7/2006 | Wanlass et al. | |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1* | 12/2007 | Cornfeld et al. | 136/255 |
| 2008/0029151 A1 | 2/2008 | McGlynn | |
| 2008/0149173 A1 | 6/2008 | Sharps | |
| 2008/0185038 A1 | 8/2008 | Sharps | |
| 2008/0245409 A1 | 10/2008 | Varghese | |
| 2009/0038679 A1 | 2/2009 | Varghese | |
| 2009/0050903 A1* | 2/2009 | Chitnis | 257/79 |
| 2009/0078308 A1 | 3/2009 | Varghese | |
| 2009/0078309 A1 | 3/2009 | Stan | |
| 2009/0078310 A1 | 3/2009 | Stan | |
| 2009/0078311 A1 | 3/2009 | Stan | |
| 2009/0155951 A1 | 6/2009 | Stan et al. | |
| 2009/0155952 A1 | 6/2009 | Stan | |
| 2009/0188546 A1 | 7/2009 | McGlynn | |
| 2009/0223554 A1 | 9/2009 | Sharps | |
| 2009/0229658 A1 | 9/2009 | Stan | |
| 2009/0229662 A1 | 9/2009 | Stan | |
| 2009/0272430 A1 | 11/2009 | Cornfeld | |
| 2009/0272438 A1 | 11/2009 | Cornfeld | |
| 2009/0288703 A1 | 11/2009 | Stan | |
| 2009/0314348 A1 | 12/2009 | McGlynn | |
| 2010/0012174 A1 | 1/2010 | Varghese | |
| 2010/0012175 A1 | 1/2010 | Varghese | |
| 2010/0031994 A1 | 2/2010 | Varghese | |
| 2010/0041178 A1 | 2/2010 | Cornfeld et al. | |
| 2010/0047959 A1 | 2/2010 | Cornfeld | |
| 2010/0093127 A1 | 4/2010 | Sharps | |
| 2010/0116327 A1 | 5/2010 | Cornfeld | |
| 2010/0122724 A1 | 5/2010 | Cornfeld | |
| 2010/0122764 A1 | 5/2010 | Newman | |
| 2010/0147366 A1 | 6/2010 | Stan | |
| 2010/0186804 A1 | 7/2010 | Cornfeld | |
| 2010/0203730 A1 | 8/2010 | Cornfeld | |
| 2010/0206365 A1 | 8/2010 | Chumney | |
| 2010/0229913 A1 | 9/2010 | Cornfeld | |
| 2010/0229926 A1 | 9/2010 | Newman | |
| 2010/0229932 A1 | 9/2010 | Cornfeld | |
| 2010/0229933 A1 | 9/2010 | Cornfeld | |
| 2010/0233838 A1 | 9/2010 | Varghese | |
| 2010/0233839 A1 | 9/2010 | Cornfeld | |
| 2010/0236615 A1 | 9/2010 | Sharps | |
| 2010/0248411 A1 | 9/2010 | Cornfeld | |
| 2010/0282288 A1 | 11/2010 | Cornfeld | |
| 2011/030774 A1 | 2/2011 | Cornfeld | |
| 2011/0041898 A1 | 2/2011 | Cornfeld | |

FOREIGN PATENT DOCUMENTS

| | | | |
|---|---|---|---|
| EP | 1 863 099 A2 | 12/2007 | |
| EP | 0 658 944 B1 | 4/2009 | |
| FR | 2 878 076 A1 | 5/2006 | |
| WO | WO 2005/015638 A1 | 2/2005 | |

OTHER PUBLICATIONS

U.S. Appl. No. 12/265,113, filed Nov. 5, 2008, Varghese.

U.S. Appl. No. 12/708,361, filed Feb. 18, 2010, Cornfeld.

U.S. Appl. No. 12/716,814, filed Mar. 3, 2010, Cornfeld.

U.S. Appl. No. 12/730,018, filed Mar. 23, 2010, Cornfeld.

U.S. Appl. No. 12/756,926, filed Apr. 8, 2010, Cornfeld.

U.S. Appl. No. 12/813,408, filed Jun. 10, 2010, Patel.

U.S. Appl. No. 12/844,673, filed Jul. 27, 2010, Stan.

Office Action mailed Jan. 4, 2011. U.S. Appl. No. 11/445,793. (Sexl reference, double patenting rejection).

Sexl, M., et al., "MBE Growth of Metamorphic In(Ga)AlAs Buffers." 1997 IEEE International Symposium on Compound Semiconductors. Sep. 1997, pp. 49-52. IEEE, Piscataway, NJ.

Advisory Action mailed Mar. 15, 2011. U.S. Appl. No. 11/445,793.

Stan, M., et al., "High-efficiency quadruple junction solar cells using OMVPE with inverted metamorphic device structures." Journal of Crystal Growth 312 (2010), pp. 1370-1374. Elsevier, Amsterdam, Netherlands.

R. Venkatasubramanian, et al., "An Inverted-Growth Approach to Development of an IR-Transparent, High-Efficiency AlGaAs/GaAs Cascade Solar Cell." $22^{nd}$ IEEE Photovoltaic Specialists Conference, Oct. 7-11, 1991, Las Vegas, NV.

R. Venkatasubramanian, et al., "High-quality eutectic-metal-bonded AlGaAs-GaAs thin films on Si substrates." Applied Physics Letters, vol. 60, No. 7, pp. 886-888. Feb. 17, 1992. American Institute of Physics, Melville, NY.

M. Yamaguchi, "Physics and Technologies of Superhigh-Effficiency Tandem Solar Cells." Semiconductors, vol. 33, No. 9, Sep. 1999, pp. 961-964. Toyota Technological Institute, Nagoya, Japan. © 1999, American Institute of Physics.

R.R. King, et al., "Next-Generation, High-Efficiency III-V Multijunction Solar Cells." $28^{th}$ IEEE Photovoltaic Specialists Conference, Sep. 15-22, 2000, Anchorage, AK.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ.

R.R. King, et al., "High-Efficiency Space and Terrestrial Multijunction Solar Cells Through Bandgap Control in Cell Structures." 2002 Photovoltaic Specialists Conference, Conference Record of the $29^{th}$ IEEE, May 19-24, 2002, pp. 776-781. New Orleans, LA.

M.W. Wanlass et al., "Lattice-Mismatched Approaches for High-Performance, III-V Photovoltaic Energy Converters." Proceedings of the $31^{st}$ IEEE PVSC, Jan. 3-7, 2005, Lake Buena Vista, FL.

Takamoto, T., et al., "Future Development of InGaP/(In)GaAs Based Multijunction Solar Cells." Proceedings of the $31^{st}$ IEEE PVSC, Jan. 3-7, 2005, pp. 519-524. Lake Buena Vista, FL.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE $4^{th}$ World Conference on Photovoltaic Energy Conversion, May 7-12, 2006, Waikoloa, HI.

D.J. Friedman, et al., "0.7-eV GaInAs Junction for a GaInP/GaAs/GaInAs(1eV)/GaInAs(0.7eV) Four-Junction Solar Cell." 2006 IEEE $4^{th}$ World Conference on Photovoltaic Energy Conversion, May 7-12, 2006, Waikoloa, HI.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33$^{rd}$ IEEE Photovoltaic Specialists Conference, May 11-16, 2008, San Diego, CA.

J.F. Geisz, et al., "Inverted GaInP / (In)GaAs / InGaAs Triple-Junction Solar Cells with Low-Stress Metamorphic Bottom Junctions." 33$^{rd}$ IEEE Photovoltaic Specialists Conference, May 11-16, 2008, San Diego, CA.

A. Cornfeld, et al., "Development of a Large Area Inverted Metamorphic Multi-junction (IMM) Highly Efficient AM0 Solar Cell." 33$^{rd}$ IEEE Photovoltaic Specialists Conference, May 11-16, 2008, San Diego, CA.

A. Cornfeld, et al., "Development of a Large Area Inverted Metamorphic Multi-junction Highly Efficient AM0 Solar Cell." Conference paper presented at the 33$^{rd}$ IEEE Photovoltaic Specialists Conference (May 11-16, 2008) on May 12, 2008. San Diego, CA. 17 pages.

M. Stan, et al., "Very High Efficiency Triple Junction Solar Cells by MOVPE." 14$^{th}$ International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23$^{rd}$ European Photovoltaic Energy Conference, Sep. 1-5, 2008, Valencia, Spain.

"Partial European Search Report," Application No. EP 08 01 3466. Feb. 12, 2009. European Patent Office, Berlin, Germany.

"European Search Report," Application No. EP 08 01 3466. Dec. 18, 2009. European Patent Office, Berlin, Germany.

P. Wurfel. Physics of Solar Cells: from Basic Principles to Advanced Concepts. 2$^{nd}$, Updated and Expanded Edition. 2009. Sections 6.4, 6.5 and 6.8. 20 pages. Wiley-VCH, Weinheim, Germany.

* cited by examiner

US 8,187,907 B1

SOLDER STRUCTURES FOR FABRICATION OF INVERTED METAMORPHIC MULTIJUNCTION SOLAR CELLS

GOVERNMENT RIGHTS STATEMENT

This invention was made with government support under Contract No. FA9453-06-C-0345 awarded by the U.S. Air Force. The Government has certain rights in the invention.

REFERENCE TO RELATED APPLICATIONS

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/637,241, filed Dec. 14, 2009.

This application is related to co-pending U.S. patent application Ser. No. 12/623,134, filed Nov. 20, 2009.

This application is related to co-pending U.S. patent application Ser. No. 12/544,001, filed Aug. 19, 2009.

This application is related to co-pending U.S. patent application Ser. Nos. 12/401,137, 12/401,157, and 12/401,189, filed Mar. 10, 2009.

This application is related to co-pending U.S. patent application Ser. No. 12/389,053, filed Feb. 19, 2009.

This application is related to co-pending U.S. patent application Ser. No. 12/367,991, filed Feb. 9, 2009.

This application is related to co-pending U.S. patent application Ser. No. 12/362,201, Ser. No. 12/362,213, and Ser. No. 12/362,225, filed Jan. 29, 2009.

This application is related to co-pending U.S. patent application Ser. No. 12/337,014 and Ser. No. 12/337,043 filed Dec. 17, 2008.

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449, filed Aug. 12, 2008.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007, and its divisional application Ser. No. 12/187,454 filed Aug. 7, 2008;

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006, and its divisional application Ser. No. 12/417,367 filed Apr. 3, 2006, and Ser. No. 12/549,340 filed Aug. 27, 2009.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

Prior to the disclosures described in various ones or combinations of this and the related applications noted above, the materials and fabrication steps disclosed in the prior art have various drawbacks and disadvantages in producing a commercially viable inverted metamorphic multijunction solar cell using commercially established fabrication processes.

SUMMARY OF THE INVENTION

Briefly, and in general terms, the present invention provides a method of manufacturing a solar cell by providing a first substrate; depositing on the first substrate a sequence of layers of semiconductor material forming a solar cell including a top subcell and a bottom subcell; forming a metal back contact over the bottom subcell; forming a group of discrete, spaced-apart first bonding elements over the surface of the back metal contact; attaching a surrogate substrate on top of the back metal contact using the bonding elements; and removing the first substrate to expose the surface of the top subcell.

In another aspect the present invention provides a method of manufacturing a solar cell by providing a first substrate; depositing on a first substrate a sequence of layers of semiconductor material forming a solar cell including a top subcell and a bottom subcell; forming a metal back contact over the bottom subcell; providing a surrogate substrate; forming a group of discrete, spaced-apart bonding elements over the surface of the surrogate substrate; attaching a surrogate substrate on top of the back metal contact using the bonding elements; and removing the first substrate to expose the surface of the top subcell.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
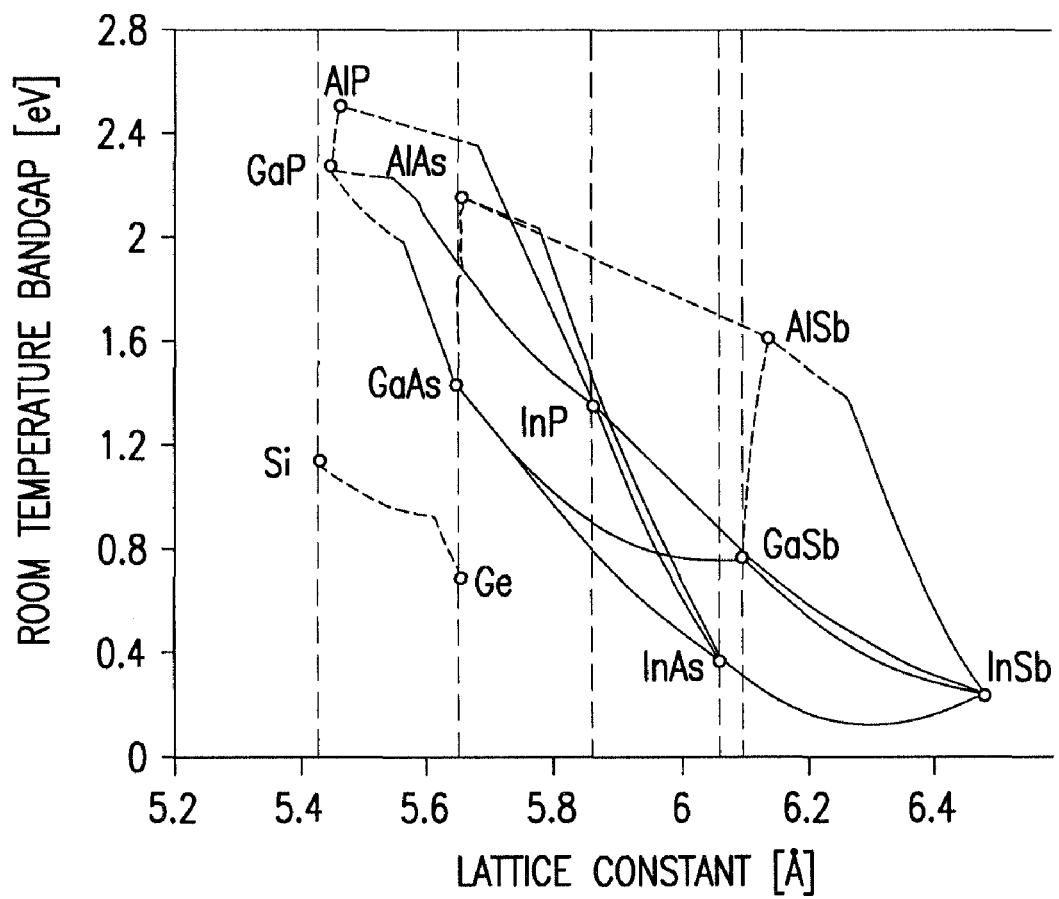
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would be the "top" subcells facing the solar radiation in the final semiconductor structure, are initially grown epitaxially directly on a semiconductor growth substrate, such as for example GaAs or Ge, so that such subcells are consequently lattice matched to such substrate. One or more lower band gap middle subcells (i.e. with band gaps in the range of 1.2 to 1.8 eV) can then be grown on the high band gap subcells.

At least one lower subcell is formed over the middle subcell such that the at least one in lower subcell is substantially lattice mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features and aspects of inverted metamorphic multijunction solar cells are disclosed in the related applications noted above. Some or all of such features may be included in the structures and processes associated with the solar cells of the present disclosure. More particularly, one aspect of the present disclosure is directed to the composition, pattern, and processing technique associated with the bonding elements that are applied between the surface of the back metal contact and the surface of the surrogate substrate.

It should be apparent to one skilled in the art that in addition to the bonding elements, additional types of bonding materials and processes within the cell are also within the scope of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual Ga and Al constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
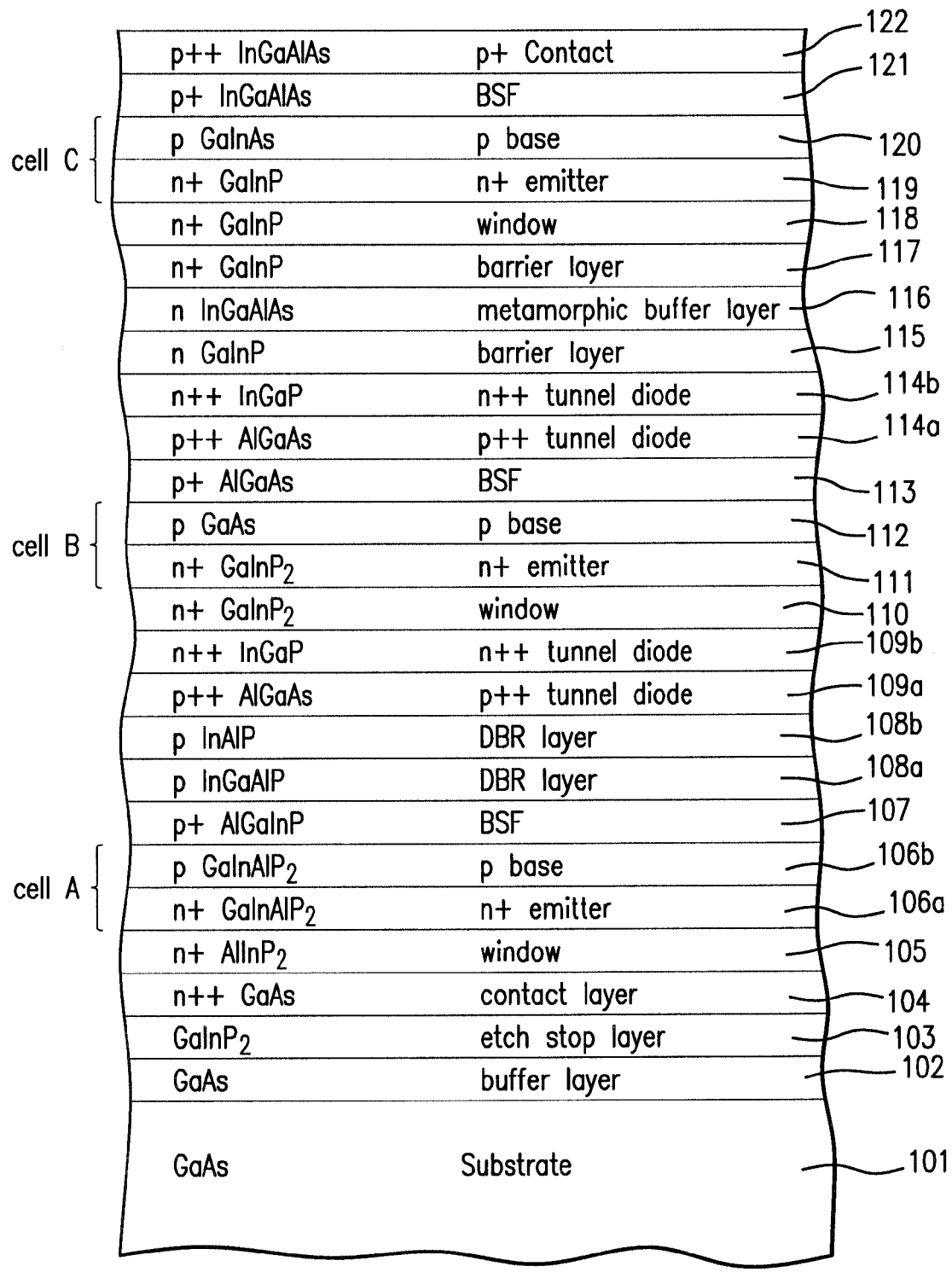
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008. Other alternative growth substrates, such as described in U.S. patent application Ser. No. 12/337,014 filed Dec. 17, 2008, may be used as well.

In the case of a Ge substrate, a nucleation layer (not shown) may be deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106a is composed of InGa(Al)P and the base layer 106b is composed of InGa(Al)P. The aluminum or Al term in parenthesis in the preceding formula means that Al is an optional constituent, and in this instance may be used in an amount ranging from 0% to 30%.

The doping profile of the emitter and base layers 106a and 106b according to an embodiment of the present invention will be discussed in conjunction with FIG. 15.

Subcell A will ultimately become the "top" subcell of the inverted metamorphic multijunction semiconductor solar cell structure after completion of the process steps according to embodiments of the present invention to be described hereinafter.

On top of the base layer 106b a back surface field ("BSF") layer 107 preferably p+ AlGaInP is deposited and used to reduce recombination loss.

The BSF layer 107 may function to drive minority carriers from the region near the base/BSF interface surface to minimize the effect of recombination loss. In other words, BSF layer 107 reduces recombination loss at the backside of the solar subcell A and thereby reduces the recombination in the base.

On top of the BSF layer 107, an optional first distributed Bragg reflector (DBR) layer 108a may be deposited. A Bragg grating is essentially a sequence of uniformly spaced layers with a partially reflective interface between layers. In one embodiment of the solar cell of the present disclosure, the DBR layer 108a/108b may be composed of a plurality of alternating layers of lattice matched materials with discontinuities in their respective indices of refraction. The difference in refractive index is maximized in order to minimize the number of periods required to achieve a given reflectivity. The thickness and refractive index of each period determines the stop band and its limiting wavelength. In one embodiment, the first DBR layer 108a is composed of p type InGaAlP, and the second DBR layer 1080b is composed of InAlP. In another embodiment, the first DBR layer 108a is composed of p type AlGaAs, or more specifically $(Al_xGa_{1-x})As$; and the second DBR layer 108b, disposed over layer 108a, is also composed of p type AlGaAs, or more specifically $(Al_yGa_{1-y})As$, where y is greater than x, i.e. the amount of the Al mole fraction in layer 108b is greater than that in the layer 108a. In order not to increase the thickness of the solar cell, the thickness of the base layer 106b is preferably reduced by an amount approximately equal to the thickness of the DBR layers 108a and 108b.

The incorporation of a DBR layer "below" the BSF layer 107 (as seen from the direction of incident light entering the solar cell at the top subcell A, and continuing through subcell B) with an appropriate stop band and cut-off wavelength is expected to increase the short circuit current by maintaining or exceeding the absorption volume.

On top of the BSF layer 107 (or on top of the DBR layers 108a/108b in that embodiment) is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. In various embodiments these layers may be composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to some embodiments of the present invention will be discussed in conjunction with FIG. 15.

In previously disclosed implementations of an inverted metamorphic solar cell, the middle cell was a homostructure. In some embodiments of the present invention, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle subcell. Moreover, the window layer 110 is preferably doped three times that of the emitter layer 111 to move the Fermi level up closer to the conduction band and therefore create band bending at the window/emitter interface which results in constraining the minority carriers to the emitter layer.

In one of the embodiments of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the respective emitters. In summary, the advantages of the embodiments using heterojunction subcells are: (i) the short wavelength response for both subcells are improved, and (ii) the bulk of the radiation is more effectively absorbed and collected in the narrower band gap base. The overall effect will be to increase the short circuit current $J_{sc}$.

On top of the cell B is deposited a BSF layer 113 which performs the same function as the BSF layer 109. The p++/n++tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++InGaP.

In some embodiments, barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells A and B, or in the direction of growth into the bottom subcell C, and is more particularly described in copending U.S. patent application Ser. No. 11/860,183, filed Sep. 24, 2007.

A metamorphic layer (or graded interlayer) 116 may be deposited over the barrier layer 115, in some embodiments preferably using a surfactant. Layer 116 is referred to as a graded interlayer since in some embodiments it is preferably a compositionally step-graded series of InGaAlAs sublayers, preferably with monotonically changing lattice constant in each step, so that the sequence of sublayers achieves a gradual transition in lattice constant in the semiconductor structure from the lattice constant of subcell B to the lattice constant of subcell C while minimizing threading dislocations from occurring. In some embodiments, the band gap of layer 116 is constant throughout its thickness, preferably approximately equal to 1.5 eV, or otherwise consistent with a value slightly greater than the base bandgap of the middle subcell B.

In some embodiments, the graded interlayer may be composed of $(In_xGa_{1-x})_yAl_{1-y}As$, with the values of x and y selected for each respective sublayer such that the band gap of the entire interlayer remains constant at approximately 1.50 eV or other appropriate band gap over its thickness.

In some embodiments providing the surfactant assisted growth of the metamorphic layer 116, a suitable chemical element is introduced into the reactor during the growth of layer 116 to improve the surface characteristics of the layer. In some embodiments, such element may be a dopant or donor atom such as selenium (Se) or tellurium (Te). Small amounts of Se or Te may therefore be incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants, one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the graded interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one of the preferred embodiments of the present invention, the layer 116 is composed of a plurality of layers of InGaAlAs, with monotonically changing lattice constant, each layer having the same bandgap, approximately 1.5 eV.

One advantage of utilizing a constant bandgap material such as InGaAlAs over a phosphide based material is that arsenide-based semiconductor material is more advantageous and is much easier to process in standard commercial MOCVD reactors, compared to the use of phosphide materials. Moreover, the use of a small amount of aluminum allows appropriate adjustment of the band gap of the sublayers throughout the thickness of the layer that assures radiation transparency of the metamorphic layers.

Although one of the preferred embodiments of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is another embodiment of the present disclosure. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present disclosure, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present disclosure.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 15.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3A:
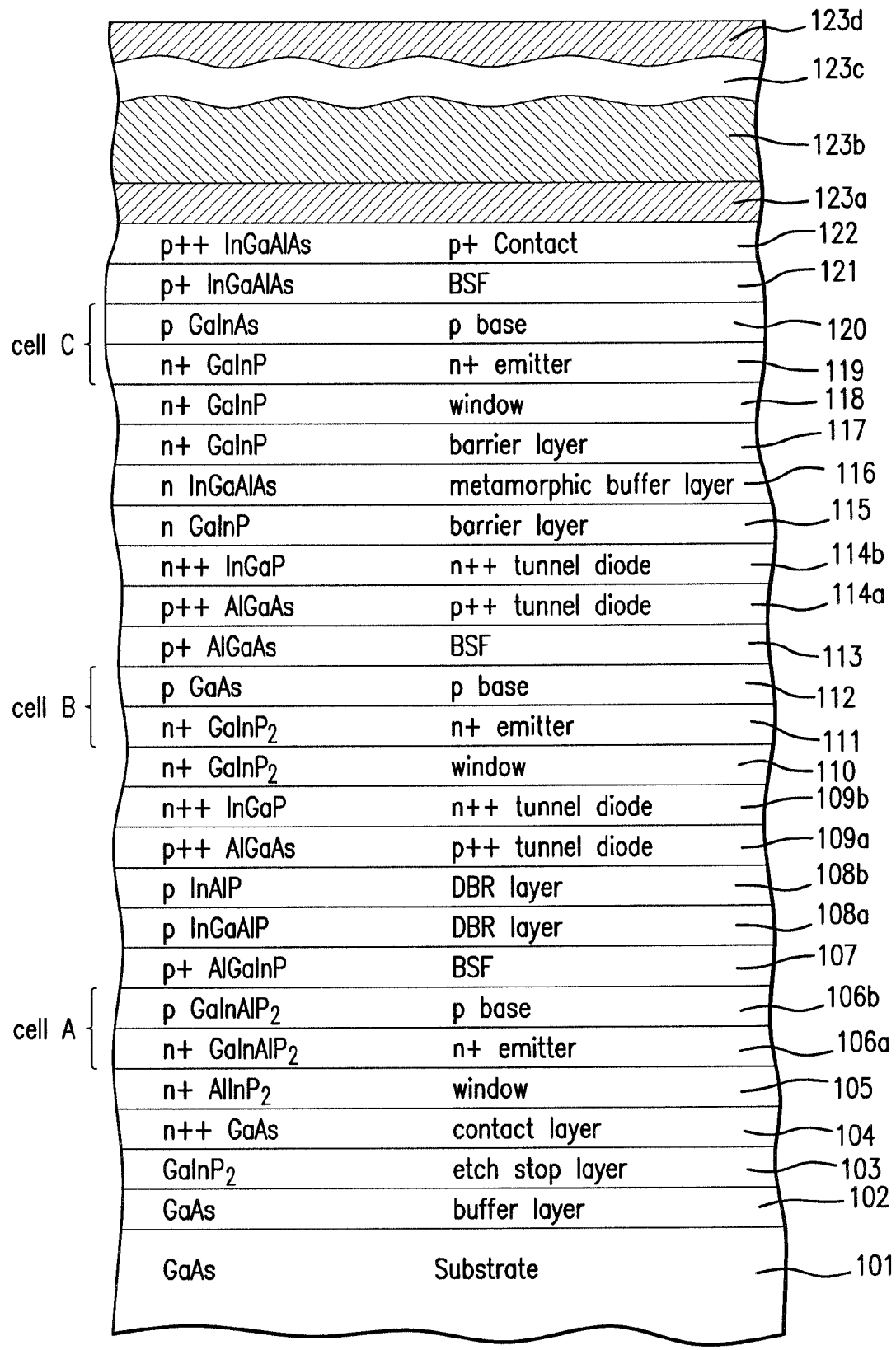
FIG. 3A is a cross-sectional view of the solar cell of FIG. 2 after the next process step.

FIG. 3A is a cross-sectional view of the solar cell of FIG. 2 after the next process step in which a sequence of metal contact layers 123a, 123b, 123c, and 123d are deposited over the p+ semiconductor contact layer 122. During subsequent processing steps, the semiconductor body and its associated metal layers and bonded structures will go through various heating and cooling processes, which may put stress on the surface of the semiconductor body. Accordingly, it is desirable to closely match the coefficient of thermal expansion of the associated layers or structures to that of the semiconductor body, while still maintaining appropriate electrical conductivity and structural properties of the layers or structures. Thus, in some embodiments, the sequence of metal contact layers 123a-123d is selected to have a coefficient of thermal expansion (CTE) substantially similar to that of the adjacent semiconductor material. In relative terms, the CTE may be within a range of 0 to 10 ppm per degree Kelvin different from that of the adjacent semiconductor material. In the case of the specific semiconductor materials described above, in absolute terms, a suitable coefficient of thermal expansion of layer 123 would be equal to around 5 to 7 ppm per degree Kelvin. A variety of metallic compositions and multilayer structures including the element molybdenum would satisfy such criteria. In some embodiments, in order to achieve lower sheet resistivity and better mechanical properties (softness or malleability), the layer 123 would preferably include a laminate of alternating layers of Ag and Mo. In some embodiments, the Ag layer may preferably have a thickness from 100 to 400 nm, and the Mo layer preferably have a thickness from 500 to 1500 nm, with a thin (7.5 to 15 nm) buffer layer between the Ag and Mo. The buffer layer may be titanium. In some embodiments, the outer layers of the laminate may further include the sequence of metal layers Ti/Au or Ti/Au/Ti, although other suitable sequences and material compositions may be used as well. The layers of titanium may typically be from 7.5 to 15 nm in thickness.

More generally, in other embodiments, the metal electrode layer may be selected to have a coefficient of thermal expansion that has a value less than 15 ppm per degree Kelvin, and suitable malleability or softness.

In some embodiments, the metal electrode layer may have a coefficient of thermal expansion that has a value within 50% of the coefficient of thermal expansion of the adjacent semiconductor material.

In some embodiments, the metal electrode layer may have a coefficient of thermal expansion that has a value within 10% of the coefficient of thermal expansion of the adjacent semiconductor material.

In some embodiments, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 3B:
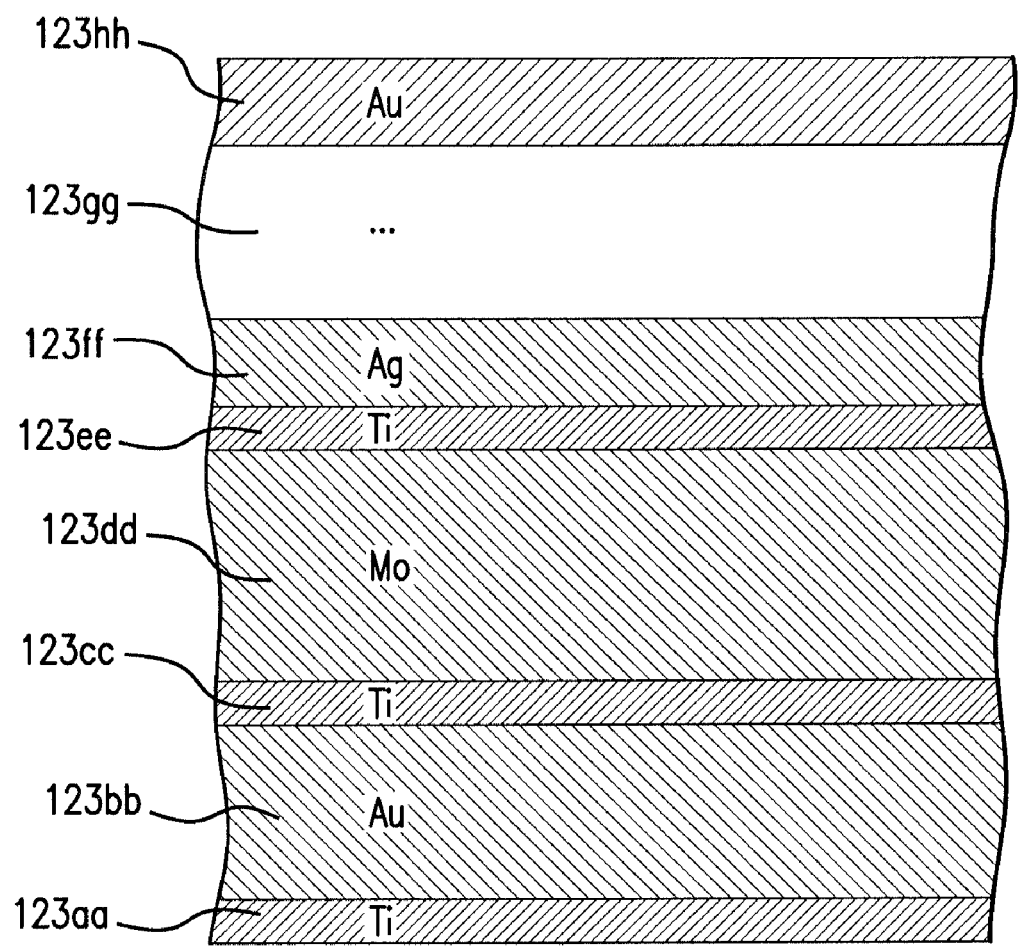
FIG. 3B is an enlarged cross-sectional view of another embodiment of the metal electrode or contact layer in the solar cell of FIG. 3A.

FIG. 3B is an enlarged cross-sectional view of another embodiment of the metal contact layer in the solar cell of FIG. 3A depicting a sequence of layers including a titanium layer 123aa (preferably about 10 nm in thickness), a gold layer 123bb (preferably about 500 nm in thickness), a titanium layer 123 cc (preferably about 10 nm in thickness), a molybdenum layer 123dd (preferably about 1500 nm in thickness), a titanium layer 123ee (preferably about 10 nm in thickness), and a silver layer 123ff (preferably about 150 nm in thickness). After layer 123ff, the sequence of layers Ti/Mo/Ti/Ag (layers 123cc, 123dd, 123ee, 123ff) may be repeated one or more times, represented by the unlabelled layer or region 123gg. On top of layer 123gg is a gold contact layer 123hh (preferably about 20 nm in thickness).

Figure 3C:
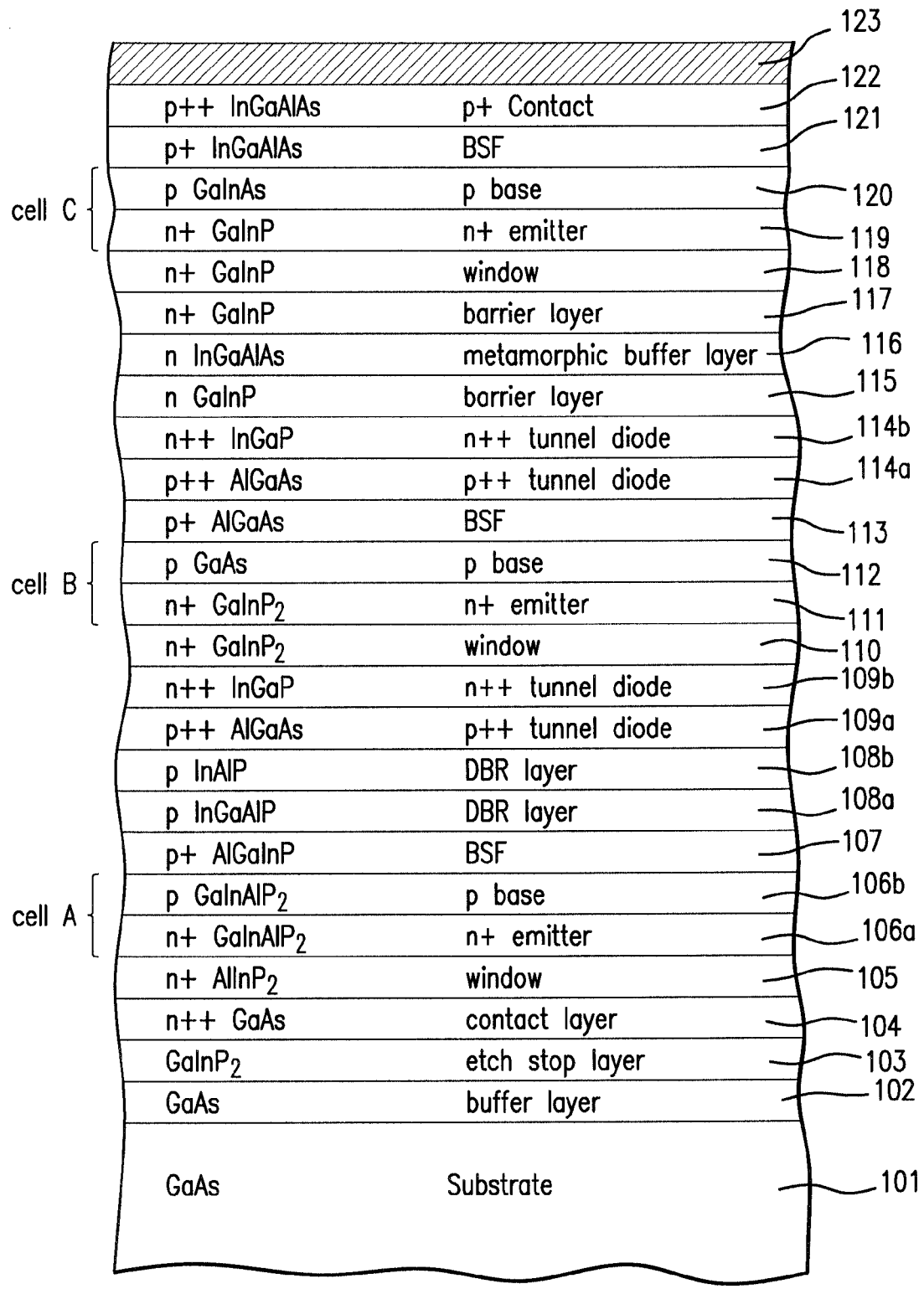
FIG. 3C is a simplified cross-sectional view of the solar cell of FIG. 3A.

FIG. 3C is a simplified cross-sectional view of the solar cell of FIG. 3A or FIG. 3B in which the laminate layers 123a, 123b, etc. are depicted and represented by a single layer 123. Subsequent figures in this application will utilize the simplified layer 123 to represent the multi-layer or laminate structure of the present invention.

Figure 4A:
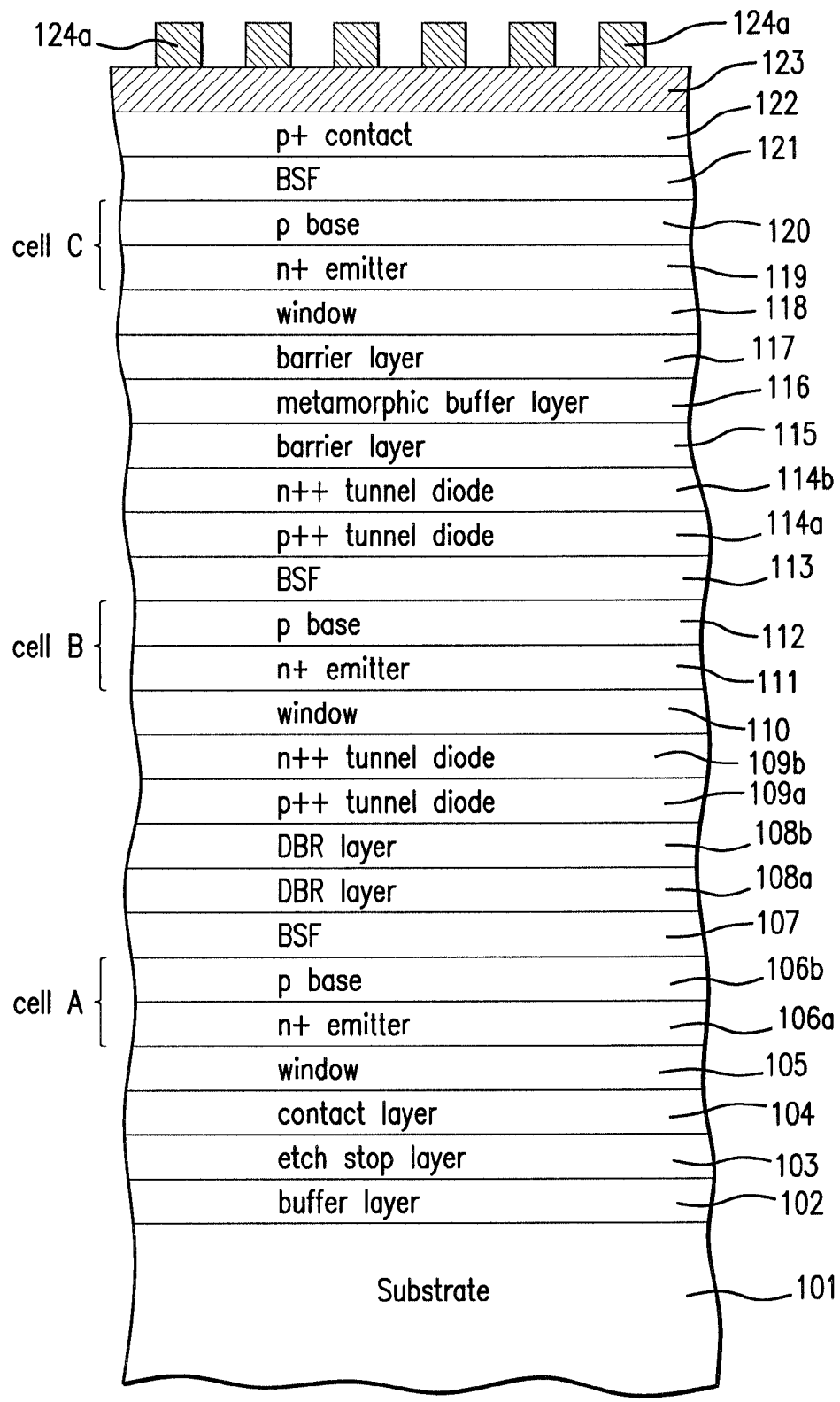
FIG. 4A is a cross-sectional view of the solar cell of FIG. 3C after the next process step in one embodiment.

FIG. 4A is a cross-sectional view of the solar cell of FIG. 3C after the next process step in which a group of discrete, spaced-apart first bonding elements are deposited over the metal layer 123. In one embodiment, the bonding elements are composed of a solder and a wetting layer. In some embodiments, the bonding elements are approximately 50 microns in length.

In some embodiments, the bonding elements are spaced apart by approximately 20 microns.

In some embodiments, the bonding elements are approximately 2 to 4 microns in thickness.

Figure 4B:
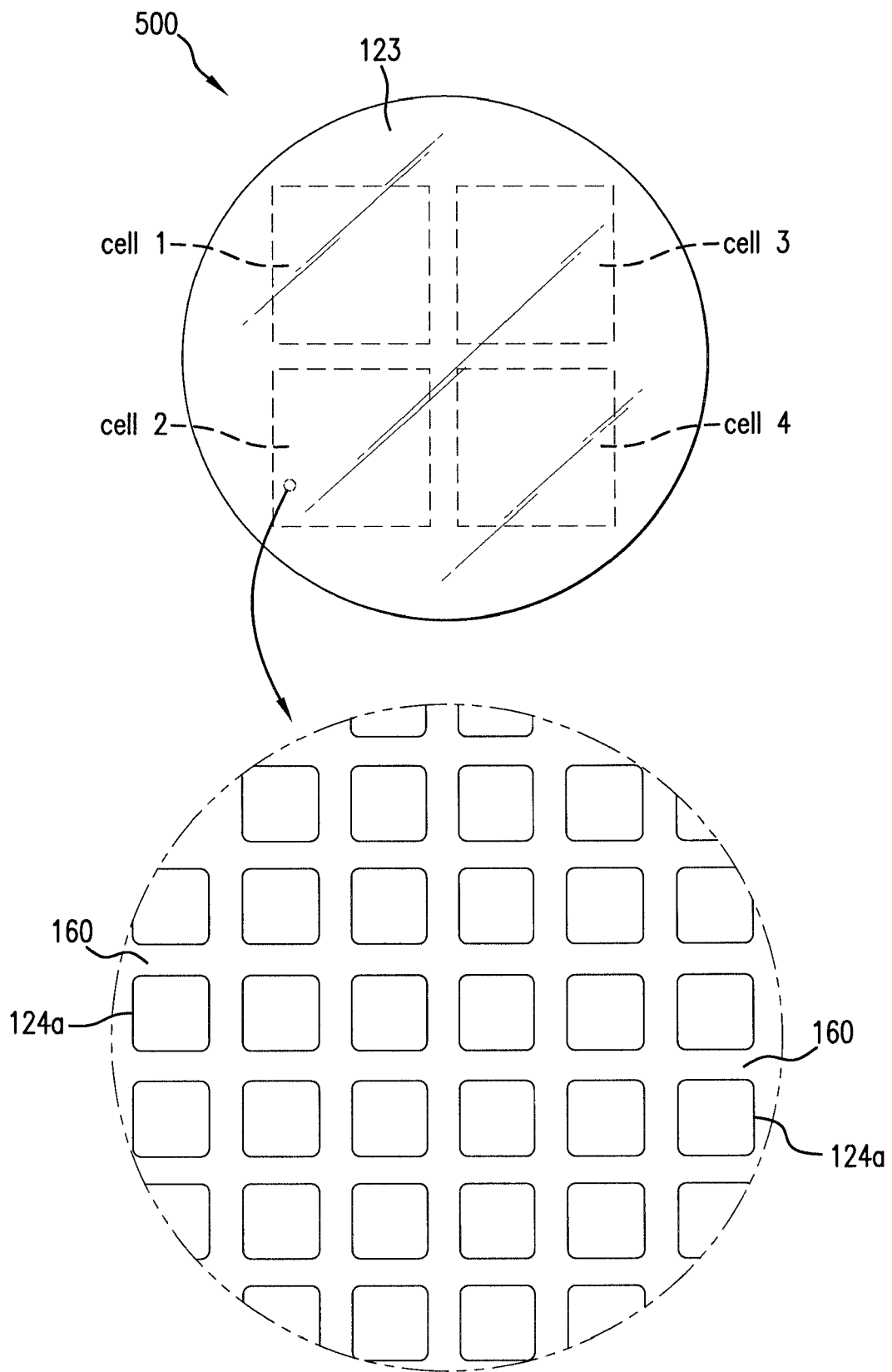
FIG. 4B is a top plan view of a wafer in which four solar cells are fabricated after the process step depicted in FIG. 4A.

FIG. 4B is a bottom plan view of the wafer in which the four solar cells are fabricated, and the enlarged portion of one of the solar cells depicts the bonding elements 124a.

In some embodiments, as depicted in FIG. 4B, the bonding elements 124a are equal in size, and are linearly aligned in parallel rows and uniformly distributed over the back metal contact. In some embodiments, as depicted in FIG. 4B, the bonding elements 124a are substantially square in shape.

In some embodiments, the bonding elements 124a include a AuSn, SnAgCu, or PbSn solder.

Figure 4C:
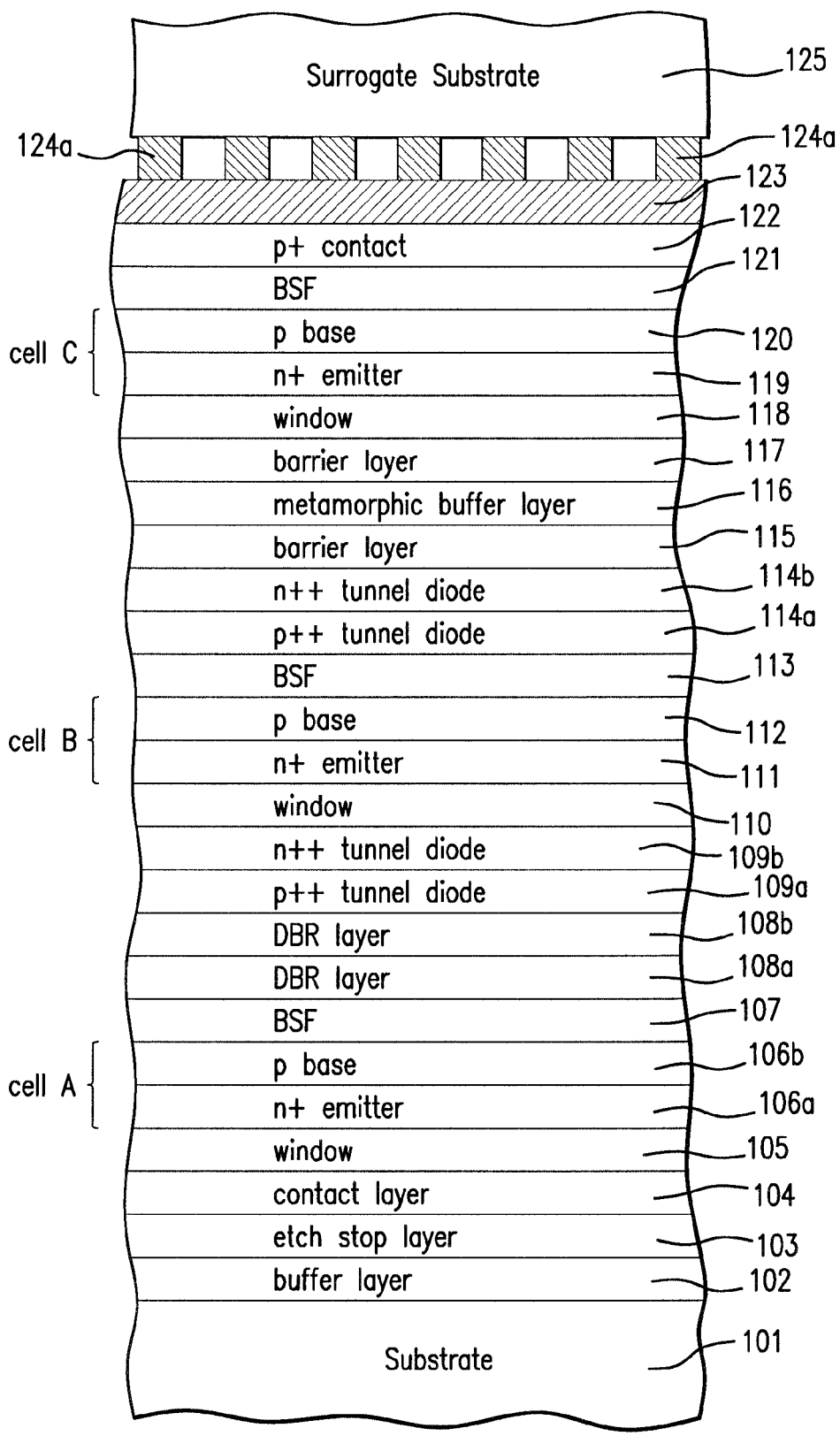
FIG. 4C is a cross-sectional view of the solar cell of FIG. 4A after the next process step in which a surrogate substrate is attached.

FIG. 4C is a cross-sectional view of the solar cell of FIG. 4A after the next process step in which a surrogate substrate 125 is attached utilizing the bonding elements 124a.

The attaching step is performed by soldering, and a non-wetting material 160 may be provided that peripherally surrounds each of the bonding elements for controlling the spread of the liquid solder during the attaching step. In some embodiments, the non-wetting material peripherally surrounding each of the bonding elements is composed of either nickel (Ni) or niobium (Nb).

Figure 4D:
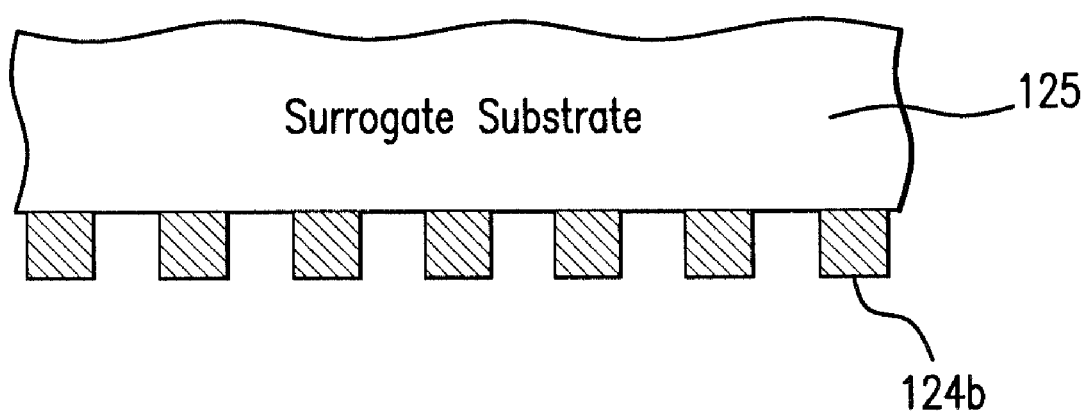
FIG. 4D is a cross-sectional view of the surrogate substrate prior to attachment to the solar cell in another embodiment.

FIG. 4D is a cross-sectional view of the surrogate substrate 125 prior to attachment to the solar cell in another embodiment, more particularly depicting bonding elements 124b attached to the bottom surface (i.e., the surface to be attached to the solar cell).

Figure 4E:
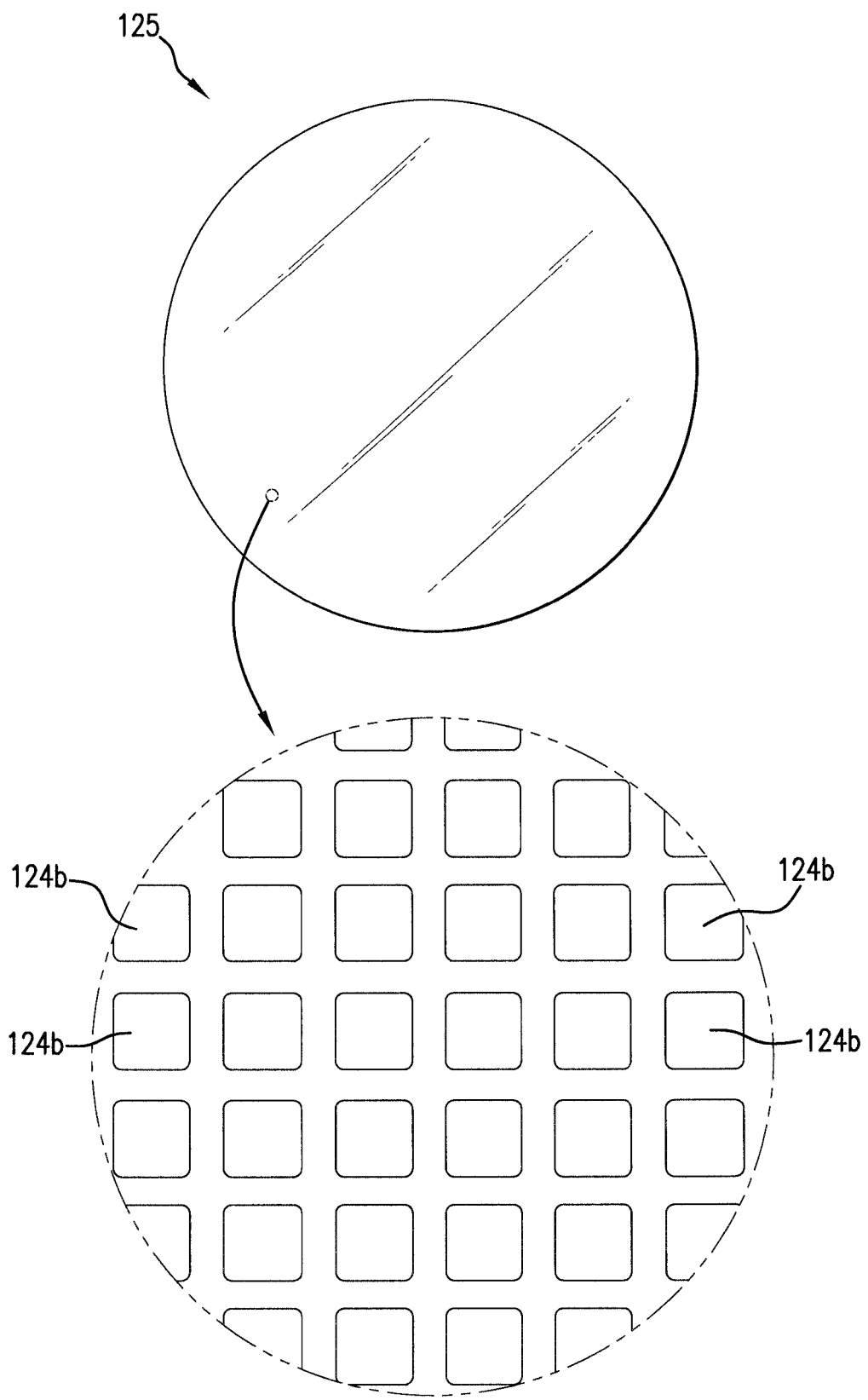
FIG. 4E is a bottom plan view of the surrogate substrate after the process step depicted in FIG. 4D.

FIG. 4E is a bottom plan view of the surrogate substrate after the bonding elements 124b depicted in FIG. 4D are attached. As depicted, the bonding elements 124b are discrete and spaced-apart as they are deposited over the surrogate substrate 125. In some embodiments, as depicted in FIG. 4E, the bonding elements 124b are equal in size, and are linearly aligned in parallel rows and uniformly distributed over the surrogate substrate. In some embodiments, as depicted in FIG. 4E, the bonding elements 124b are substantially square in shape.

In some embodiments, the bonding elements 124b are composed of a solder and a wetting layer. In some embodiments, the bonding elements 142b are approximately 50 microns in length.

In some embodiments, the bonding elements 124b are spaced apart by approximately 20 microns.

In some embodiments, the bonding elements 124b are approximately 2 to 4 microns in thickness.

Figure 4F:
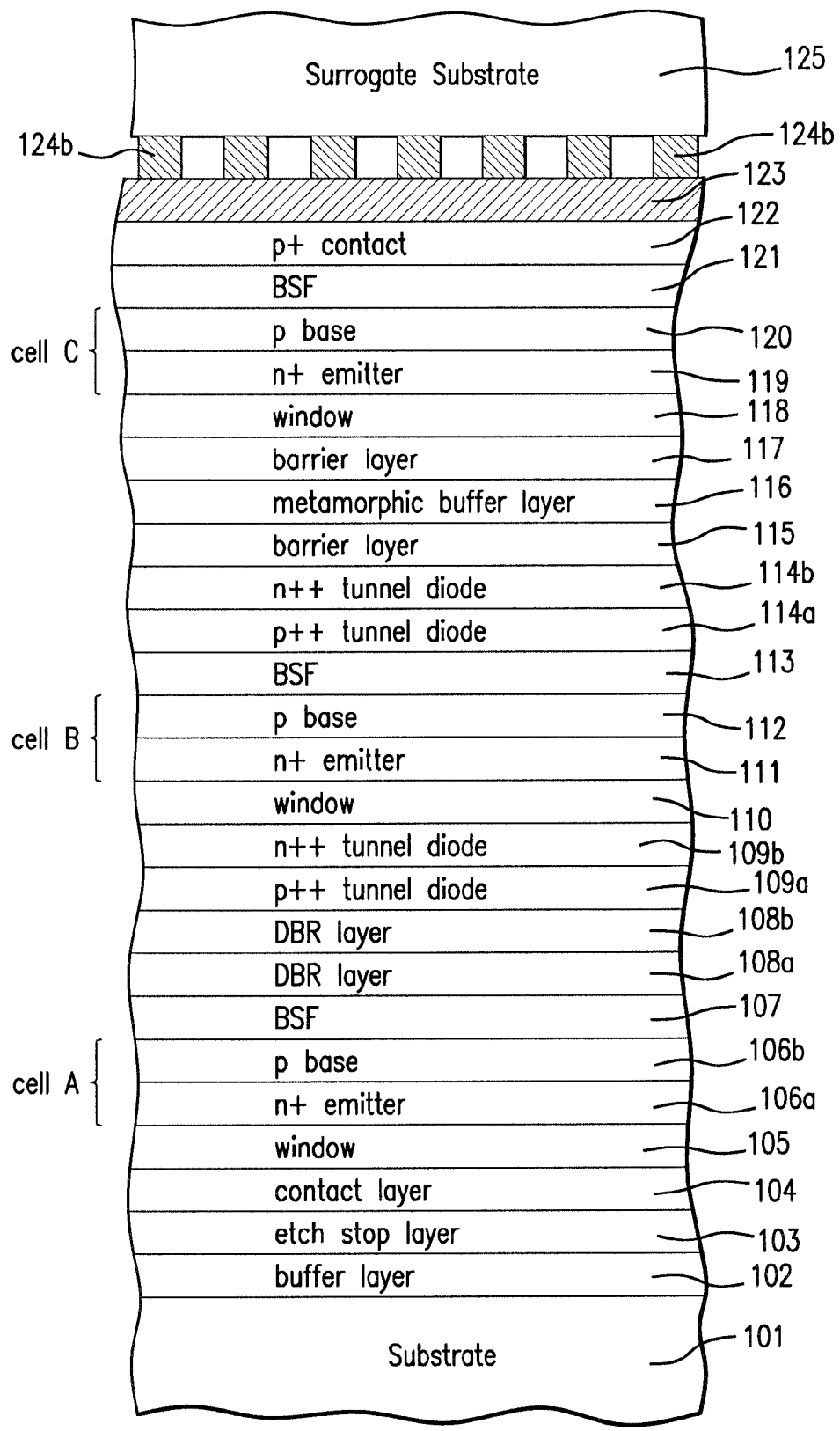
FIG. 4F is a cross-sectional view of the solar cell of FIG. 3C after the next process step in the embodiment in which a surrogate substrate as depicted in FIGS. 4D and 4E is attached to the solar cell.

FIG. 4F is a cross-sectional view of the solar cell of FIG. 3C after the next process step in the embodiment in which a surrogate substrate 125 with bonding elements 124b as depicted in FIGS. 4D and 4E is attached to the back metal contact layer 123 of the solar cell. The attaching step is performed by soldering, and a non-wetting material 160 may be provided that peripherally surrounds each of the bonding elements 124b (similar to that surrounding the bonding elements 124a depicted in FIG. 4B) for controlling the spread of the liquid solder during the attaching step. In some embodiments, the non-wetting material peripherally surrounding each of the bonding elements 124b is composed of Ni or Nb.

Figure 4G:
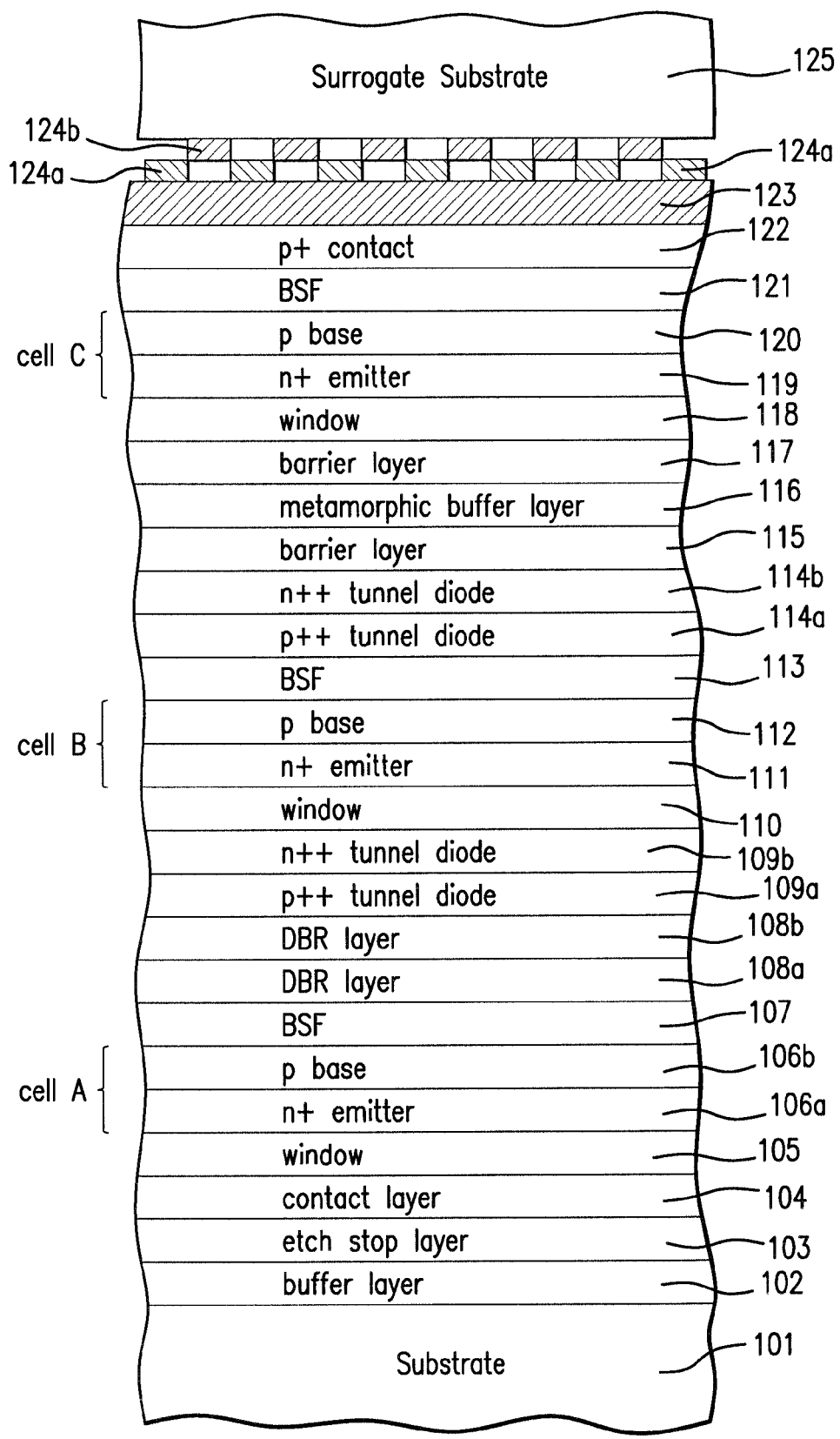
FIG. 4G is a cross-sectional view of the solar cell of FIG. 4A in another embodiment utilizing the structure depicted in FIG. 4A after the next process step in which a surrogate substrate depicted in FIG. 4D is attached.

FIG. 4G is a cross-sectional view of the solar cell of FIG. 4A in another embodiment utilizing the structure depicted in FIG. 4A after the next process step in which a surrogate substrate depicted in FIG. 4D is attached. Bonding elements 124a associated with the back metal layer and bonding elements 124b associated with the surrogate substrate 125 are both used to form the bonding structure.

Figure 4H:
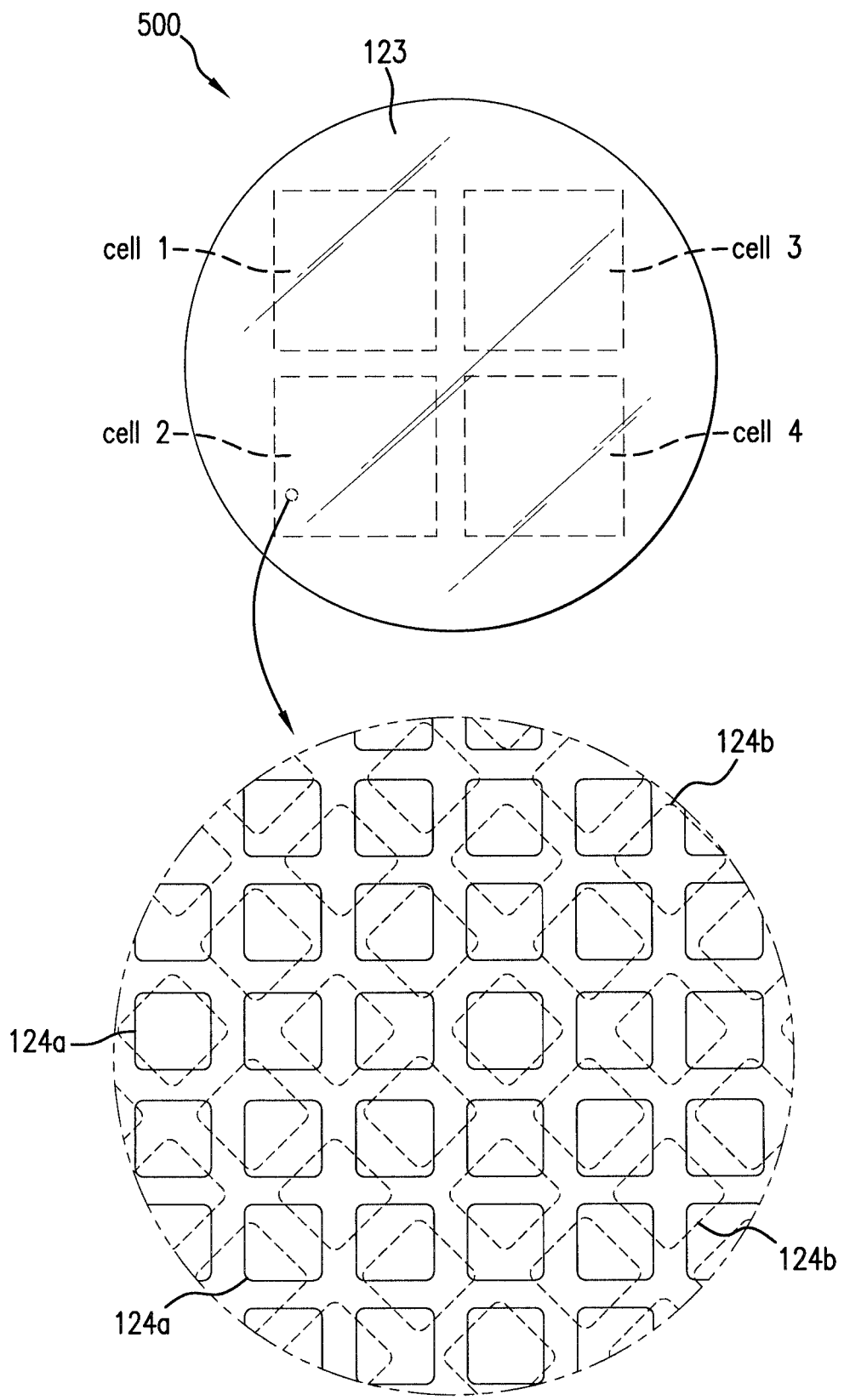
FIG. 4H is a plan view of a wafer in the plane between the solar cell and the surrogate substrate after the process step depicted in FIG. 4G, depicting the bonding elements of FIG. 4B in solid line, and the bonding elements of FIG. 4E in dashed line.

FIG. 4H is a plan view of a wafer in the plane between the solar cell and the surrogate substrate after the process step depicted in FIG. 4G, depicting the first bonding elements of FIG. 4B in solid line, and the second bonding elements of FIG. 4E in dashed line. More particularly, the second bonding elements 124b over the surface of the surrogate substrate 125 are linearly aligned in parallel rows and are uniformly distributed over the surrogate substrate 125, and after being attached to the first bonding elements 124a of the back metal contact, the parallel rows of the second bonding elements 124b are aligned in a direction that is offset by approximately 45 degrees with respect to the linear alignment of the parallel rows of the first bonding elements 124a of the back metal contact.

Figure 5A:
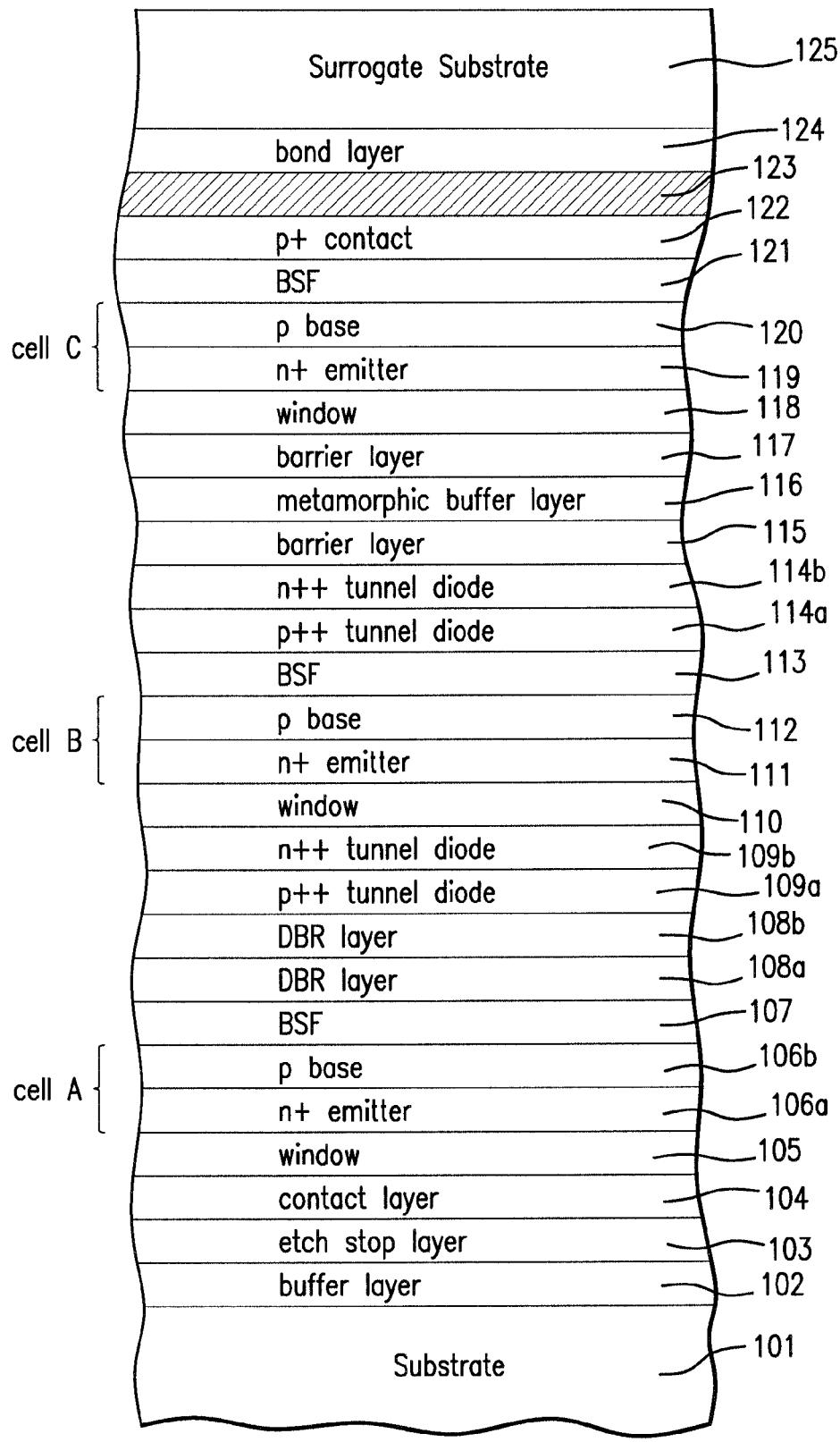
FIG. 5A is a highly simplified cross-sectional view of the solar cell of the embodiment of either FIG. 4A, 4F or 4G depicting the attached surrogate substrate.

FIG. 5A is a highly simplified cross-sectional view of the solar cell of the embodiment of either FIG. 4A, 4F or 4G depicting the solar cell and the attached surrogate substrate. In some embodiments, the surrogate substrate 125 is preferably sapphire.

Alternatively, the surrogate substrate may be GaAs, Ge or Si, or other suitable material. The surrogate substrate may be about 40 mils in thickness, and in the case of embodiments in which the surrogate substrate is to be removed, it may be perforated with holes about 1 mm in diameter, spaced 4 mm apart, to aid in subsequent removal of the adhesive and the substrate.

Figure 5B:
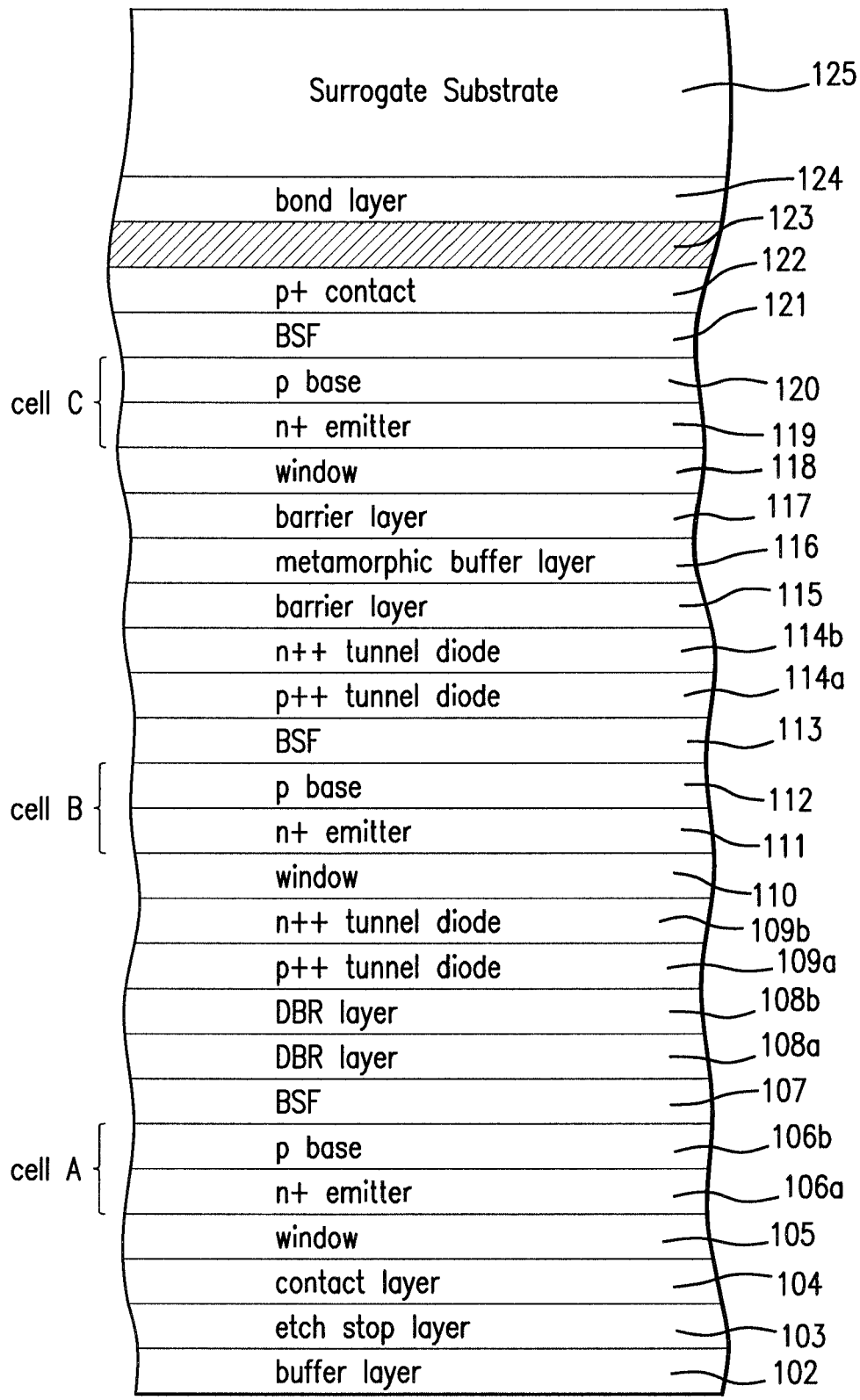
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed. In some embodiments, the substrate 101 may be removed by a sequence of lapping, grinding and/or etching steps in which the substrate 101, and the buffer layer 103 are removed. In some embodiments, the substrate 101 may be removed by grinding followed by etching. The choice of a particular etchant is growth substrate dependent. In other embodiments, the substrate may be removed by a lift-off process such as described in U.S. patent application Ser. No. 12/367,991, filed Feb. 9, 2009, hereby incorporated by reference.

Figure 5C:
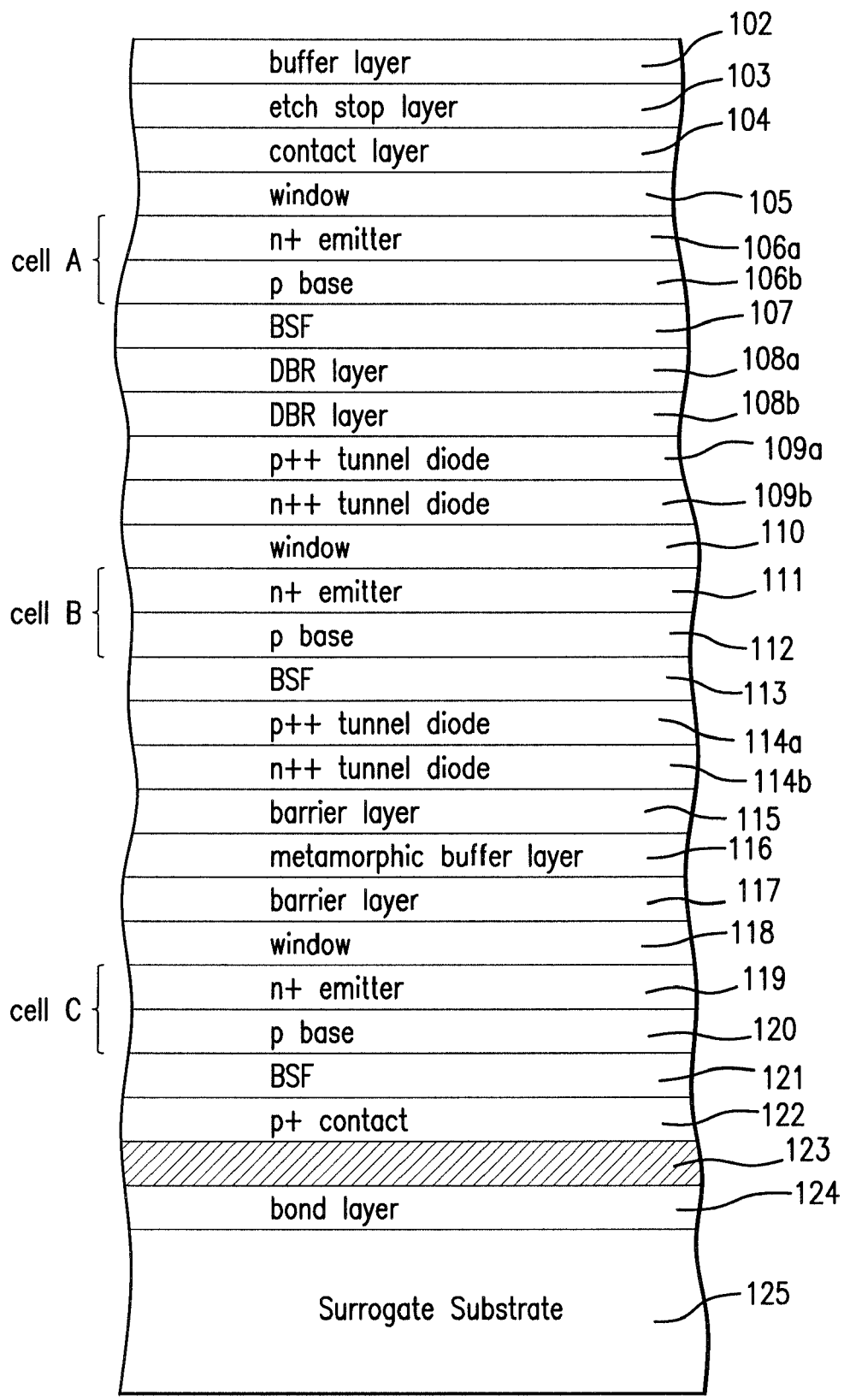
FIG. 5C is another cross-sectional view of the solar cell of FIG. 5B with the surrogate substrate depicted on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
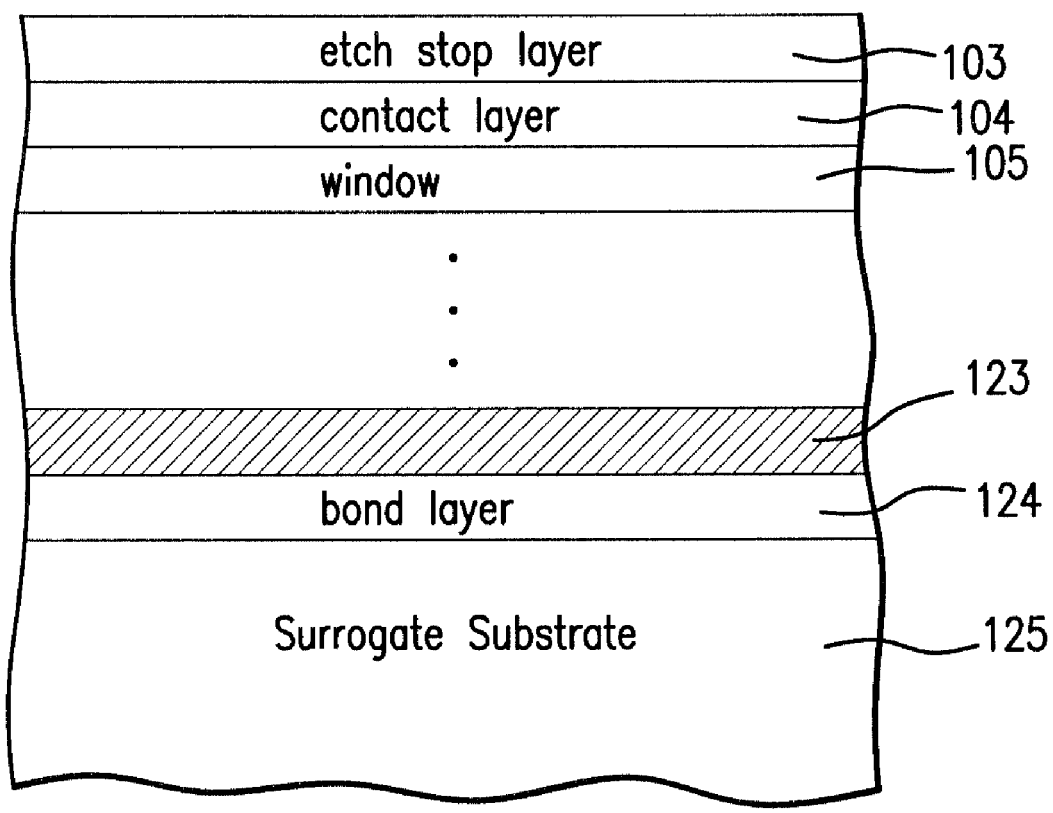
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
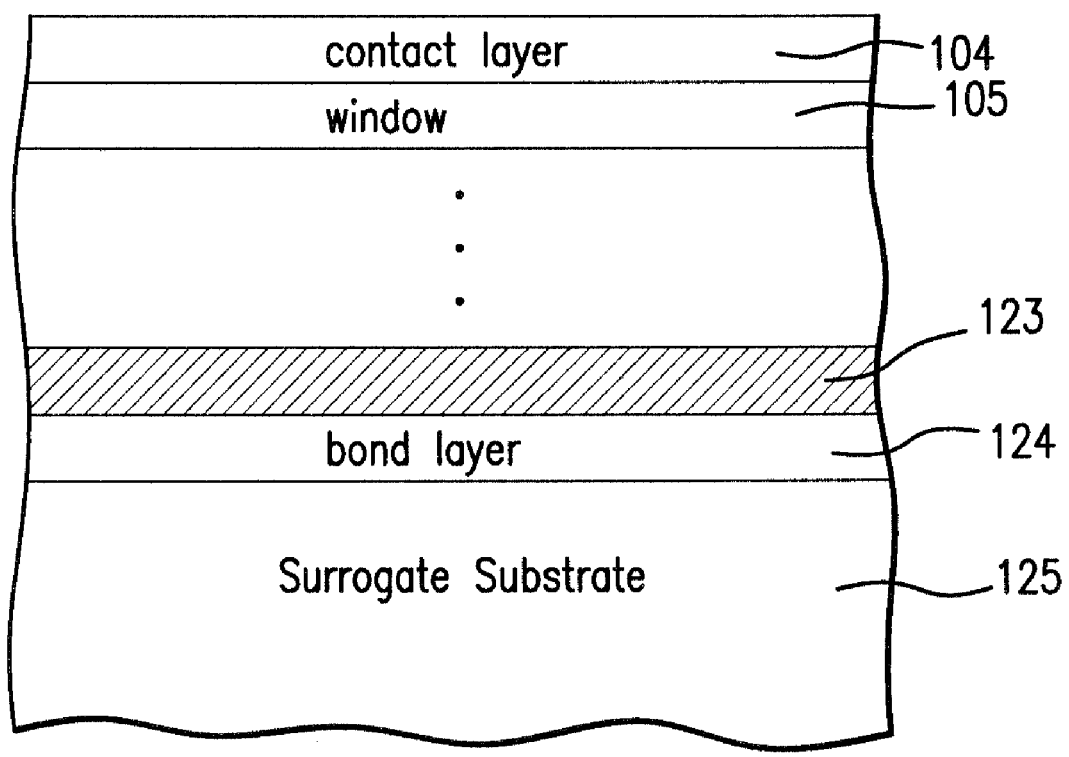
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/$H_2O$ solution.

Figure 8A:
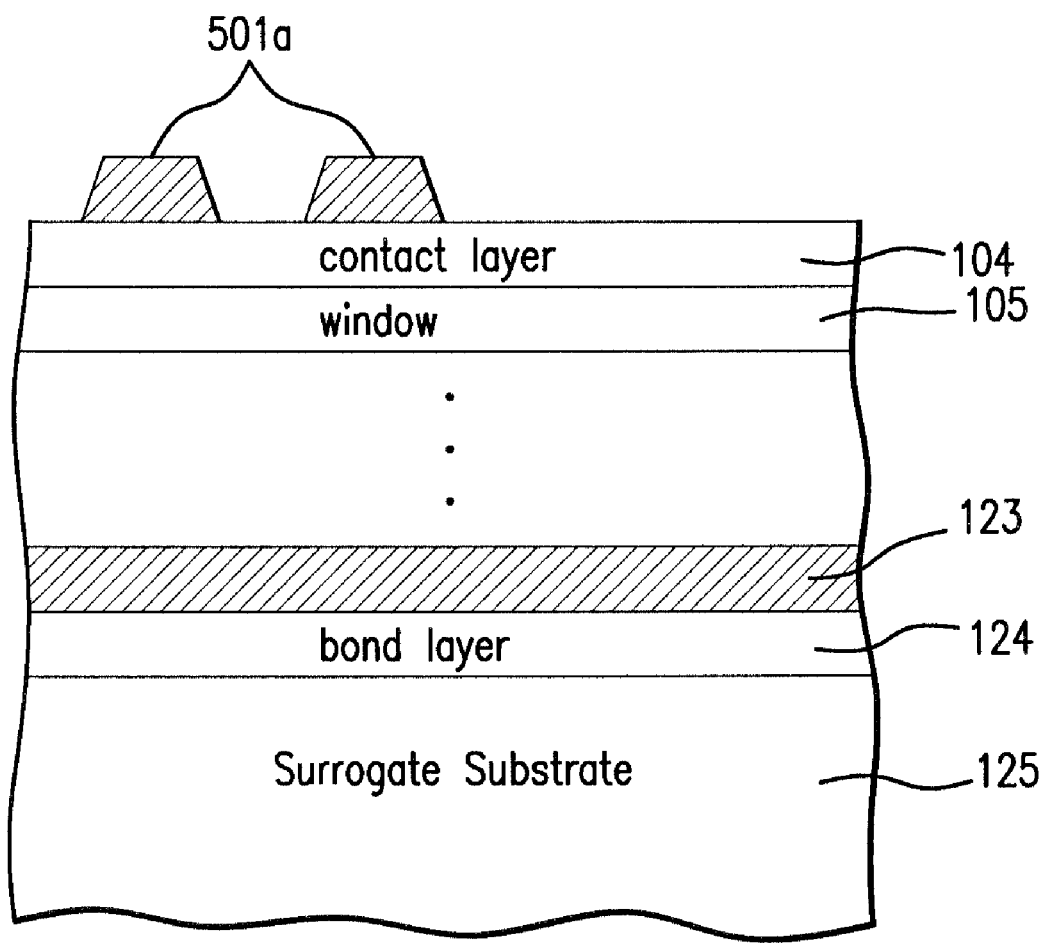
FIG. 8A is a cross-sectional view of the solar cell of FIG. 7 after the next process step in one embodiment of the invention.

FIG. 8A is a cross-sectional view of the solar cell of FIG. 7 after the next sequence of process steps in an embodiment in which a photoresist mask (not shown) is placed over the contact layer 104 to form the grid lines 501a. As will be described in greater detail below, the grid lines 501a are deposited via evaporation and lithographically patterned and deposited over the contact layer 104. The mask is subsequently lifted off to form the finished metal grid lines 501a as depicted in the Figures.

As more fully described in U.S. patent application Ser. No. 12/218,582 filed Jul. 18, 2008, hereby incorporated by reference, the grid lines 501a are preferably composed of the sequence of layers Pd/Ge/Ti/Pd/Au, although other suitable sequences and materials may be used as well.

Figure 8B:
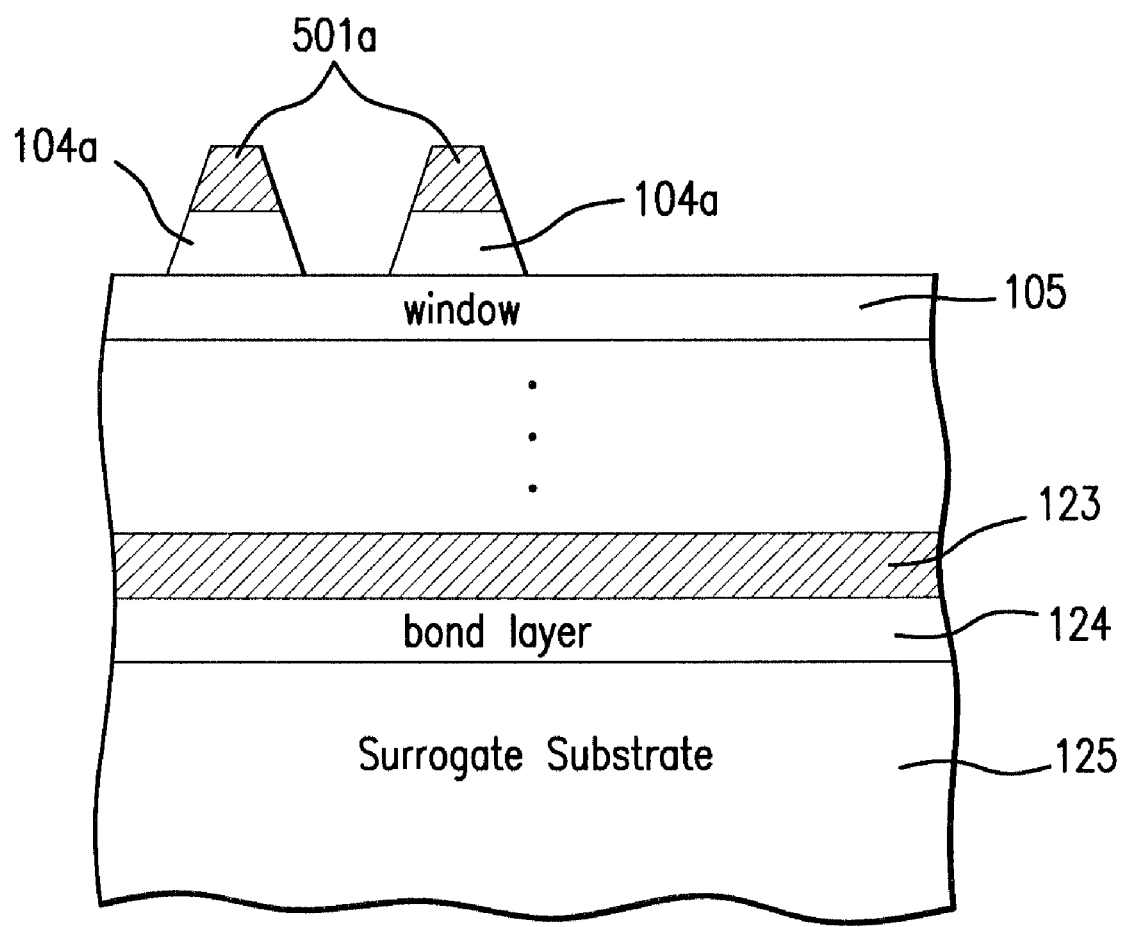
FIG. 8B is a cross-sectional view of the solar cell of FIG. 8A after the next process step.

FIG. 8B is a cross-sectional view of the solar cell of FIG. 8A after the next process step in which the grid lines 501a are used as a mask to etch down the surface to the window layer 105 using a citric acid/peroxide etching mixture. The grid lines 501a overlie respective portions 104a of the contact layer 104 which remain after the rest of the contact layer 104 has been etched away.

The processing technique in the embodiment of FIGS. 8A and 8B may be disadvantageous in certain situations. In view of a difference in Schottky barrier potentials established between the electrolyte (the etchant) and the metal/semiconductor, as well as the finite resistances of the electrolyte and the semiconductor, electrical currents may be established in the vicinity of the grid that may give rise to an electrochemical etch component. Due to the symmetry of the current density, the geometry of the cap etch may be non-uniform, especially in the immediate vicinity of the grids. In addition, depending upon the specific electrolyte and grid metal used, a battery effect may be established, which would result in the re-depositing of elements of the grid on the semiconductor material. Either or both of these effects may result in a structure that has obscured regions due to incomplete cap removal and metal redistribution. Accordingly, the present disclosure also provides an alternative embodiment illustrated in FIGS. 9A and 9B that overcomes such potential disadvantages.

Figure 9A:
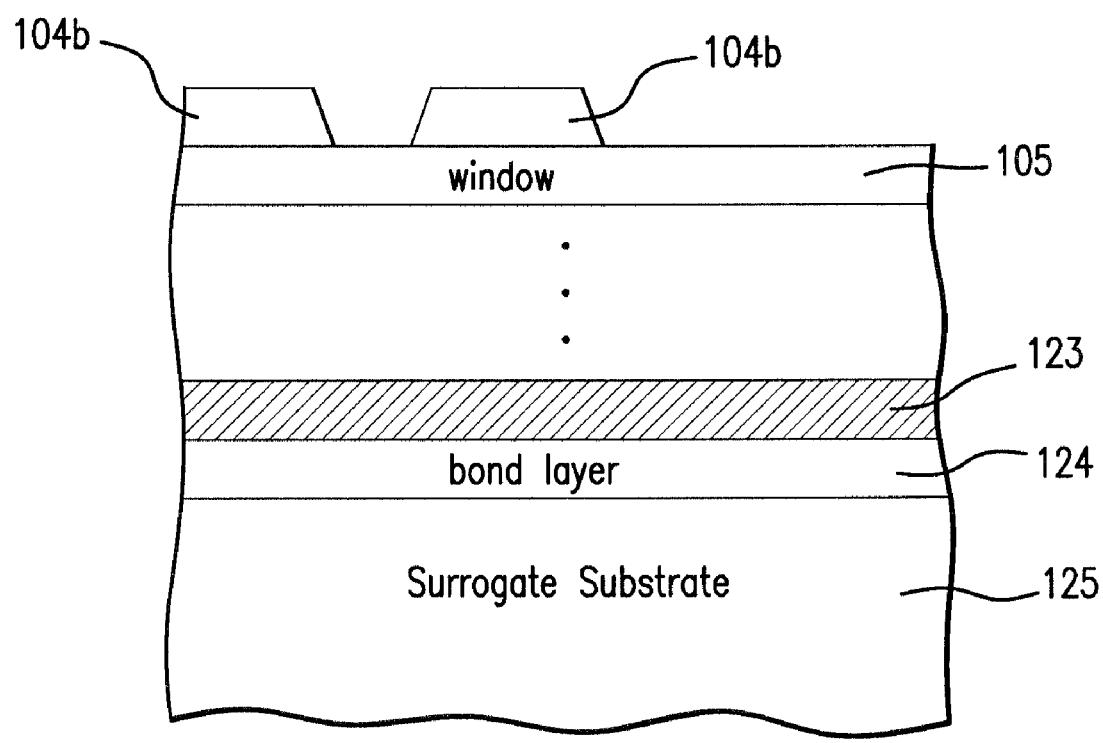
FIG. 9A is a cross-sectional view of the solar cell of FIG. 7 after the next process step in another embodiment of the invention.

FIG. 9A is a cross-sectional view of the solar cell of FIG. 7 after the next process step in another embodiment of the invention in which a photoresist mask (not shown) is placed over the contact layer 104, and the contact layer is then etched according to the pattern of the photoresist mask to form spaced apart contact layer regions or islands 104b.

Figure 9B:
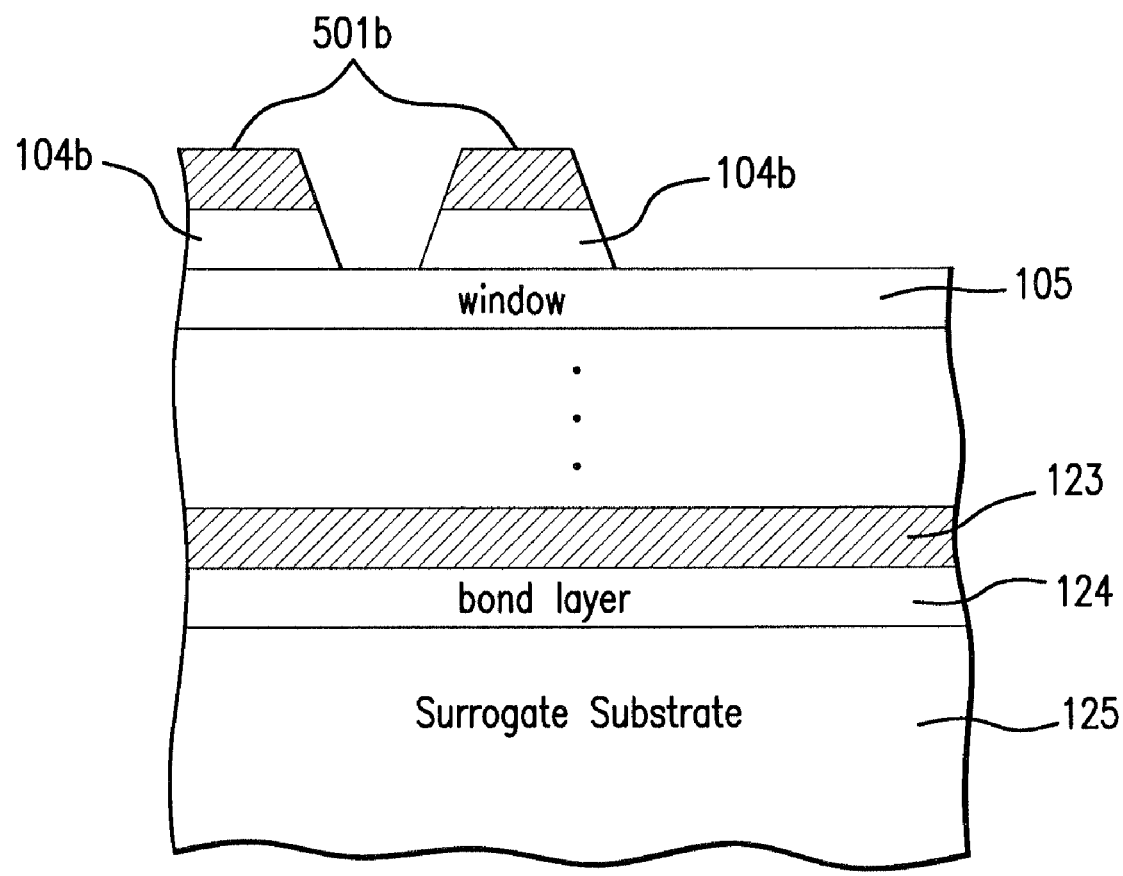
FIG. 9B is a cross-sectional view of the solar cell of FIG. 9A after the next process step.

FIG. 9B is a cross-sectional view of the solar cell of FIG. 9A after the next process step in this embodiment in which photoresist is applied, a photoresist mask (not shown) is placed over the top surface of the semiconductor body, and the photoresist is lithographically patterned to provide openings over the contact layer islands 104b where the grid lines 501b are to be formed. The grid line metal is then deposited via evaporation to form the grid lines 501b each lying over the respective contact layer islands 104b.

Figure 9C:
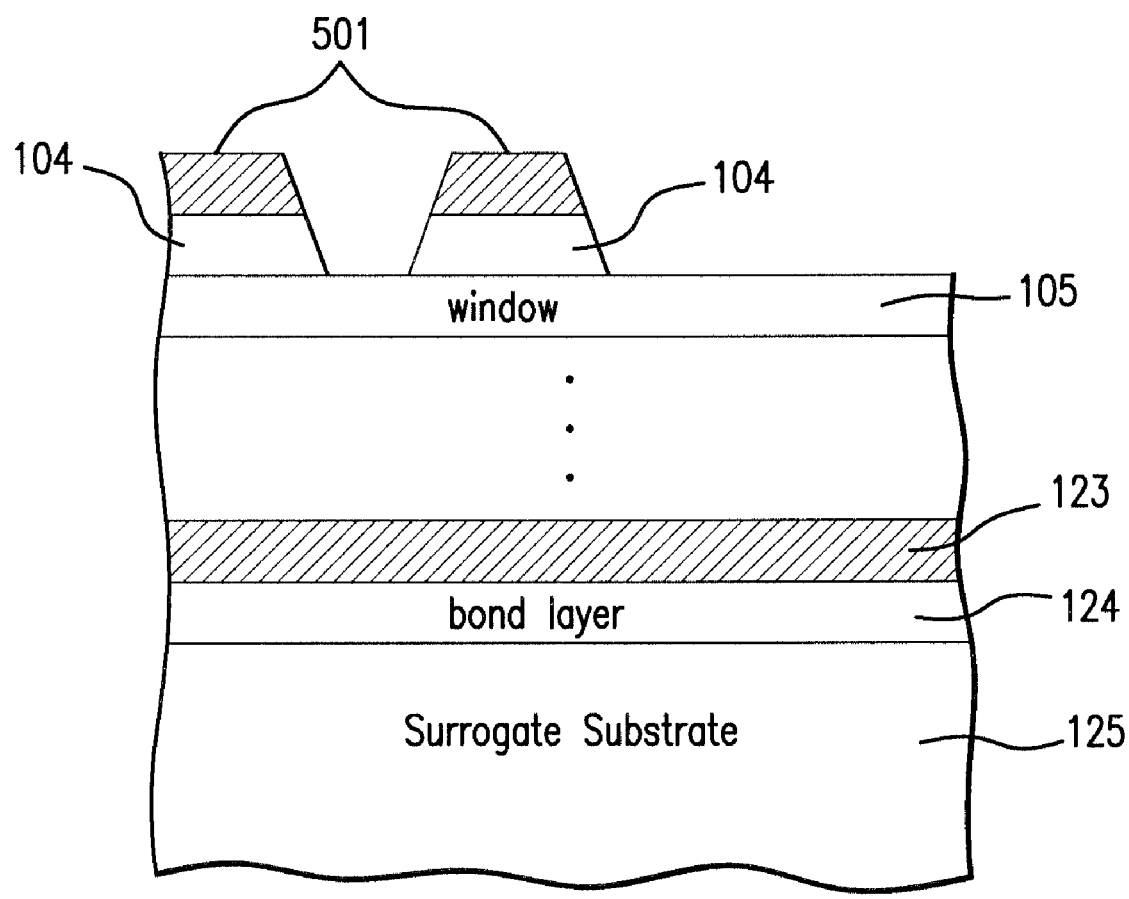
FIG. 9C is a cross-sectional view of the solar cell of FIG. 8B or 9B after the next process step.

FIG. 9C is a cross-sectional view of the solar cell fabricated using the process of either of FIG. 8A/8B or 9A/9B in a more generic manner, depicting grid lines 501 formed over the portions of the contact layer 104. Subsequent figures of this application will use the generic depiction of the grid lines/contact layer shown herein, it being understood that either process of FIG. 8A/8B or 9A/9B may be utilized.

Figure 10A:
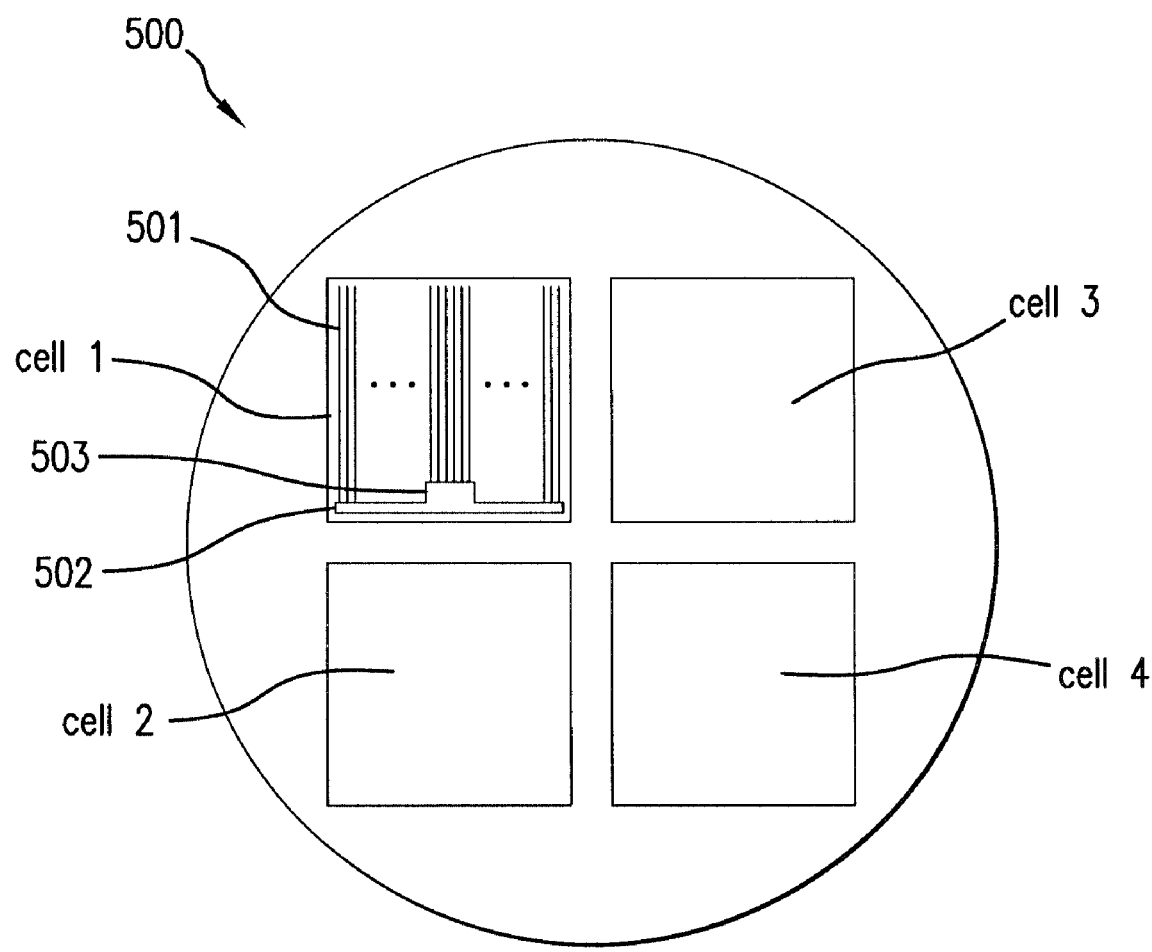
FIG. 10A is a top plan view of a wafer in which four solar cells are fabricated.

FIG. 10A is a top plan view of a 100 mm (or 4 inch) wafer in which four solar cells are implemented. The depiction of four cells is for illustration purposes only, and the present invention is not limited to any specific number of cells per wafer.

In each cell there are grid lines 501 (more particularly shown in cross-section in FIG. 9C), an interconnecting bus line 502, and a contact pad 503. The geometry and number of grid and bus lines and the contact pad are illustrative and the present invention is not limited to the illustrated embodiment.

Figure 10B:
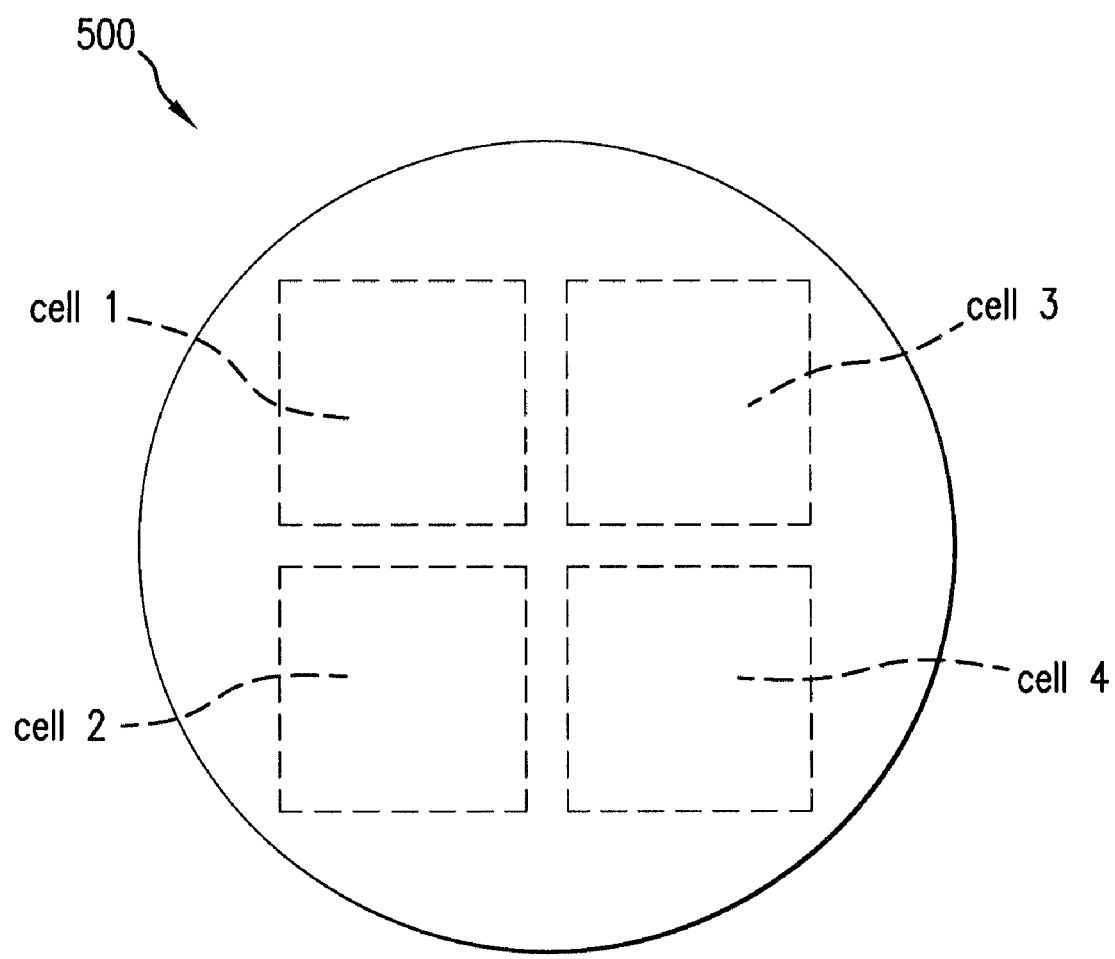
FIG. 10B is a bottom plan view of the wafer in which the four solar cells are fabricated.

FIG. 10B is a bottom plan view of the wafer of FIG. 10A in which the four solar cells are fabricated, with the location of the cells shown in dotted lines.

Figure 10C:
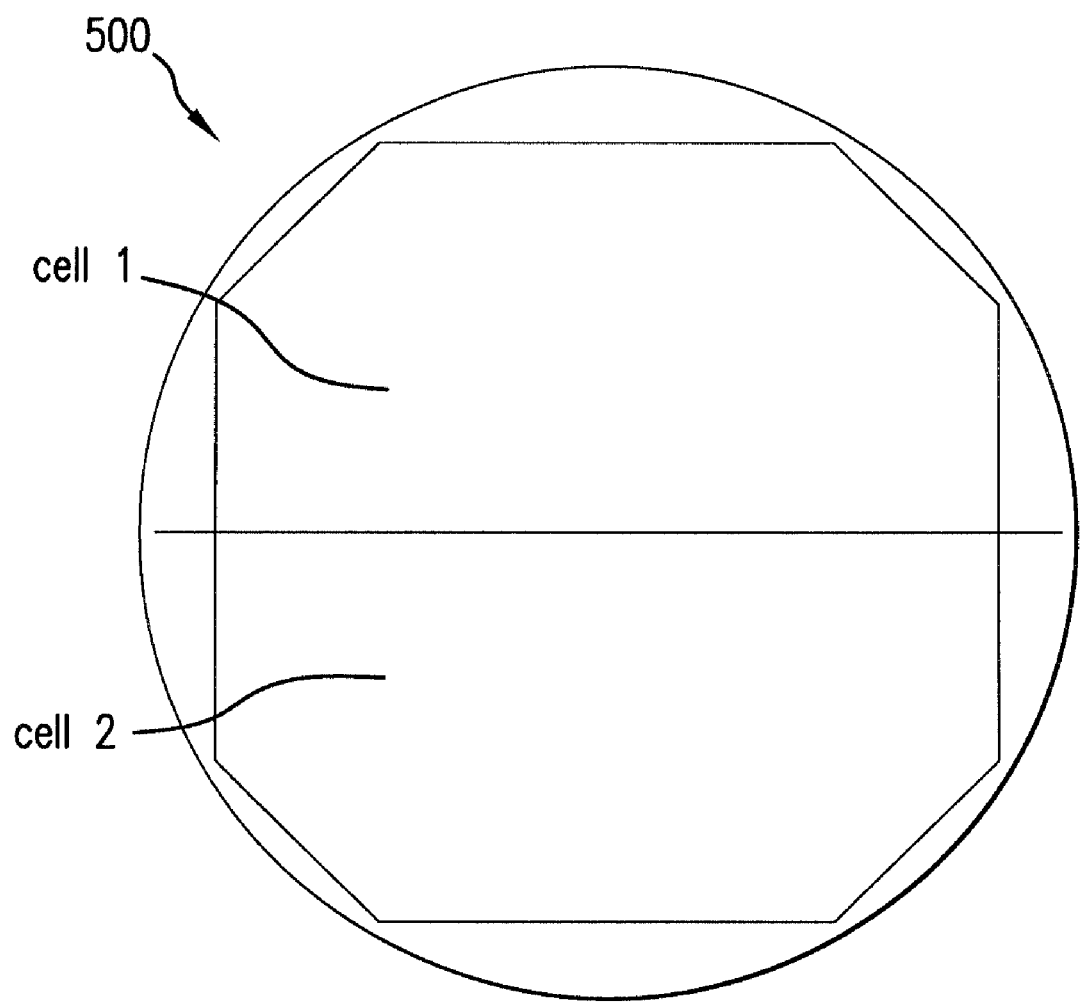
FIG. 10C is a top plan view of a wafer in which two solar cells are fabricated.

FIG. 10C is a top plan view of a 100 mm (or 4 inch) wafer in which two solar cells are implemented. In this depicted example, each solar cell has an area of 26.3 $cm^2$ and a power/weight ratio (after separation from the growth and surrogate substrates) of 945 mW/g.

Figure 11:
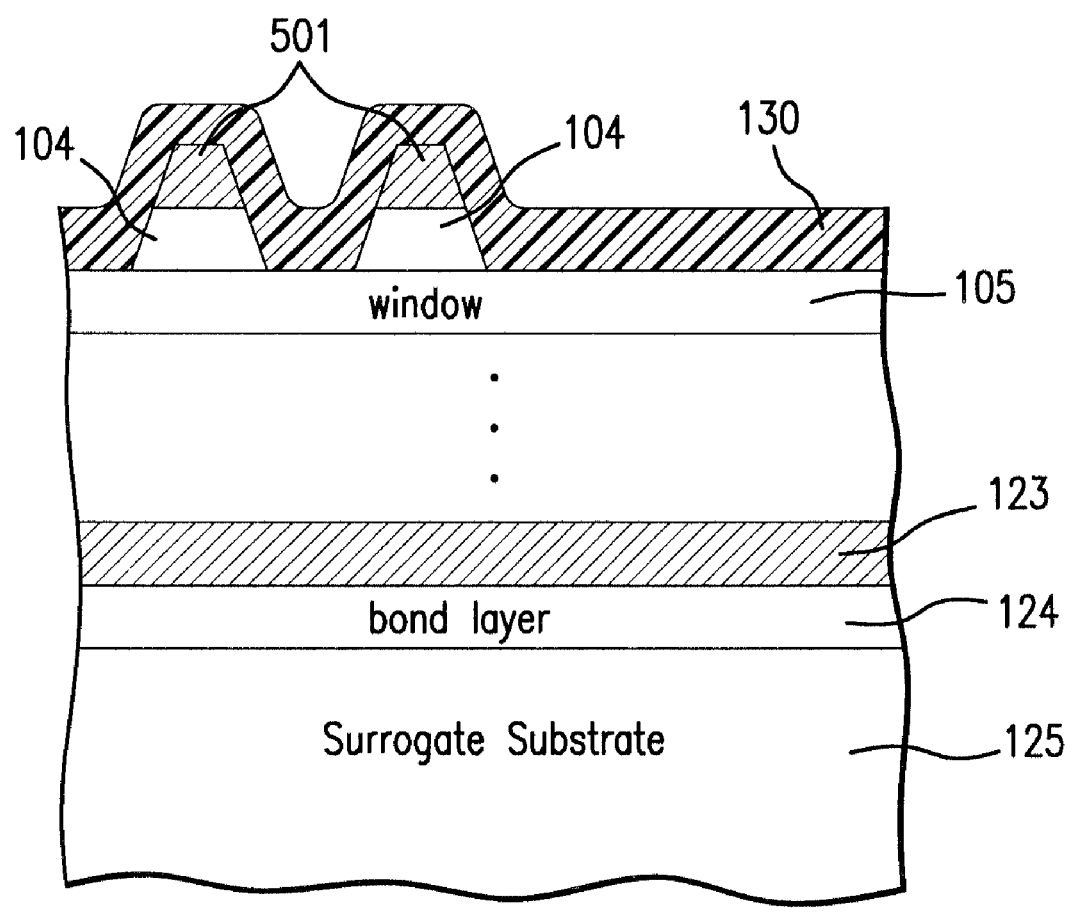
FIG. 11 is a cross-sectional view of the solar cell of either the embodiment of FIG. 8B or FIG. 9C after the next process step.

FIG. 11 is a cross-sectional view of the solar cell of FIG. 9 after the next process step in which an antireflective (ARC) dielectric coating layer 130 is applied over the entire surface of the "top" side of the wafer with the grid lines 501.

Figure 12A:
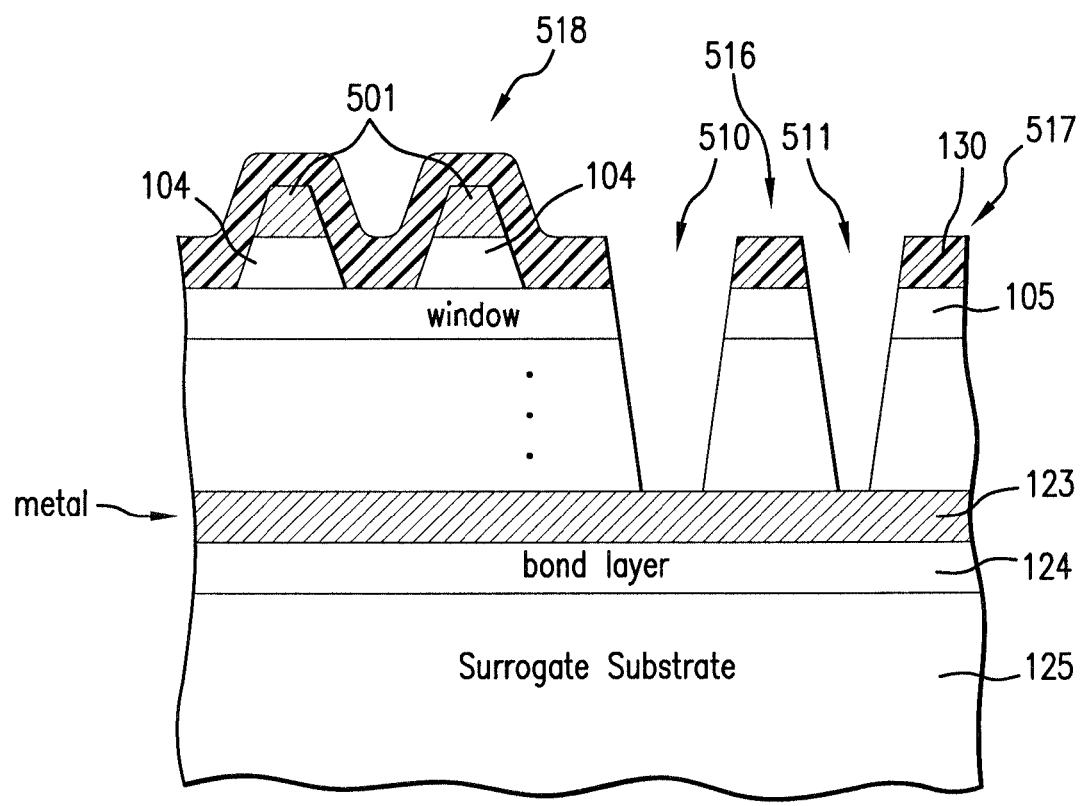
FIG. 12A is a cross-sectional view of the solar cell of FIG. 11 after the next process step.

FIG. 12A is a cross-sectional view of the solar cell of FIG. 11 after the next process step according to some embodiments of the present invention in which first and second annular channels 510 and 511, or portion of the semiconductor structure are etched down to the metal layer 123 using phosphide and arsenide etchants. These channels, as more particularly described in U.S. patent application Ser. No. 12/190,449 filed Aug. 12, 2008, define a peripheral boundary between the cell and the rest of the wafer, and leave a mesa structure which constitutes the solar cell. The cross-section depicted in FIG. 12A is that as seen from the A-A plane shown in FIG. 13. In one of the embodiments, channel 510 is substantially wider than that of channel 511.

Figure 12B:
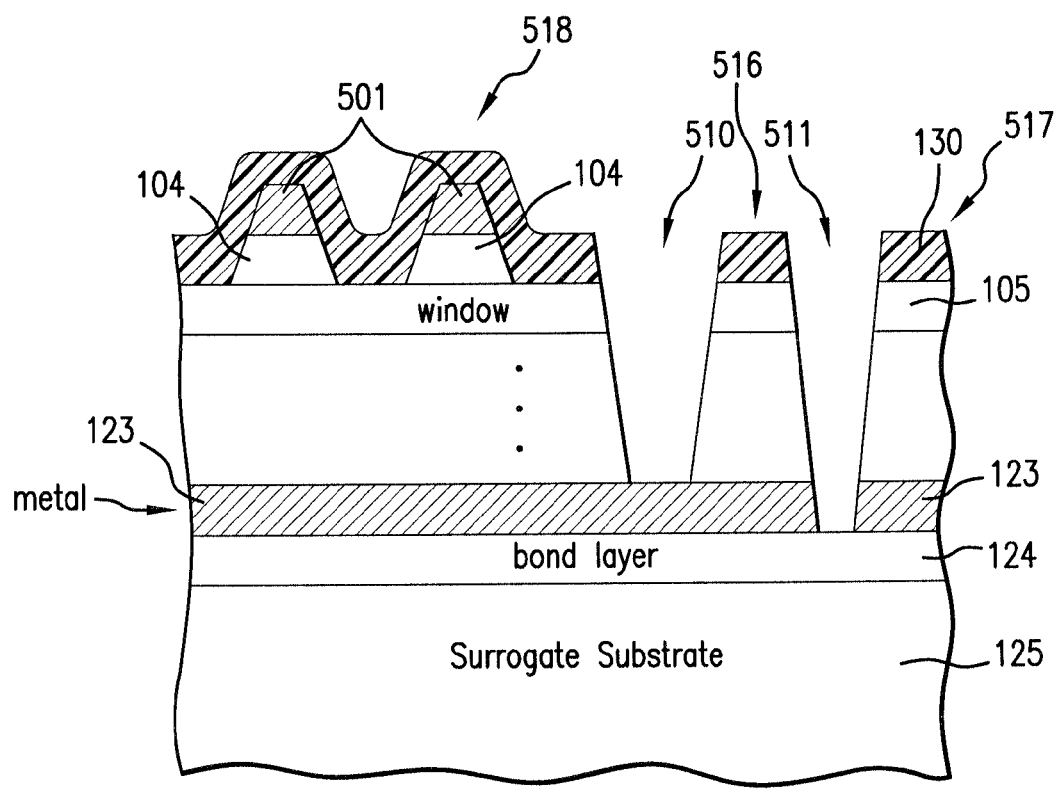
FIG. 12B is a cross-sectional view of the solar cell of FIG. 12A after the next process step.

FIG. 12B is a cross-sectional view of the solar cell of FIG. 12A after the next process step in which channel 511 is exposed to a metal etchant, layer 123 in the channel 511 is removed, and channel 511 is extended in depth approximately to the top surface of the adhesive layer 124.

Figure 13A:
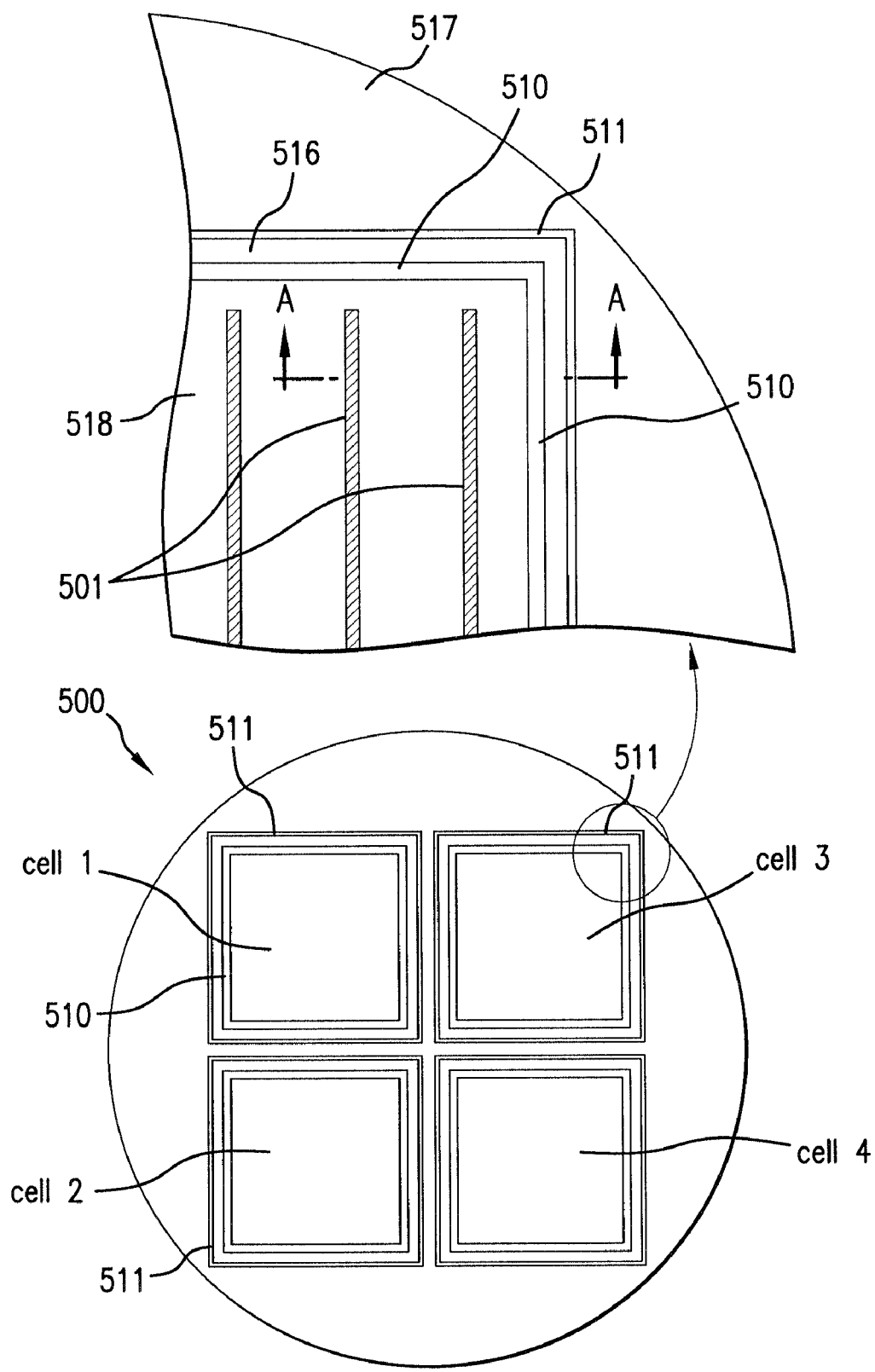
FIG. 13A is a top plan view of the wafer of FIG. 10A depicting the surface view of the trench etched around the cell, after the next process step.

FIG. 13A is a top plan view of the wafer of FIG. 10A, depicting the channels 510 and 511 etched around the periphery of each cell which were shown in cross-section in FIG. 12B.

Figure 13B:
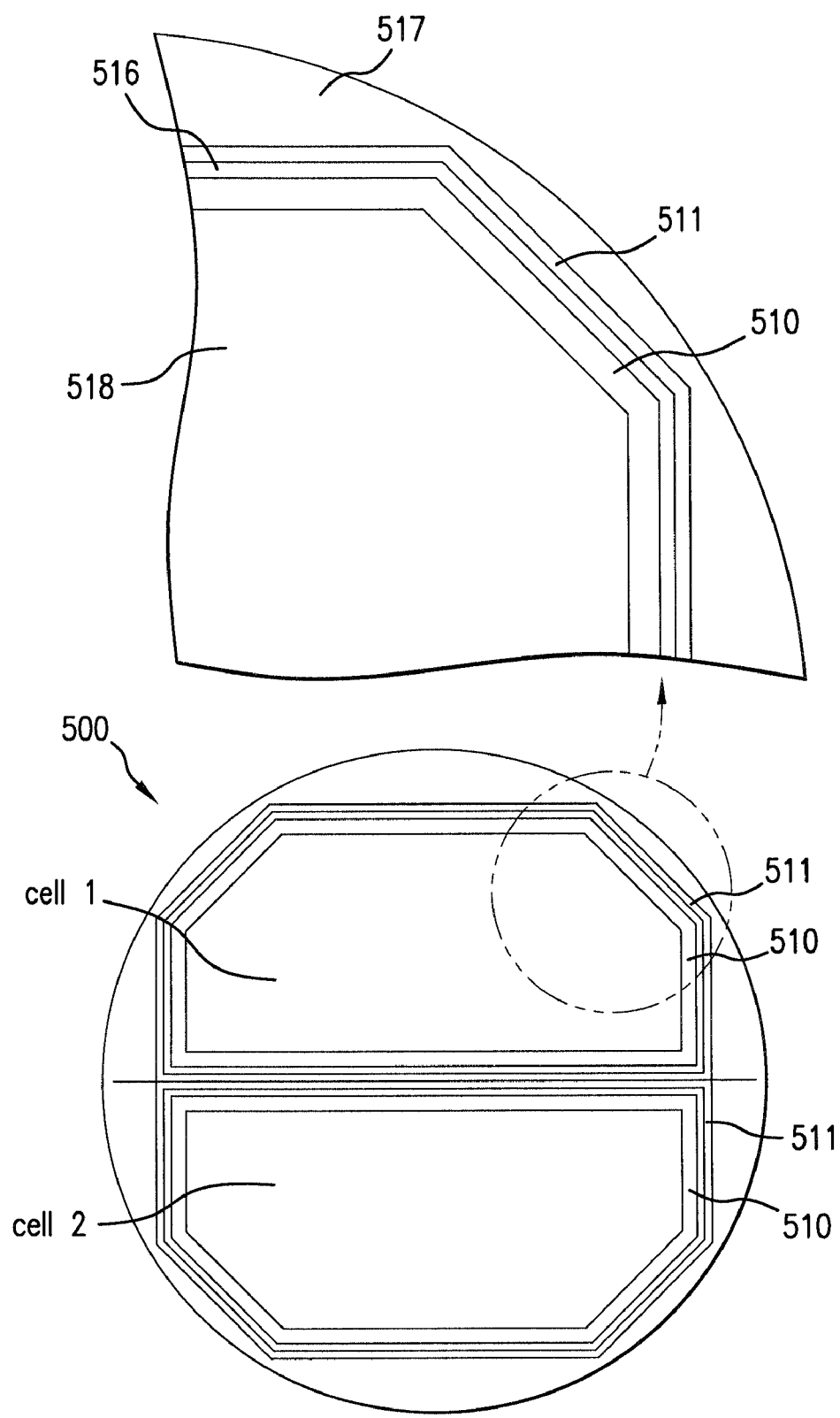
FIG. 13B is a top plan view of the wafer of FIG. 10C depicting the surface view of the trench etched around the cell, after the next process step.

FIG. 13B is a top plan view of the wafer of FIG. 10C depicting the surface view of the trench etched around the periphery of each cell which were shown in cross-section in FIG. 12B.

Figure 13C:
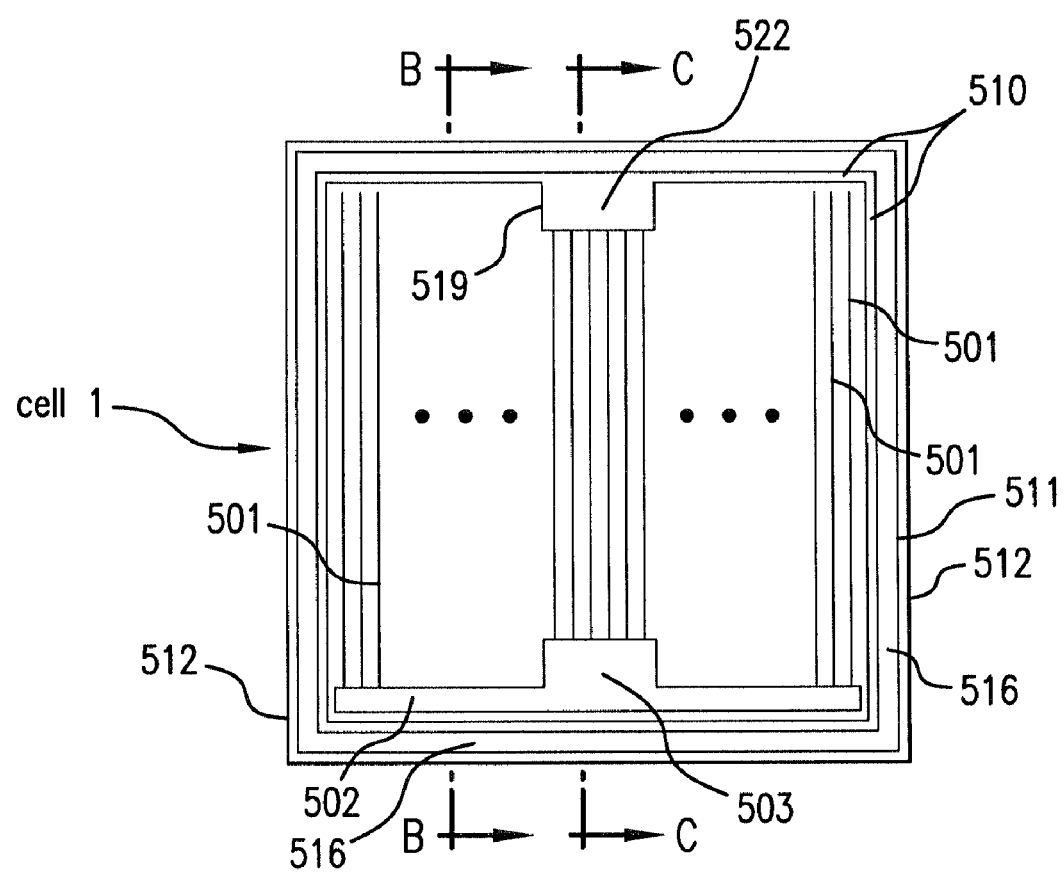
FIG. 13C is a top plan view of a single solar cell after being cut or scribed from the wafer of FIG. 13A.

FIG. 13C is a top plan view of solar cell 1 fabricated on the wafer of FIG. 13A after the individual solar cells (cell 1, cell 2, etc. shown in FIG. 13A) are cut or scribed from the wafer through the channel 511, along with the surrogate substrate 125. The grid lines 501 over the top surface of the cell are also depicted, connected to a bus bar 502. The channel 510 is depicted etched around the periphery of the cell. The mesa 516 circumferentially surrounding the cell is also depicted, as well as the sloping side edge or remaining side portion of the channel 511, and the edge 512 of the surrogate substrate. On one side of the solar cell, at the top of the depicted Figure, a substantially rectangular shaped cut-out 519 is formed at one of the peripheral edges of the cell, which is etched simultaneously with channel 511, so that the resulting exposed area 522 on the top surface of the back metal layer 123 will form a contact pad to allow an electrical contact to be made to the lower subcell from the top surface of the cell. On the opposite side of the solar cell, at the bottom of the depicted Figure, the center portion of the bus bar 502 is expanded in width to form a substantially rectangular shaped top contact 523.

Figure 14A:
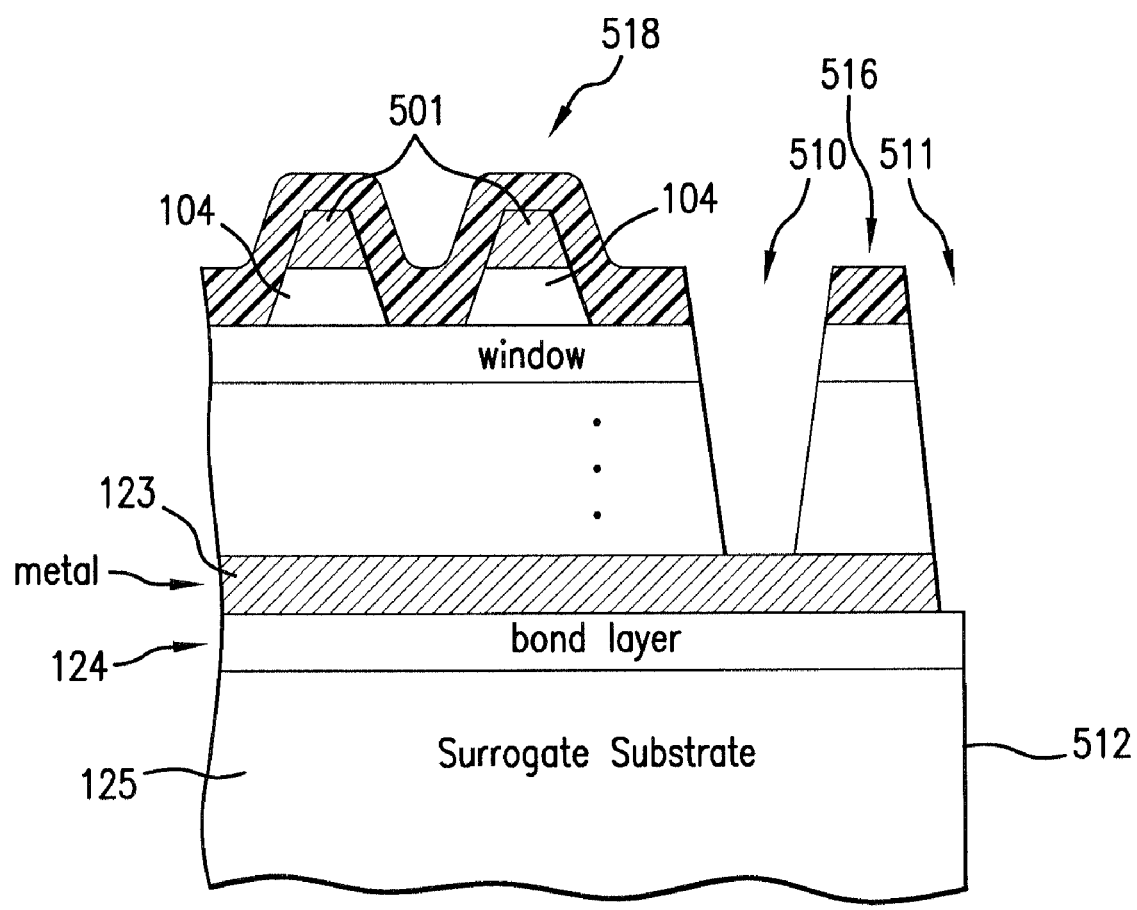
FIG. 14A is a cross-sectional view of the solar cell of FIG. 12B through the A-A plane in FIG. 13A.

FIG. 14A is a cross-sectional view of the solar cell of FIG. 12B after the individual solar cells (cell 1, cell 2, etc. shown in FIG. 13) are cut or scribed from the wafer through the channel 511, leaving a vertical edge 512 extending through the surrogate substrate 125.

Figure 14B:
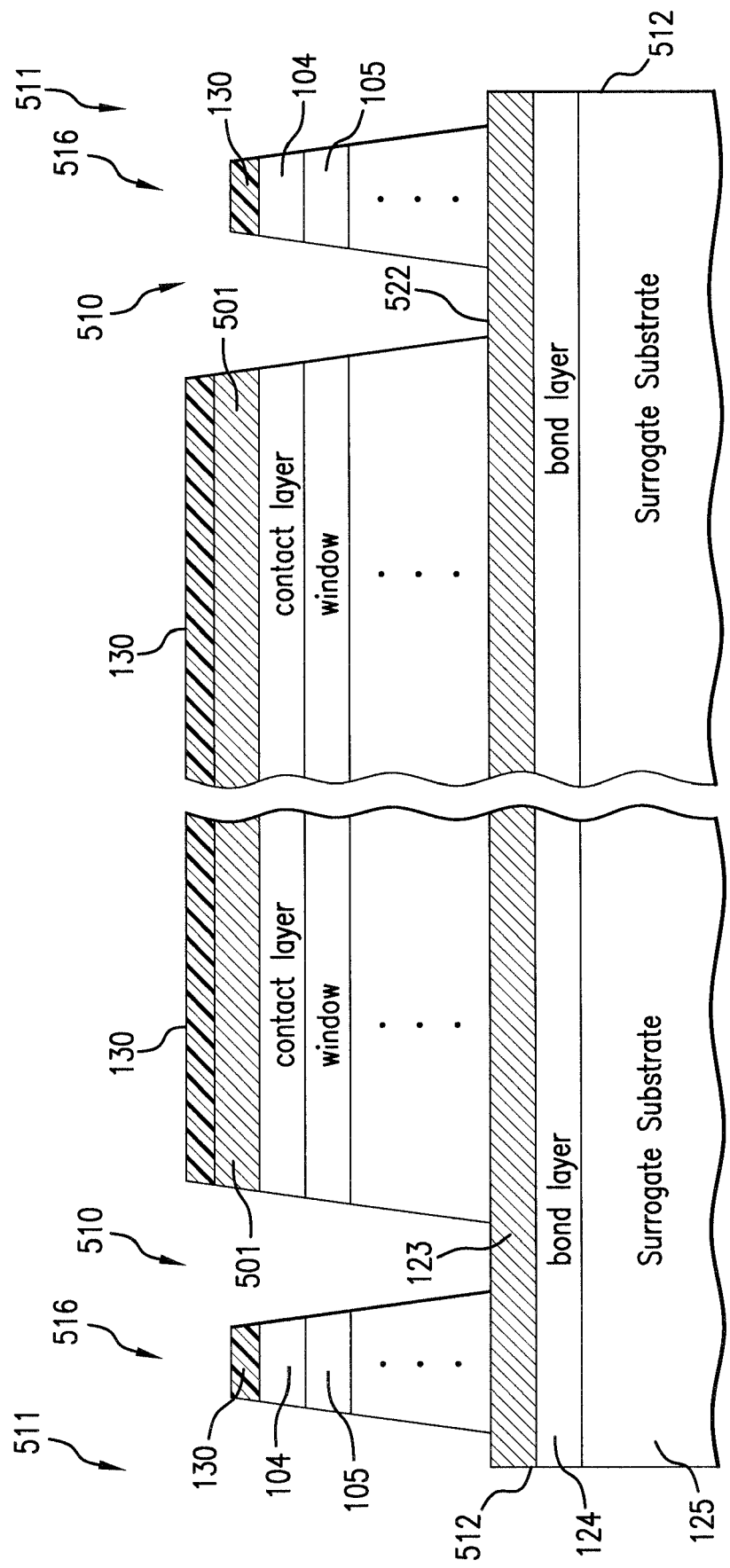
FIG. 14B is a cross-sectional view of the solar cell of FIG. 12B through the B-B plane in FIG. 13C through a grid line.

FIG. 14B is a cross-sectional view of the solar cell of FIG. 12B through the B-B plane in FIG. 13C, the cross-section extending parallel through a grid line 501.

Figure 14C:
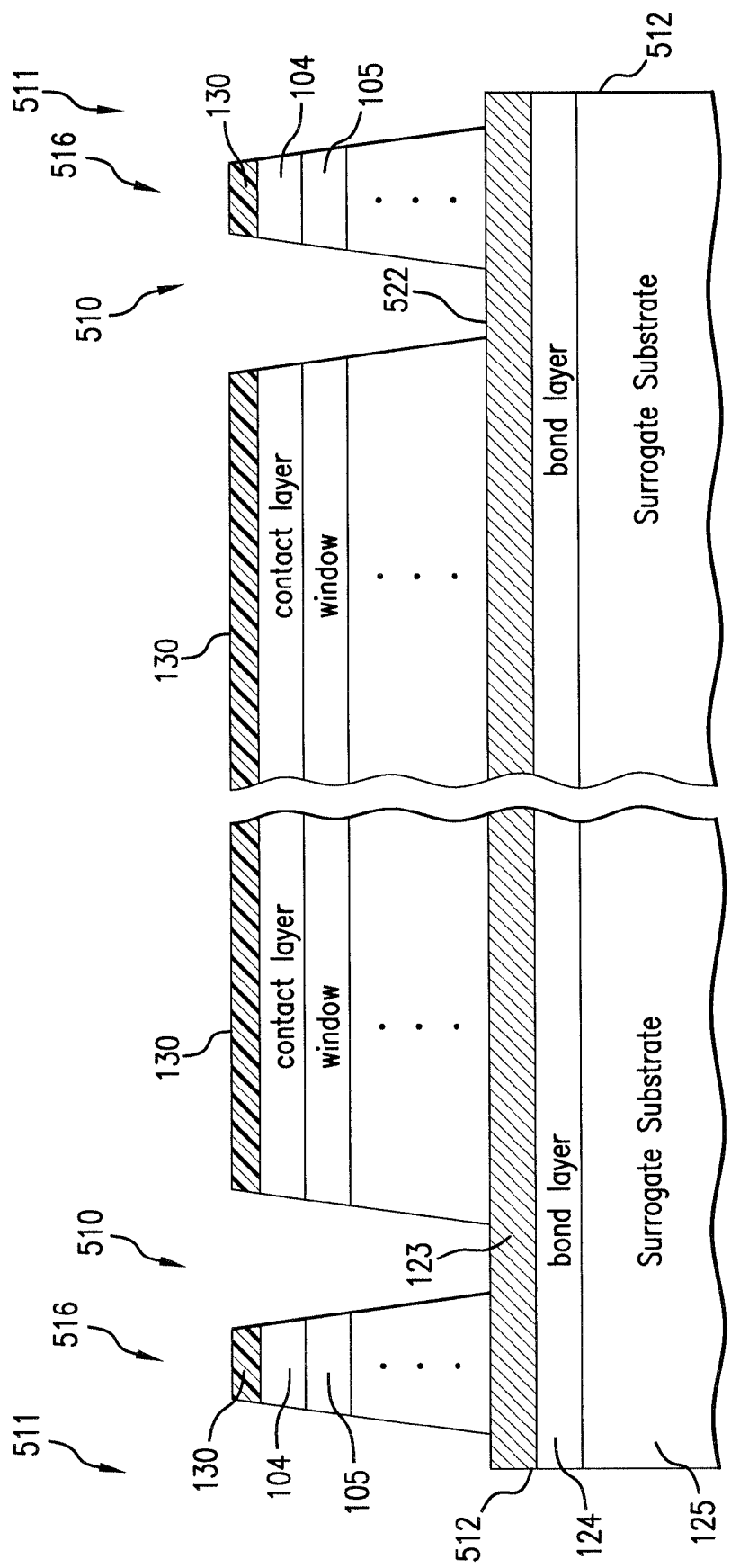
FIG. 14C is a cross-sectional view of the solar cell of FIG. 12B through a plane that lies between grid lines and is closely adjacent to the B-B plane in FIG. 13C.

FIG. 14C is a cross-sectional view of the solar cell of FIG. 12B through a plane that lies between grid lines and is closely adjacent to the B-B plane in FIG. 13C.

Figure 14D:
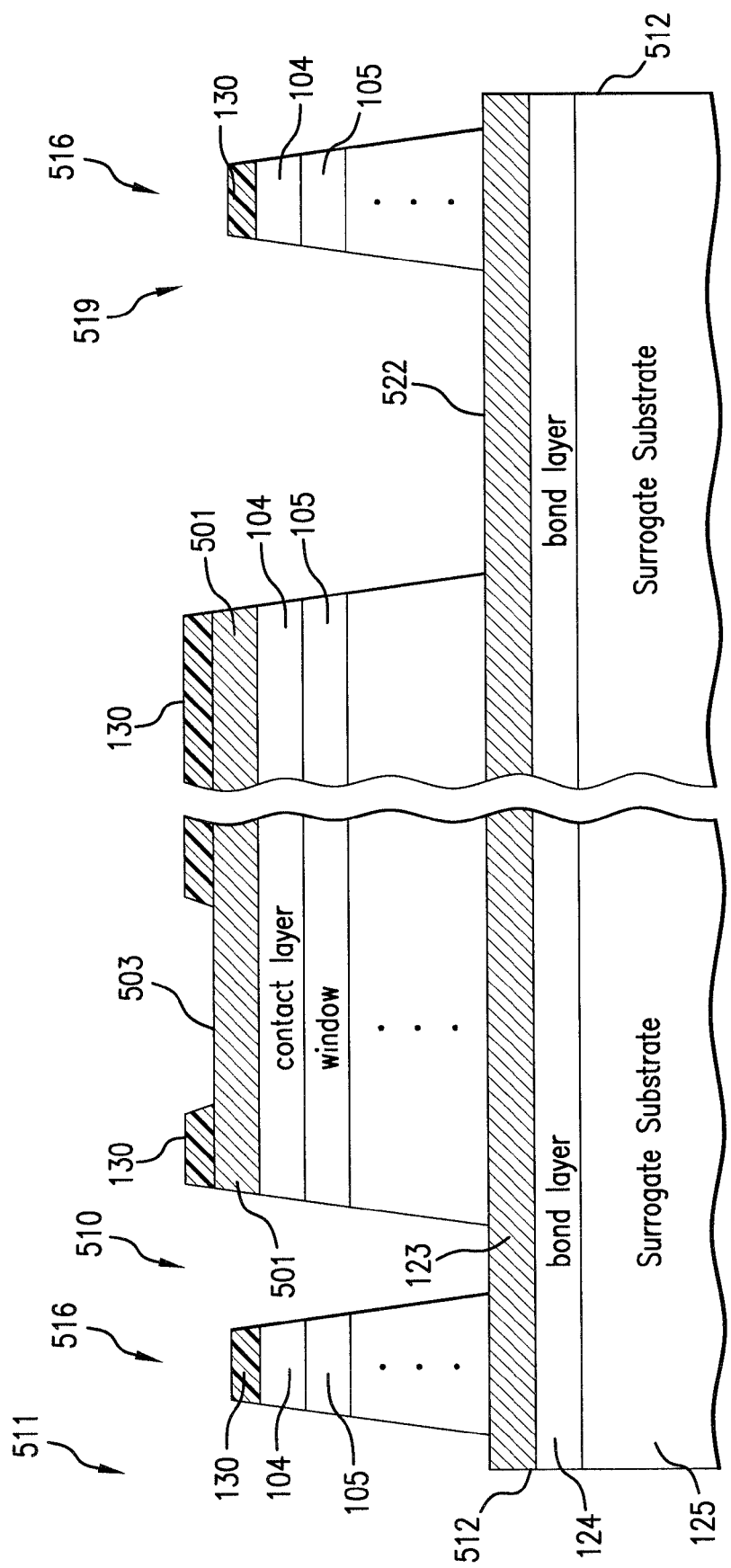
FIG. 14D is a cross-sectional view of the solar cell of FIG. 12B through the C-C plane in FIG. 13C through a grid line.

FIG. 14D is a cross-sectional view of the solar cell of FIG. 12B through the C-C plane in FIG. 13C through a grid line.

Figure 14E:
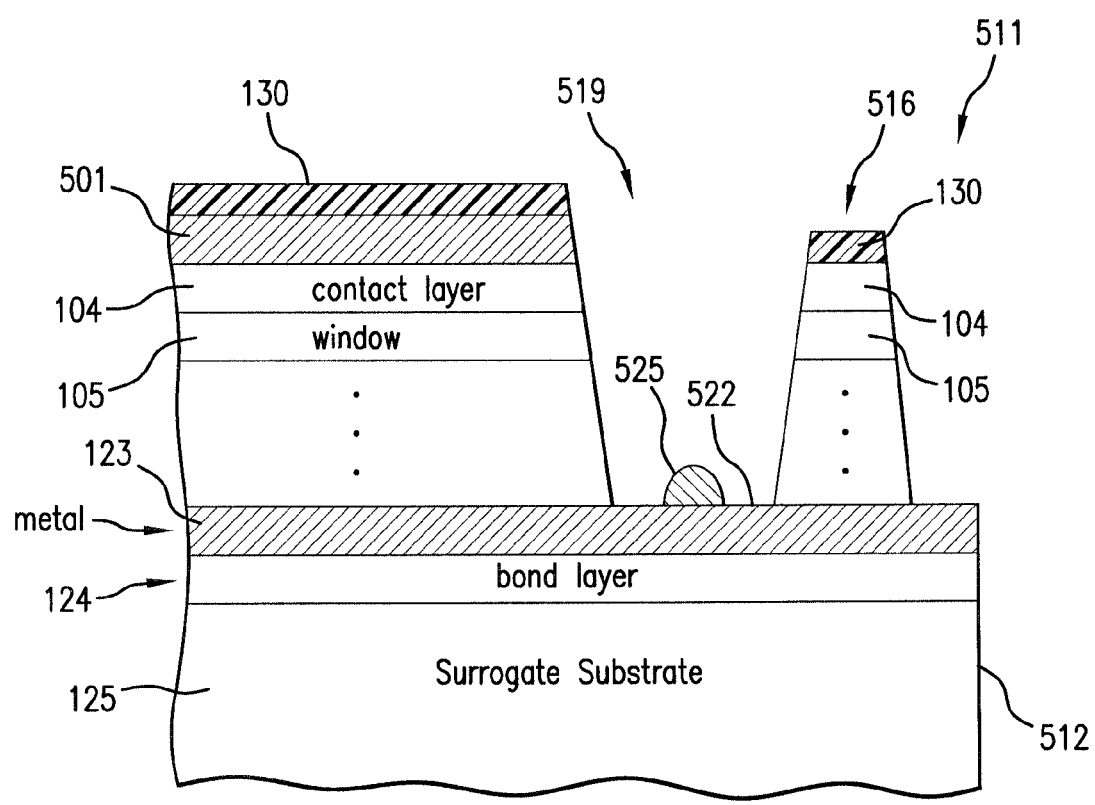
FIG. 14E is a cross-sectional view of the right hand portion of the solar cell as depicted in FIG. 14D after the next process step in one embodiment.

FIG. 14E is a cross-sectional view of the solar cell of FIG. 12B through the D-D plane in FIG. 13C, similar to that of FIG. 14D, but depicting just the right hand side of FIG. 14D for simplicity, after the next process step in an embodiment in which a solder paste 525 is applied to the contact area 522.

Figure 14F:
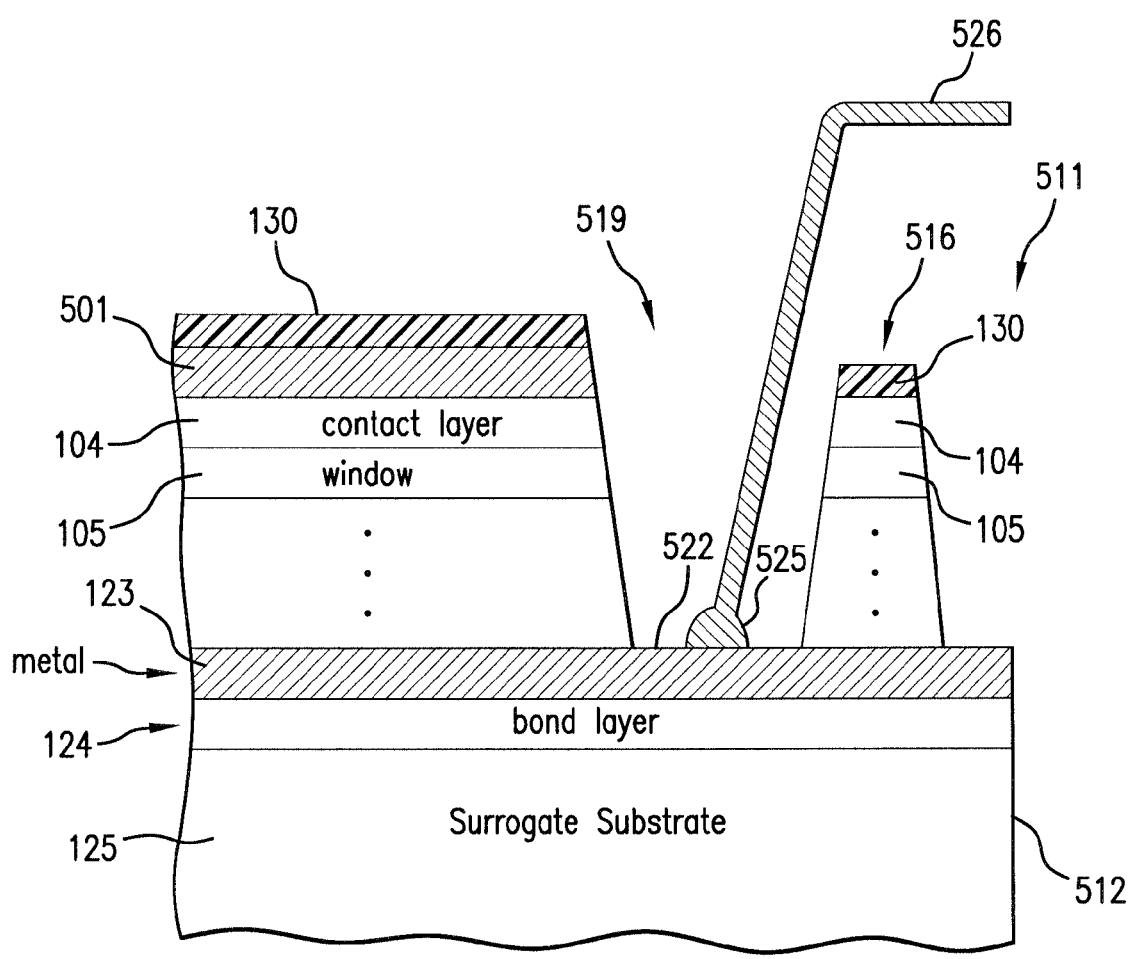
FIG. 14F is a cross-sectional view of the portion of the solar cell of FIG. 14E after the next process step.

FIG. 14F is a cross-sectional view of the solar cell of FIG. 14E after the next process step in an embodiment of the present invention in which a conductive lead 526 is applied to the solder paste 525 over the contact area 522 and attached by resistance reflow soldering or laser brazing. In a similar manner (not shown in the Figure), a conductive lead 526 is applied to the solder paste 525 over the contact area 503 and attached by resistance reflow soldering or laser brazing. In some embodiments, the conductive lead may be composed of Kovar™ or other material with a suitable coefficient of thermal expansion closely matching that of the associated metal contact layer 123 or underlying semiconductor layers.

In some embodiments, the conductive lead may be attached with the cell being supported on a vacuum block (not shown). The vacuum block support is described in U.S. patent application Ser. No. 12/362,201 filed Jan. 29, 2009, herein incorporated by reference, which includes holes extending through its thickness to which a small vacuum is applied to secure the cells to the vacuum block during the lead attachment and possibly subsequent fabrication steps.

Figure 14G:
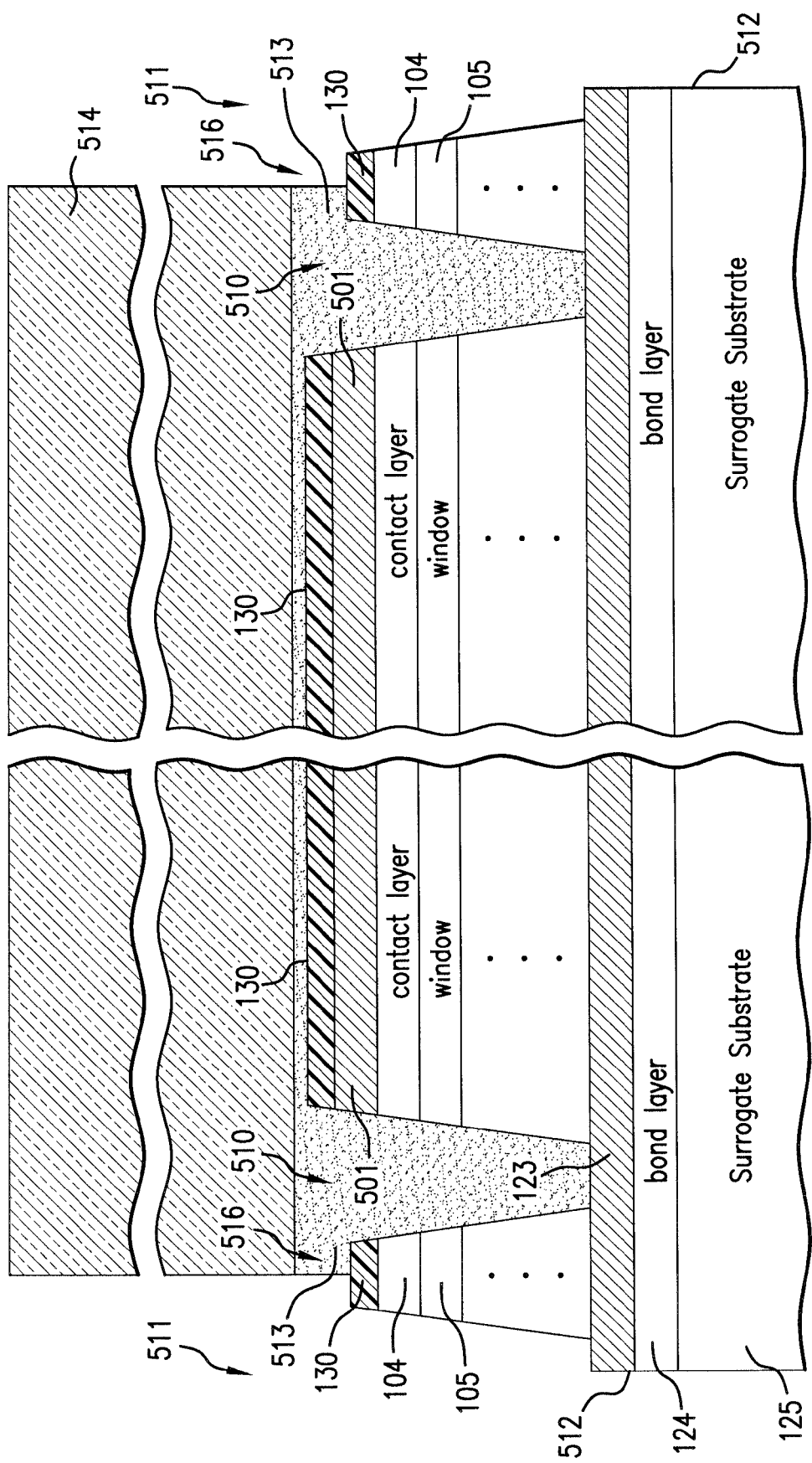
FIG. 14G is a cross-sectional view of the portion of the solar cell of FIG. 14F through the B-B plane in FIG. 13C through a grid line, after the process step in which a cover glass is attached.

FIG. 14G is a cross-sectional view of the solar cell of FIG. 14F through the B-B plane in FIG. 13C through a grid line, after the process step in an embodiment of the present disclosure in which a cover glass 514 is secured to the top of the cell by an adhesive 513. The cover glass 514 is typically about 4 mils thick and preferably has a cut-out along the edge which peripherally surrounds the lead 526 over the contact area 522. Although the use of a cover glass is desirable for many environmental conditions and applications, it is not necessary for all implementations, and additional layers or functionally equivalent structures may also be utilized for providing additional support or environmental protection to the solar cell.

Figure 14H:
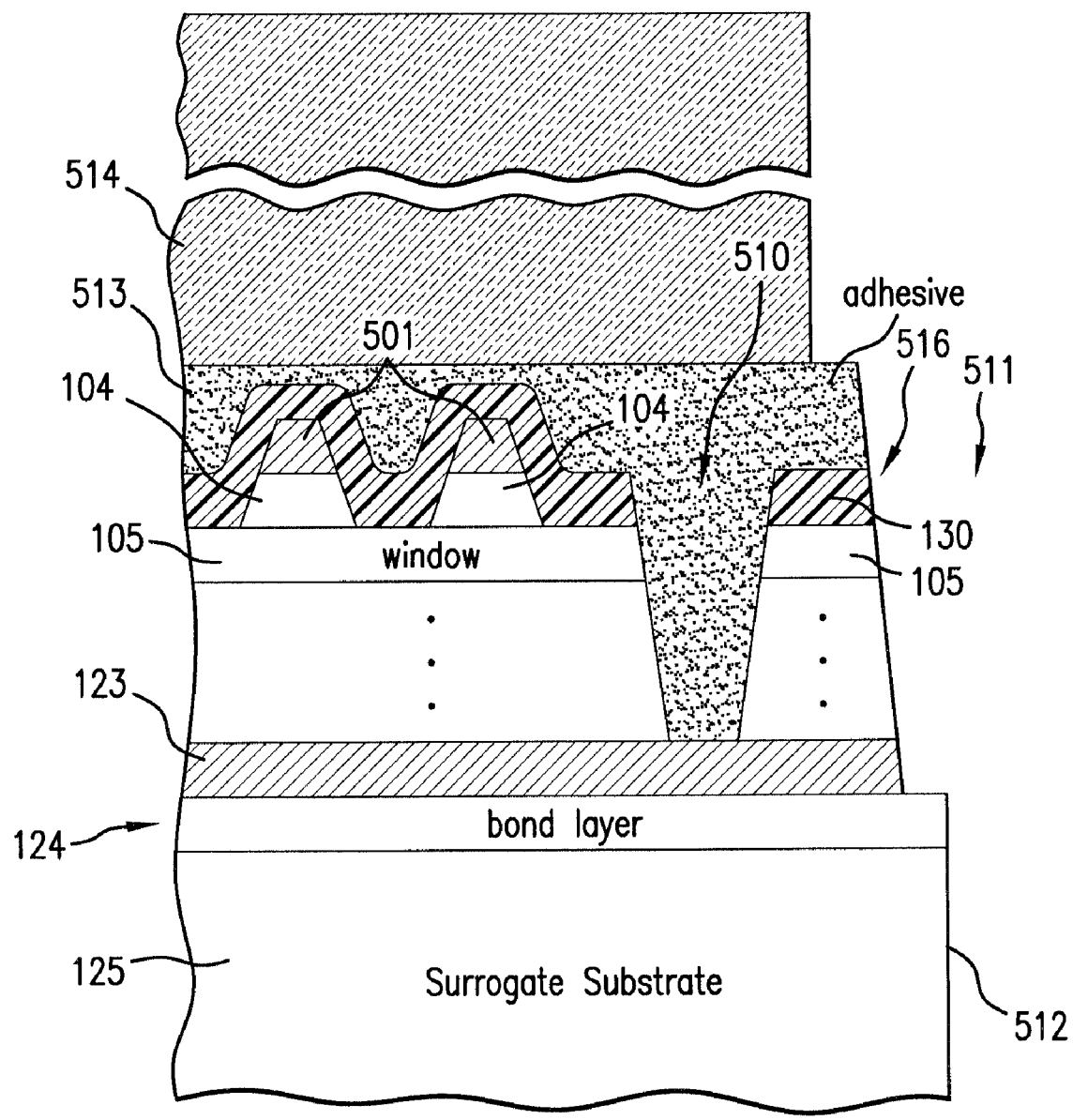
FIG. 14H is a cross-sectional view of the portion of the solar cell of FIG. 14F through the A-A plane in FIG. 13A, after the process step in which a cover glass is attached.

FIG. 14H is a cross-sectional view of the portion of the solar cell of FIG. 14A through the A-A plane in FIG. 13A, after the process step in which a cover glass 514 is attached to the top of the cell by an adhesive 513. As shown in this view, depicting a region of the solar cell away from the contact areas 503 and 522, the cover glass 514 extends to the periphery of the solar cell and preferably covers the entire channel 510, but does not extend to channel 511.

Figure 14I:
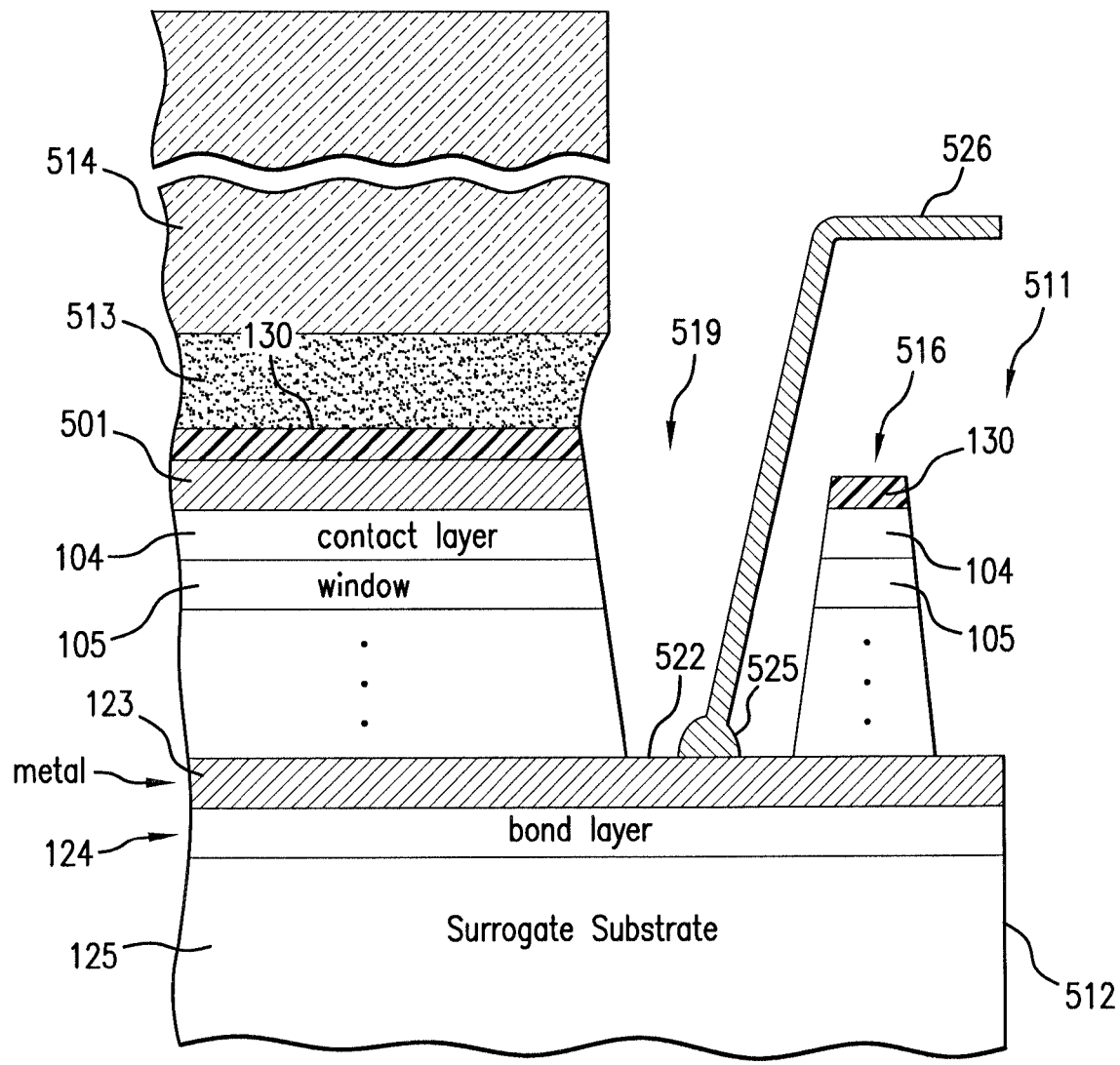
FIG. 14I is a cross-sectional view of the portion of the solar cell of FIG. 14F through the C-C plane in FIG. 13C through a grid line, after the process step in which a cover glass is attached.

FIG. 14I is a cross-sectional view of the portion of the solar cell of FIG. 14G through the C-C plane in FIG. 13C, the cross-section extending between grid lines 501, and depicting the contact areas 522. A conductive lead 526 is applied to a solder paste 525 over the contact area 522 and attached by resistance reflow soldering or laser brazing.

Figure 14J:
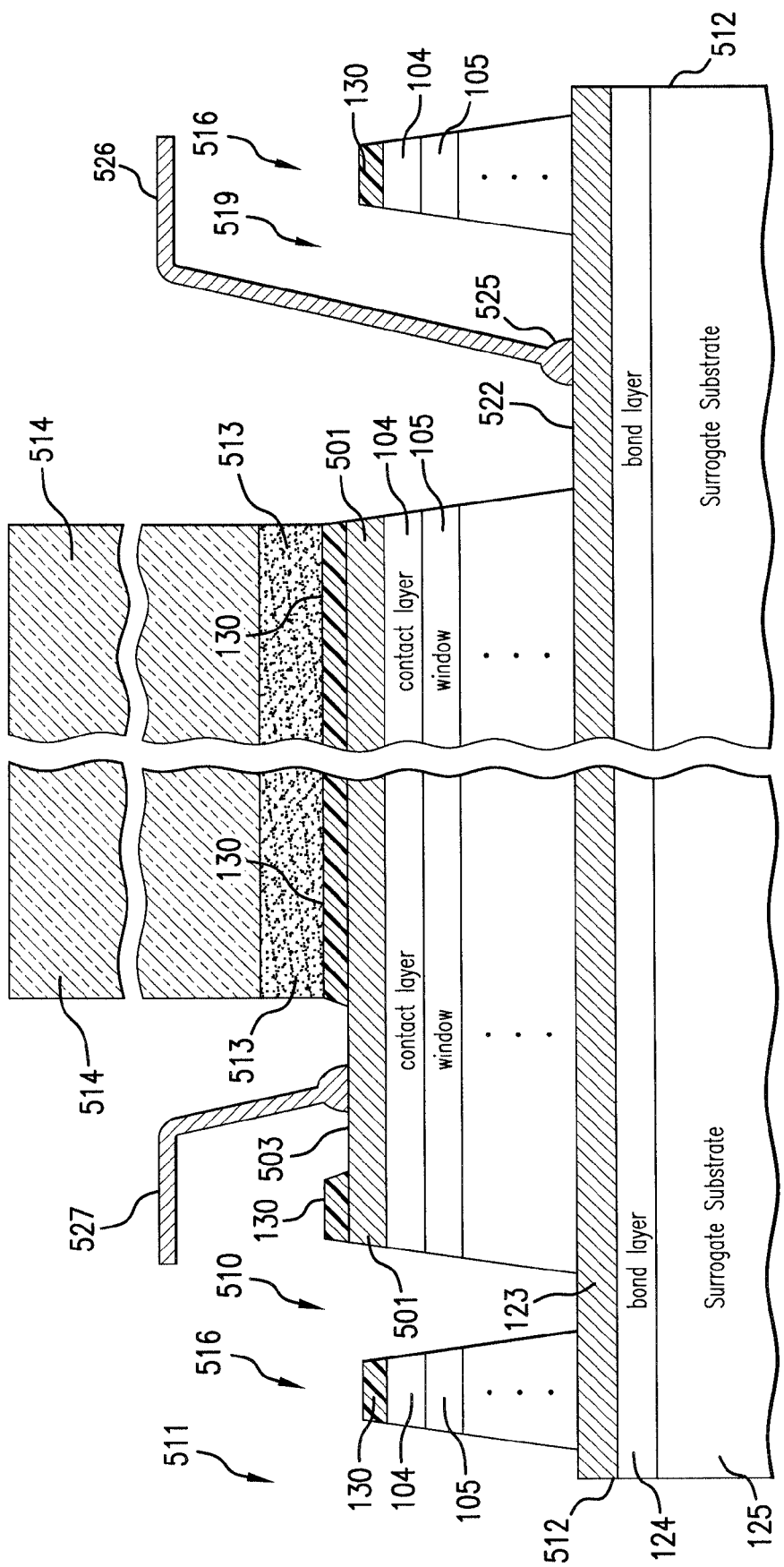
FIG. 14J is a cross-sectional view of the solar cell of FIG. 14F through the C-C plane in FIG. 13C through a grid line, after the process step in which a cover glass is attached.

FIG. 14J is a cross-sectional view of the entire solar cell of FIG. 14G through the C-C plane in FIG. 13C, the cross-section extending between grid lines 501, and depicting both of the contact areas 503 and 522. This view depicts a conductive lead 527 which is applied to a solder paste 525 over the contact area 503 and attached by resistance reflow soldering or laser brazing. The contact areas 503 and 522 are depicted with the leads 527 and 526 attached respectively thereto.

Figure 14K:
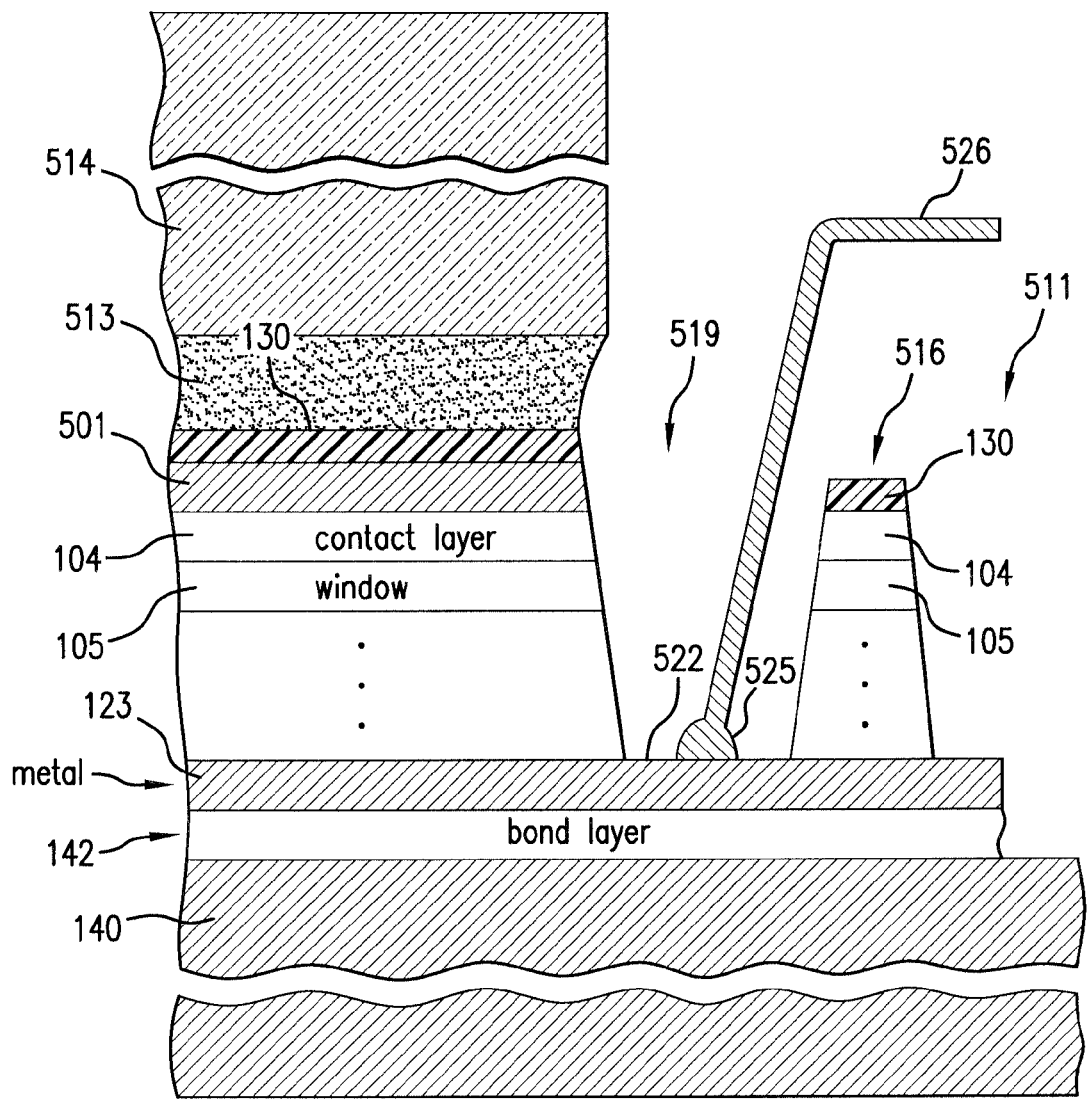
FIG. 14K is a cross-sectional view of the portion of the solar cell of FIG. 14I after the next process step in one embodiment.

FIG. 14K is a cross-sectional view of the solar cell of FIG. 14I after the next sequence of process steps in an embodiment in which the surrogate substrate 125 is removed and the solar cell is attached to a thin metallic flexible film 140 by a bond layer 142. More particularly, the metal contact layer 123 may be attached to the flexible film 141 by an adhesive 142 (either metallic or non-metallic), or by metal sputtering evaporation, or soldering. Reference may be made to U.S. patent application Ser. No. 11/860,142 filed Sep. 24, 2007, depicting utilization of a portion of the metal contact layer 123 as a contact pad for making electrical contact to an adjacent solar cell.

One aspect of some implementations of the present disclosure, such as described in U.S. patent application Ser. No. 12/637,241, filed Dec. 14, 2009, is that the metallic flexible film 141 has a predetermined coefficient of thermal expansion, and the coefficient of thermal expansion of the semiconductor body closely matches the predetermined coefficient of thermal expansion of the metallic film 141.

In some implementations, the metallic film 141 is a solid metallic foil. In other implementations, the metallic film 141 comprises a metallic layer deposited on a surface of a Kapton or polyimide material. In some implementations, the metallic layer is composed of copper.

In some implementations, the semiconductor solar cell has a thickness of less than 50 microns, and the metallic flexible film 141 has a thickness of approximately 75 microns.

In some implementations, the metal electrode layer may have a coefficient of thermal expansion within a range of 0 to 10 ppm per degree Kelvin different from that of the adjacent semiconductor material of the semiconductor solar cell. The coefficient of thermal expansion of the metal electrode layer may be in the range of 5 to 7 ppm per degree Kelvin.

In some implementations, the metallic flexible film comprises molybdenum, and in some implementations, the metal electrode layer includes molybdenum.

In some implementations, the metal electrode layer includes a Mo/Ti/Ag/Au, Ti/Mo/Ti/Ag, or Ti/Au/Mo sequence of layers.

Figure 14L:
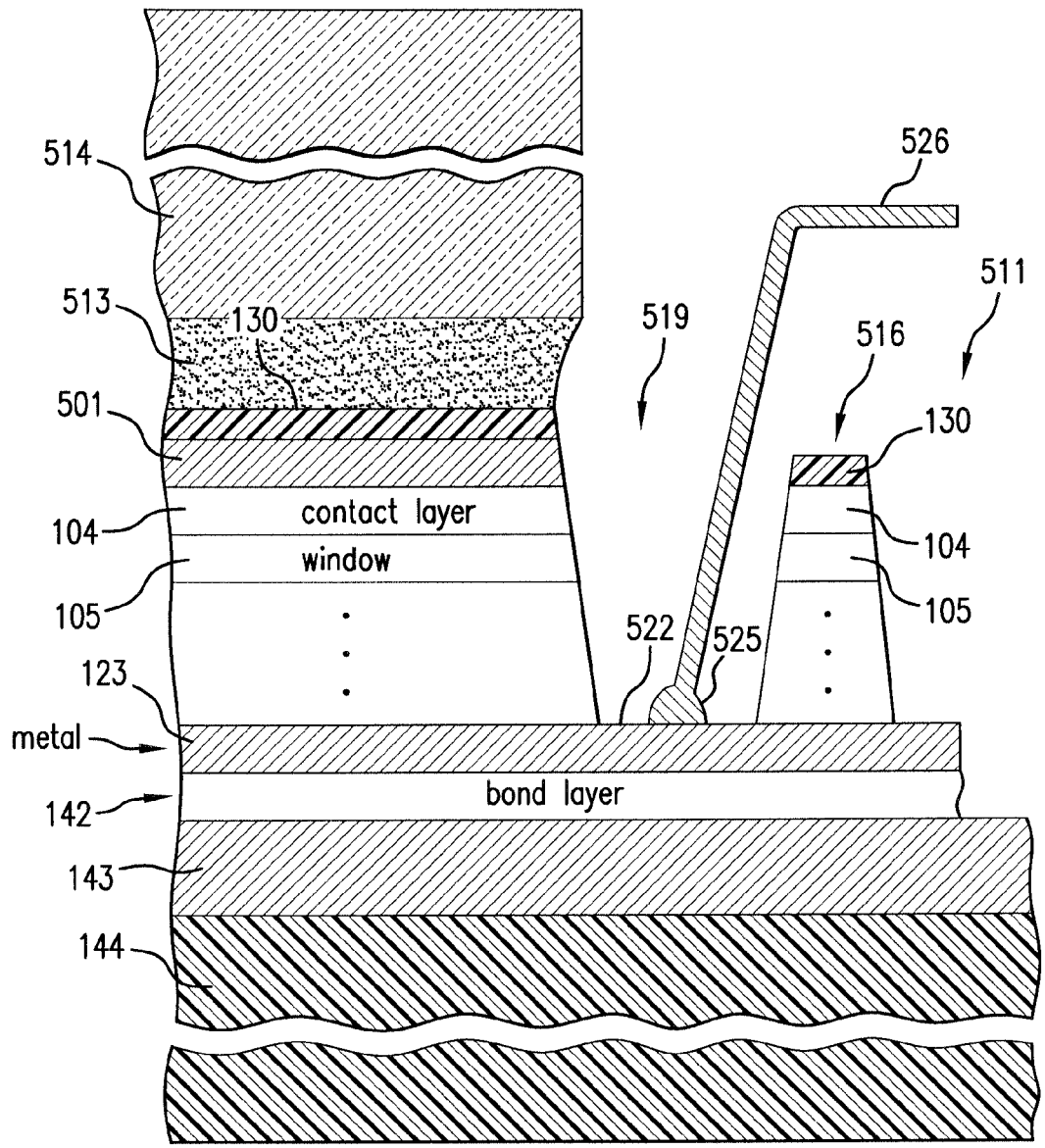
FIG. 14L is a cross-sectional view of the portion of the solar cell of FIG. 14I after the next process step in one embodiment.

FIG. 14L is a cross-sectional view of the solar cell of FIG. 14I after the next sequence of process steps in an embodiment in which the surrogate substrate 125 is removed and the solar cell is attached to a thin film 144 which has a metallic layer 143 on the adjoining surface. In one embodiment, the thin film 144 may be Kapton™ or another suitable polyimide material. As in the embodiment of FIG. 14K, the attachment may utilize an adhesive bond layer 142 (either metallic or non-metallic), or the bond layer 142 may be formed by soldering or similar techniques.

FIGS. 15A through 15E are a sequence of cross-sectional views of the solar cell depicted in FIG. 13C as seen from the C-C plane indicated in FIG. 13C, and more specifically depicting the right hand portion of the solar cell depicted in FIG. 14D in the embodiment in which a cover glass is attached to the solar cell prior to the lead attachment.

Figure 15A:
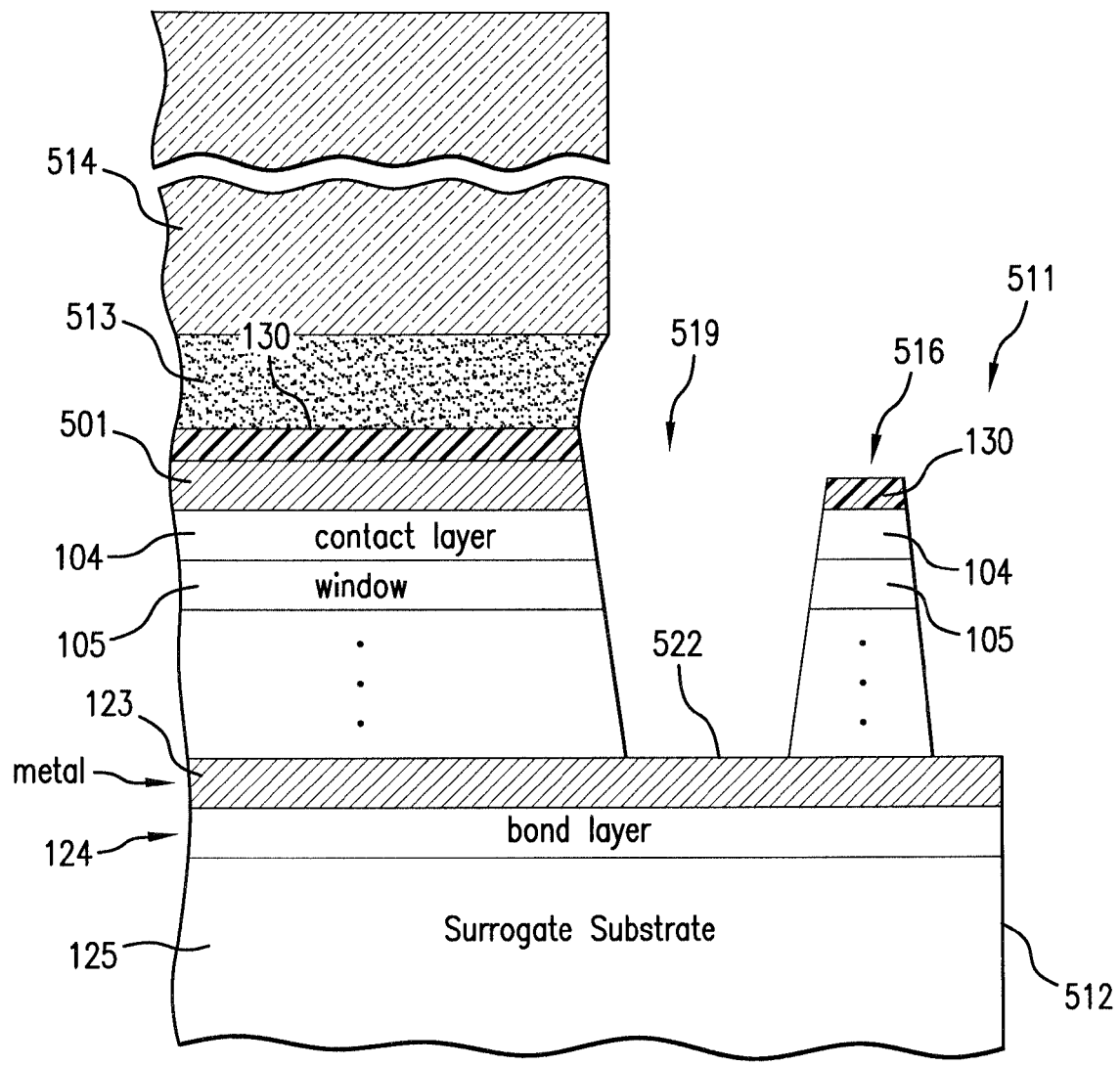
FIG. 15A is a cross-sectional view of the right hand portion of the solar cell as depicted in FIG. 14D after the next process step in one embodiment in which a cover glass is attached.

FIG. 15A is a cross-sectional view of the solar cell of FIG. 14D after the process step in the embodiment of the present disclosure in which a cover glass 514 is secured to the top of the cell by an adhesive 513. The cover glass 514 is typically about 4 mils thick and in the region away from the contacts, as depicted in FIG. 14H, the cover glass preferably covers the entire channel 510, but does not extend to channel 511. In the region of the contacts 503 and 522, as depicted in FIG. 15A, the cover glass preferably has a rectangular cut-out (as seen from a top view, not shown) so as to provide an opening so that a metal lead may be placed and attached to the contacts 503 and 522 respectively. The cover glass has a cut-out on two of its opposing opposite edges over the top cell, the cut-outs peripherally surrounding the conductive leads to the metal contact layer and the metal back contacts respectively.

Figure 15B:
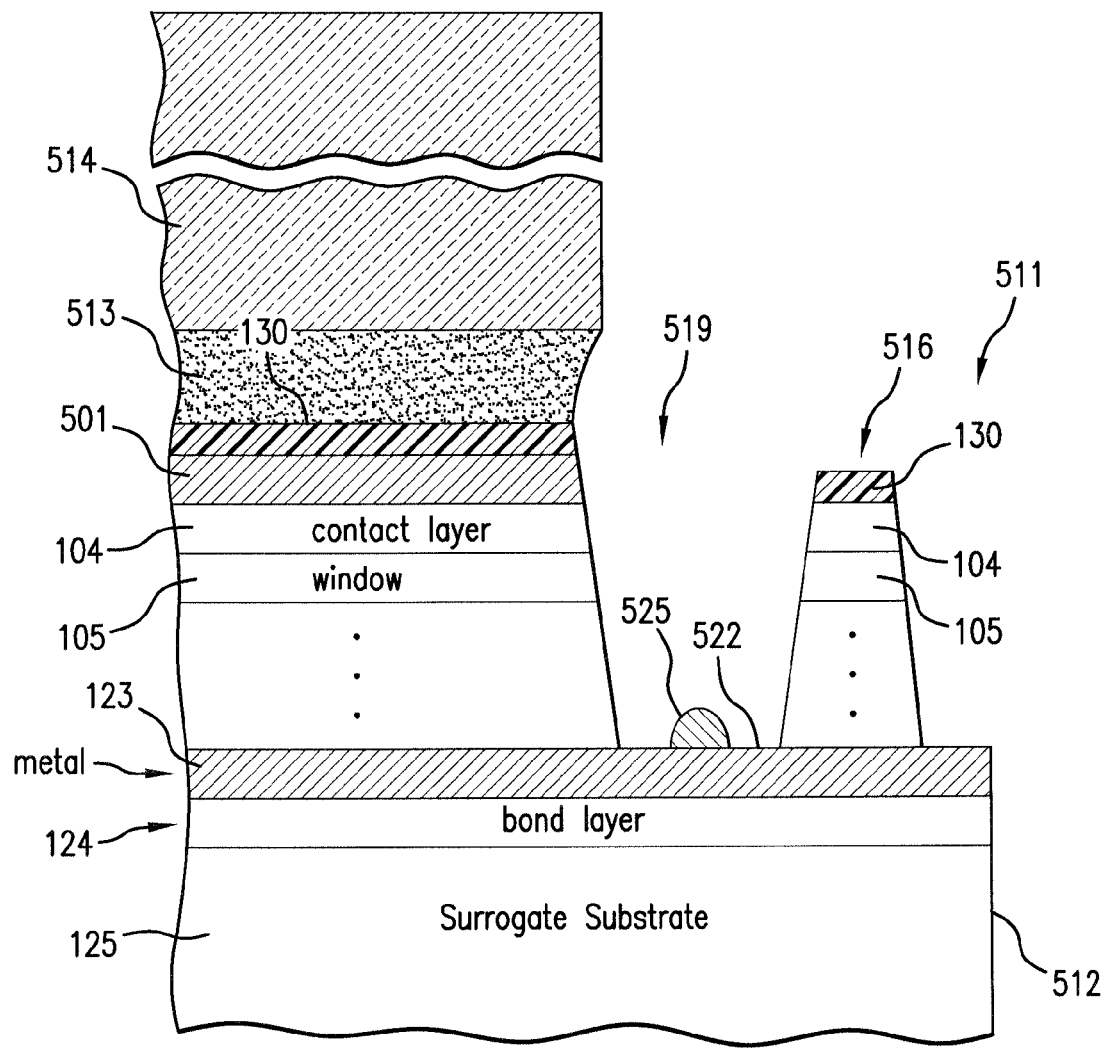
FIG. 15B is a cross-sectional view of the portion of the solar cell of FIG. 15A after the next process step.

FIG. 15B is a cross-sectional view of the solar cell of FIG. 15A after the next process step in an embodiment of the present invention in which a solder paste 525 is applied to the contact area 522.

Figure 15C:
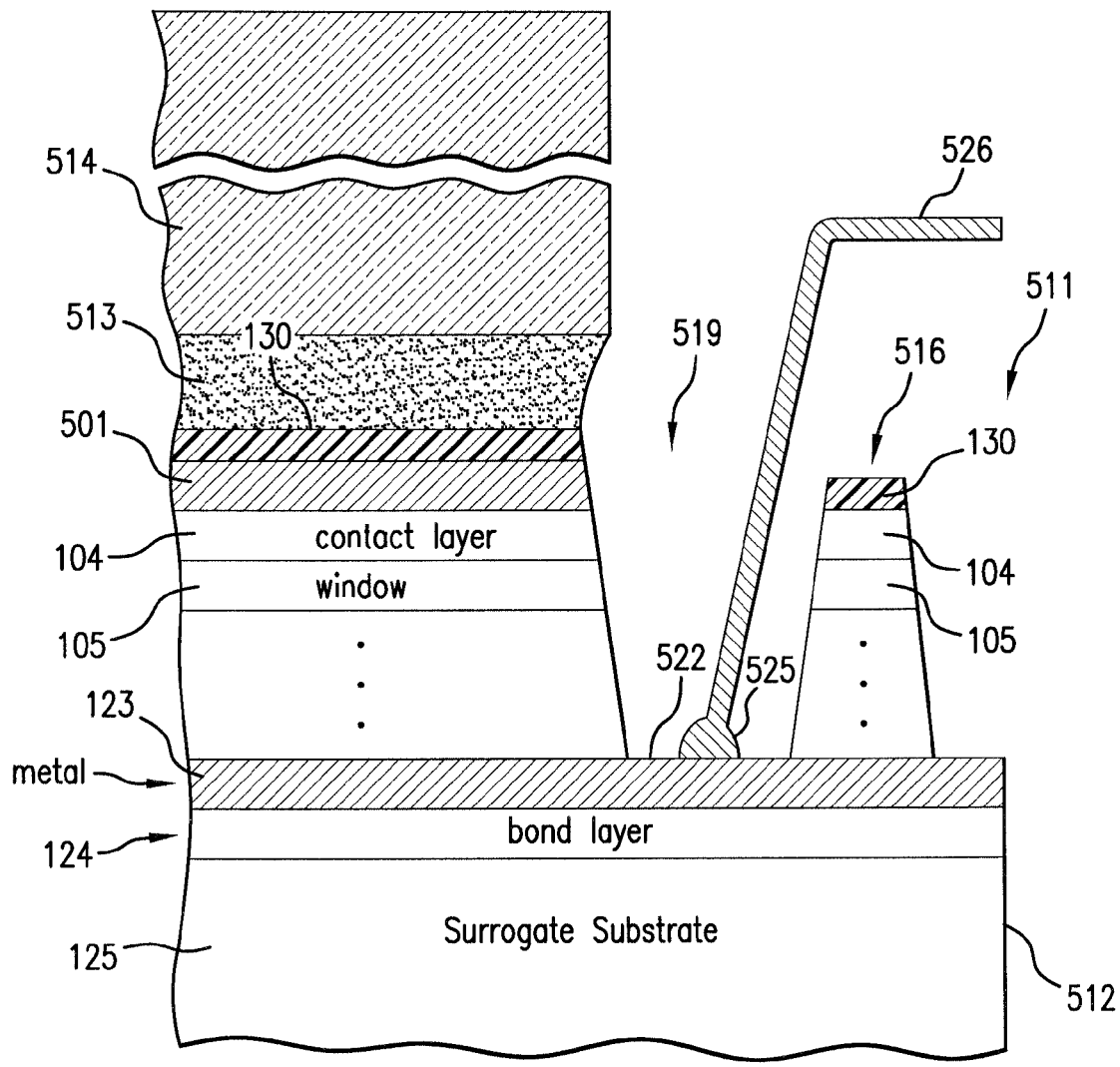
FIG. 15C is a cross-sectional view of the portion of the solar cell of FIG. 15B after the next process step.

FIG. 15C is a cross-sectional view of the solar cell of FIG. 15B after the next process step in an embodiment of the present invention in which a conductive lead 526 is applied to the solder paste 525 over the contact area 522 and attached by resistance reflow soldering or laser brazing. In a similar manner (not shown in the Figure), a conductive lead 527 is applied to the solder paste 525 over the contact area 503 and attached by resistance reflow soldering or laser brazing.

Figure 15D:
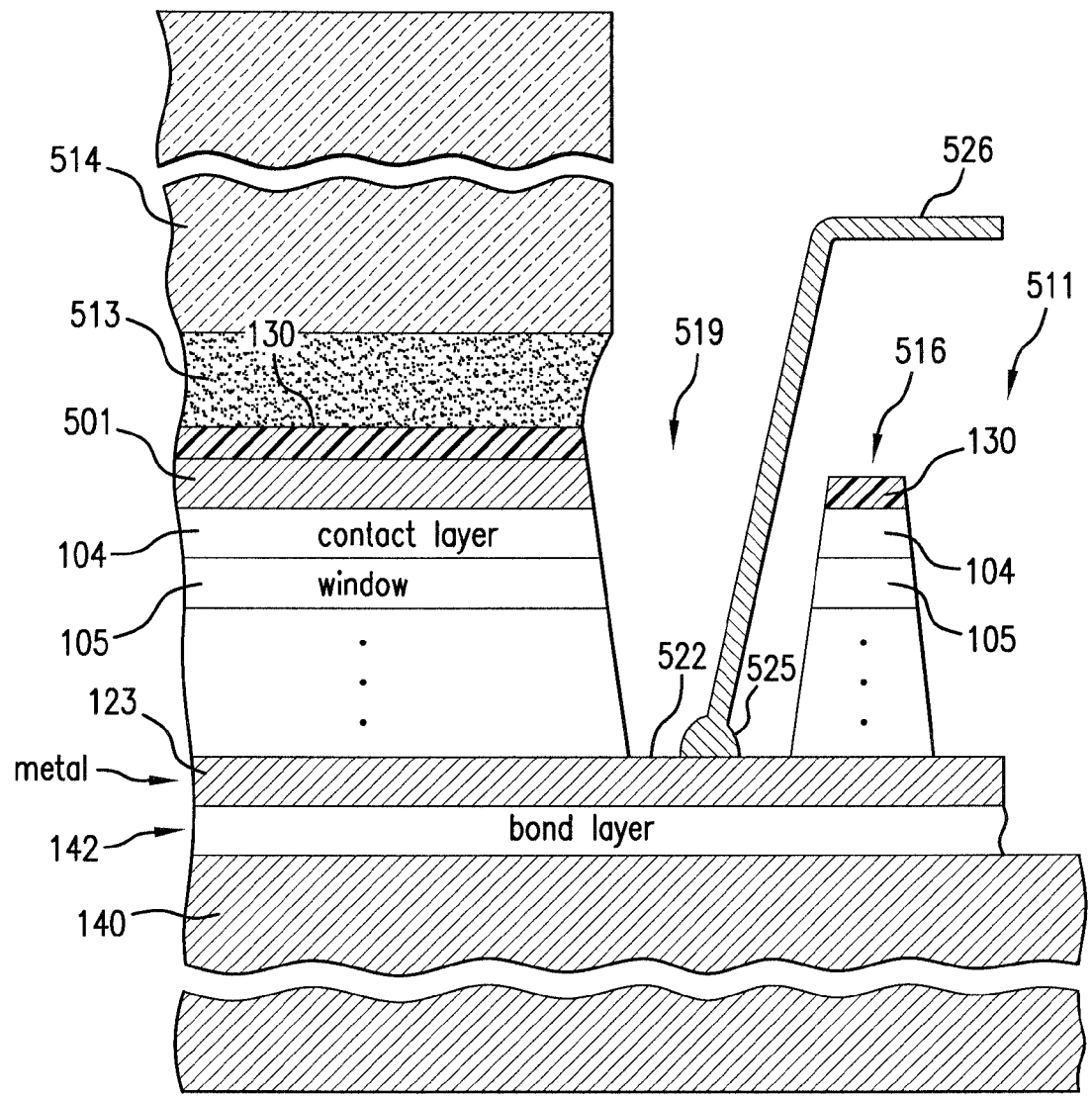
FIG. 15D is a cross-sectional view of the portion of the solar cell of FIG. 15C after the next process step in one embodiment.

FIG. 15D is a cross-sectional view of the solar cell of FIG. 15C after the next sequence of process steps in another embodiment in which the surrogate substrate 125 is removed and the solar cell is attached to a thin metallic flexible film 140 by a bond layer 142. More particularly, the metal contact layer 123 may be attached to the flexible film 141 by an adhesive 142 (either metallic or non-metallic), or by metal sputtering evaporation, or soldering. The other features described in connection with the embodiments of FIG. 14J are also applicable in this embodiment, and need not be repeated here.

Figure 15E:
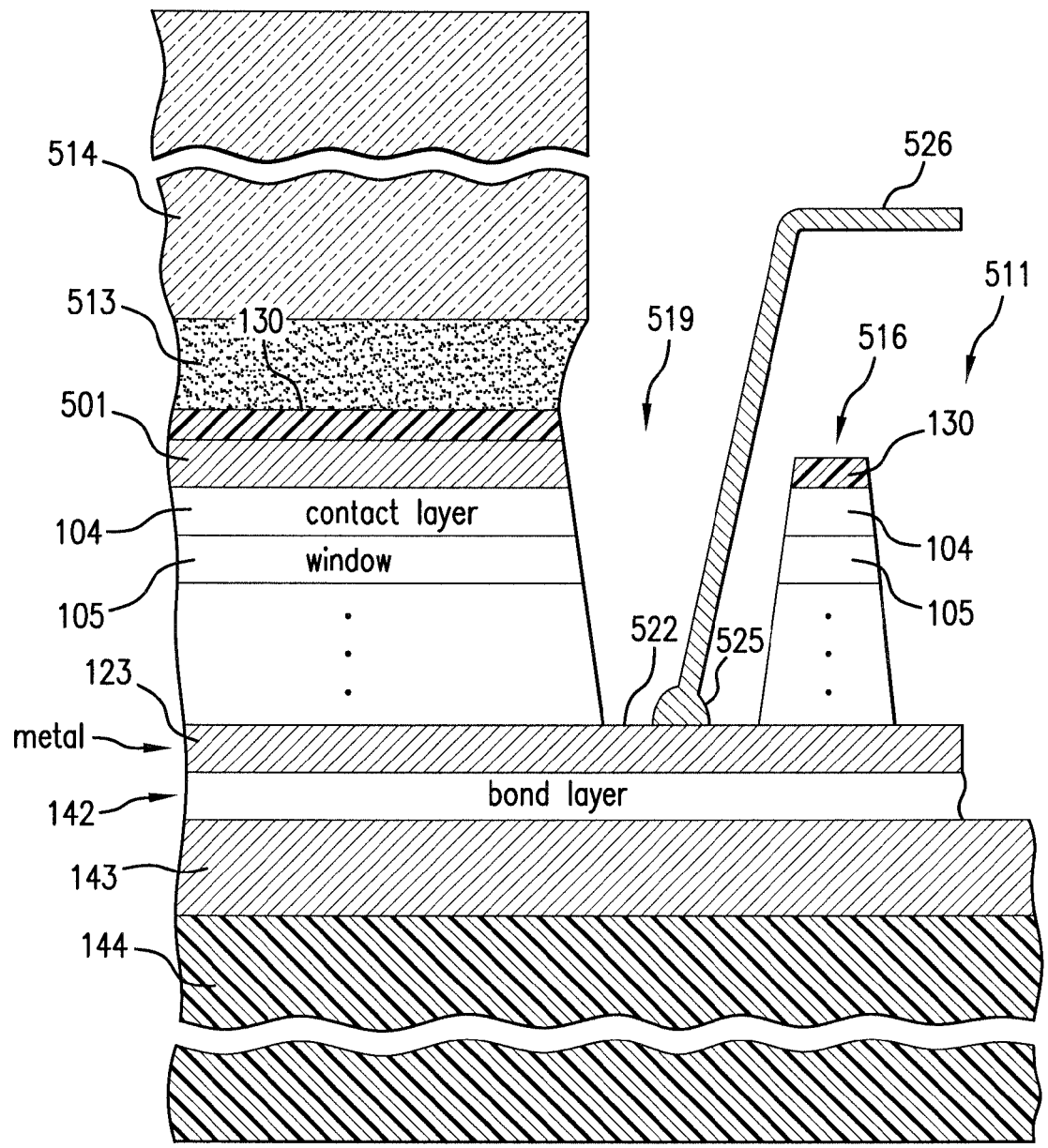
FIG. 15E is a cross-sectional view of the portion of the solar cell of FIG. 15B after the next process step in one embodiment.

FIG. 15E is a cross-sectional view of the solar cell of FIG. 15C after the next sequence of process steps in another embodiment in which the surrogate substrate 125 is removed and the solar cell is attached to a thin film 144 which has a metallic layer 143 on the adjoining surface. In one embodiment, the thin film 144 may be Kapton™ or another suitable polyimide material. As in the embodiment of FIG. 15D, the attachment may utilize an adhesive bond layer 142 (either metallic or non-metallic), or the bond layer 142 may be formed by soldering or similar techniques.

Figure 16:
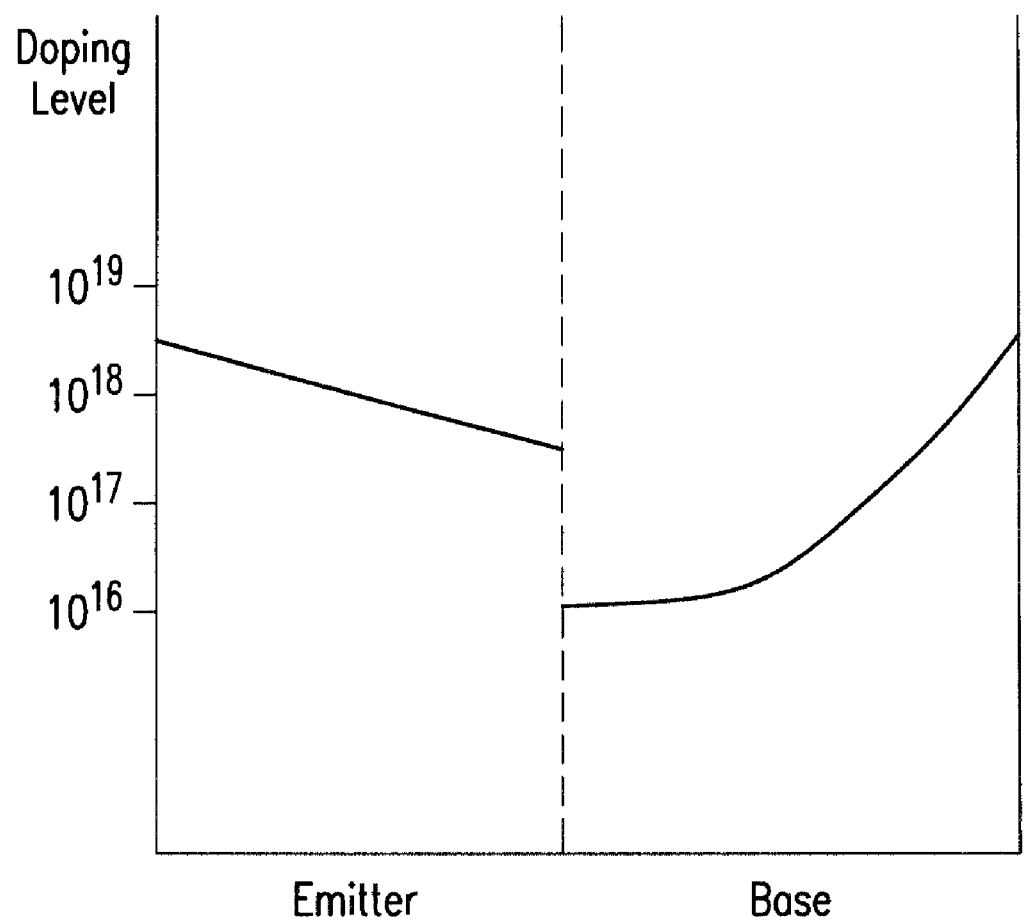
FIG. 16 is a graph of the doping profile in the base and emitter layers of a subcell in the metamorphic solar cell in an embodiment of the present invention.

FIG. 16 is a graph of a doping profile in the emitter and base layers in one or more subcells of some embodiments of the inverted metamorphic multijunction solar cell of the present disclosure. The various doping profiles within the scope of the present disclosure and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present disclosure.

Figure 17:
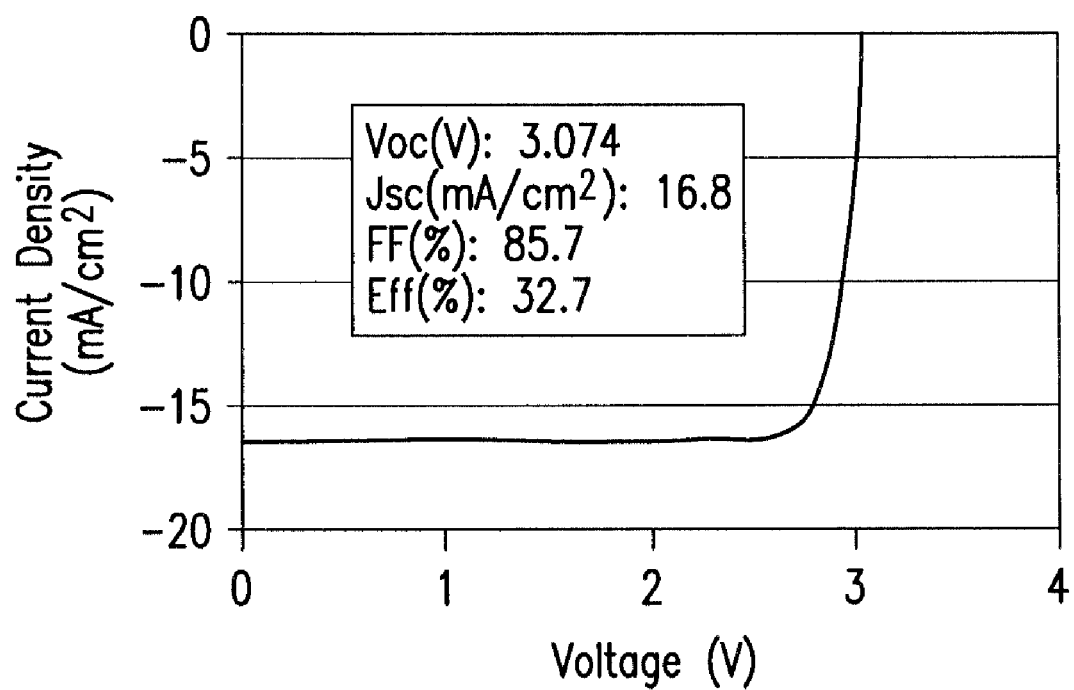
FIG. 17 is a graph that depicts the current and voltage characteristics of an inverted metamorphic multijunction solar cell in an embodiment of the present invention.

FIG. 17 is a graph that depicts the current and voltage characteristics of the solar cell that is representative of inverted metamorphic multijunction solar cells disclosed in the related applications noted above and according to the present disclosure. The solar cell has an open circuit voltage ($V_{oc}$) of approximately 3.074 volts, a short circuit current of approximately 16.8 mA/cm$^2$, a fill factor of approximately 85.7%, and an efficiency of 32.7%.

Figure 18:
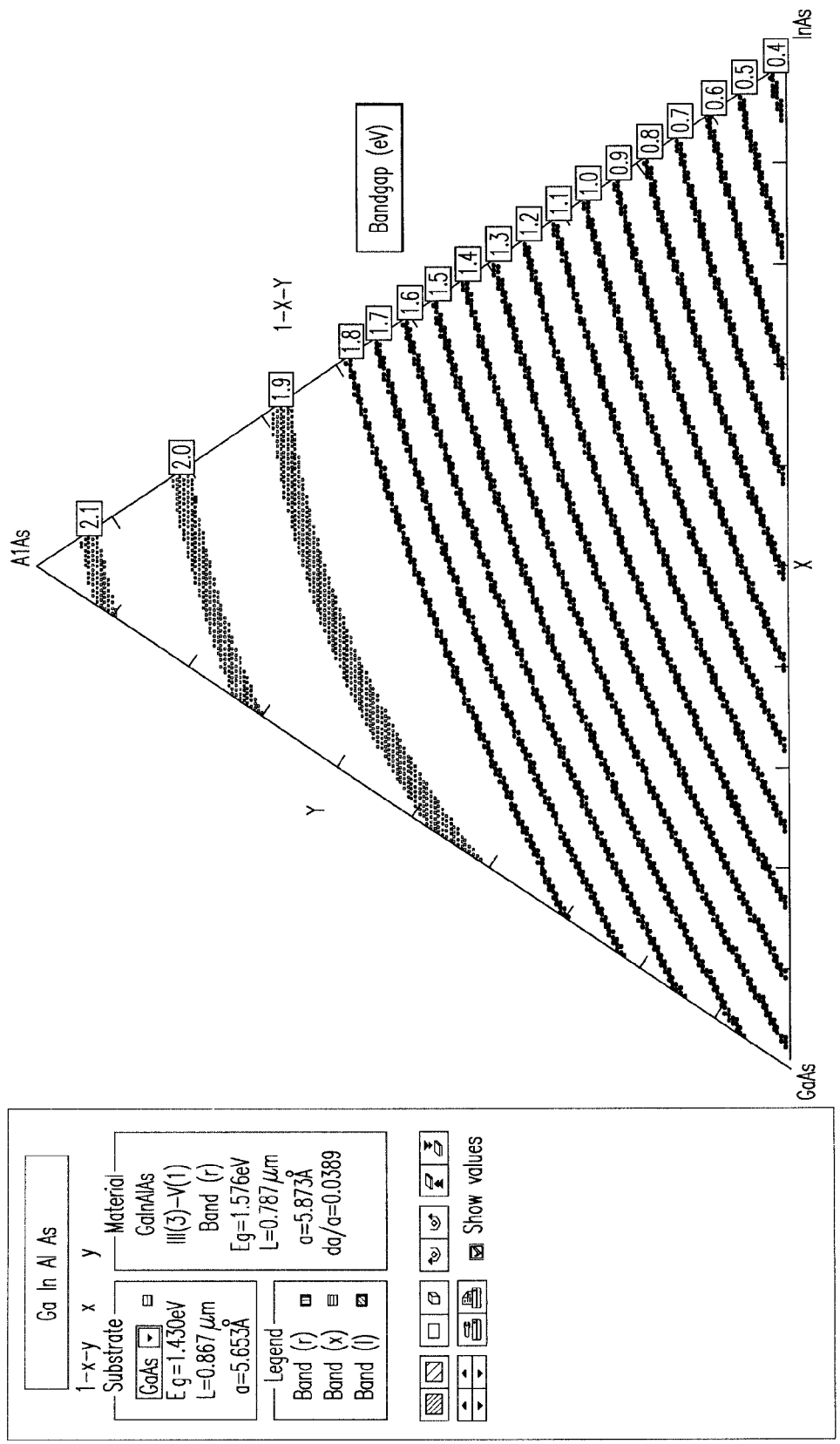
FIG. 18 is a diagram representing the range of band gaps of various GaInAlAs materials as a function of the relative concentration of Al, In, and Ga.

FIG. 18 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 19:
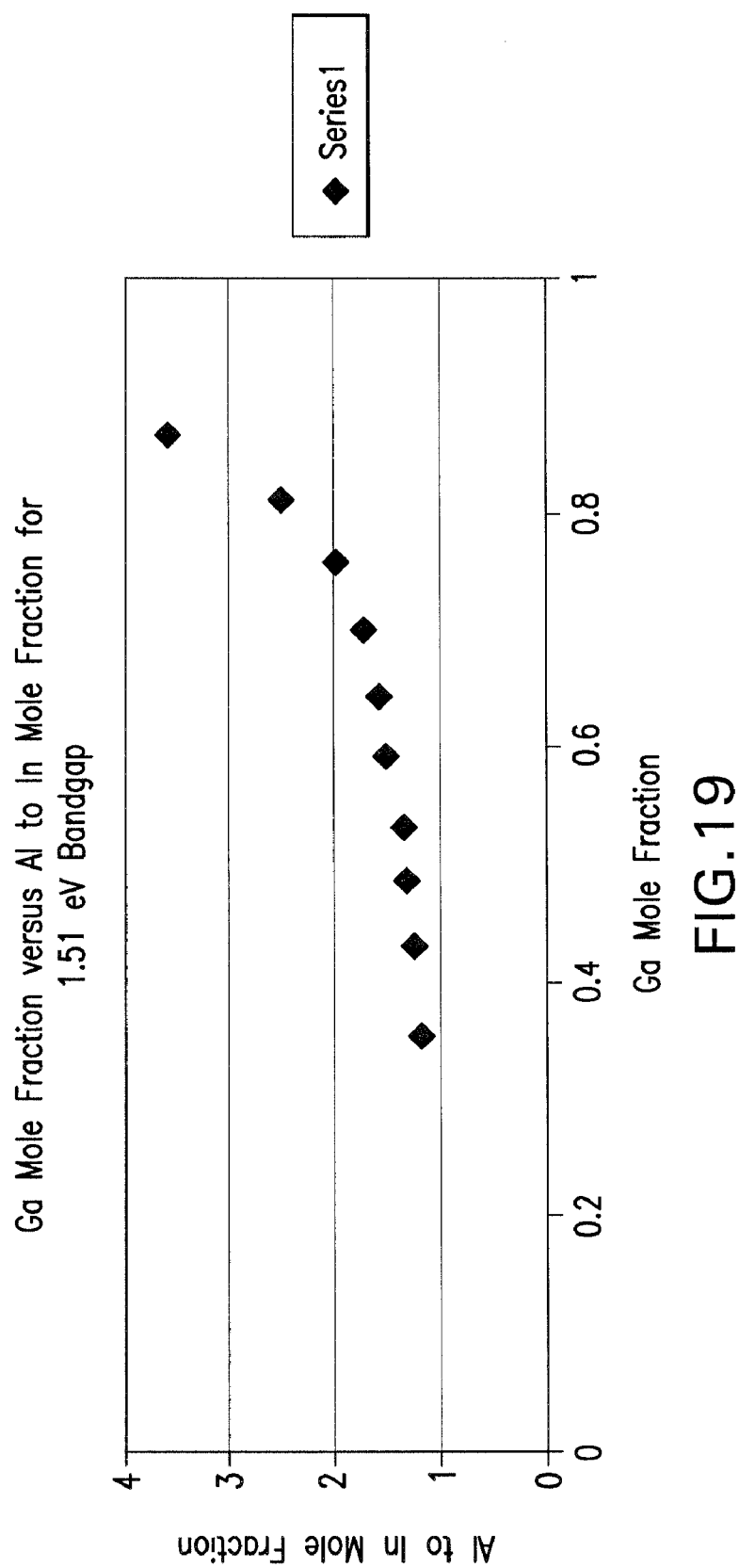
FIG. 19 is a graph representing the Ga mole fraction versus the Al to In mole fraction in GaInAlAs materials that is necessary to achieve a constant 1.5 eV band gap.

FIG. 19 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 20:
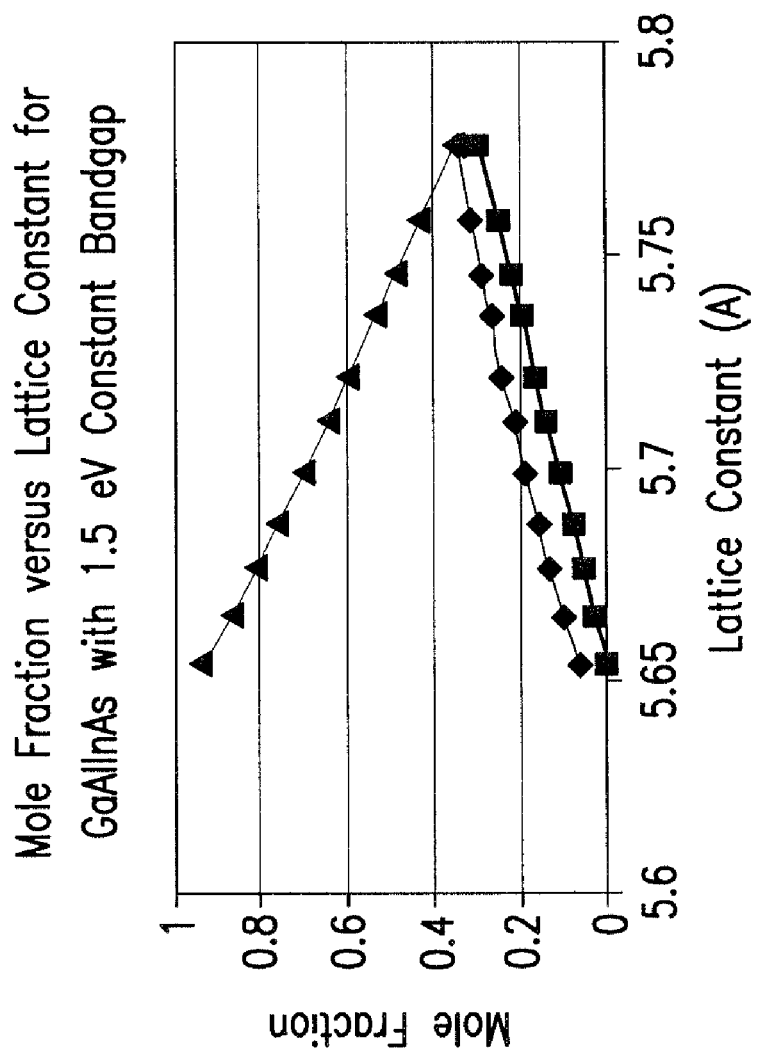
FIG. 20 is a graph representing the mole fraction versus lattice constant in GaInAlAs materials that is necessary to achieve a constant 1.5 eV band gap.

FIG. 20 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap.

It will be understood that each of the elements described above, or two or more together, also may find a useful application in other types of constructions differing from the types of constructions described above.

Although some of the embodiments of the present invention utilize a vertical stack of three subcells, the present invention can apply to stacks with fewer or greater number of subcells, i.e. two junction cells, four junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192 filed Nov. 14, 2008.

In addition, although in some embodiments the solar cell is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, embodiments of the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some embodiments, a thin so-called "intrinsic layer" may be placed between the emitter layer and base layer of some subcells, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Ser. No. 12/253,051 filed Oct. 16, 2008.

The composition of the window or BSF layers may utilize other semiconductor compounds, subject to lattice constant and band gap requirements, and in some embodiments may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Without further analysis, from the foregoing, others can, by applying current knowledge, readily adapt the present disclosure for various applications. Such adaptations should and are intended to be comprehended within the meaning and range of equivalence of the following claims.

The invention claimed is:

1. A method of manufacturing a solar cell comprising:
providing a first substrate;
depositing on the first substrate a sequence of layers of semiconductor material forming a solar cell including a top subcell and a bottom subcell;
forming a metal back contact over the bottom subcell;
forming a group of discrete, spaced-apart first bonding elements over the surface of the back metal contact;
forming a group of discrete, spaced-apart second bonding elements over the surface of a surrogate substrate prior to the surface of the surrogate substrate being attached to the bonding elements of the back metal contact;
attaching the surrogate substrate on top of the back metal contact using the bonding elements, wherein the second bonding elements over the surface of the surrogate substrate are linearly aligned in parallel rows and are uniformly distributed over the surrogate substrate, and after being attached to the first bonding elements of the back metal contact, the parallel rows of the second bonding elements are aligned in a direction that is offset by approximately 45 degrees with respect to the linear alignment of the parallel rows of the first bonding elements of the back metal contact; and
removing the first substrate to expose the surface of the top subcell.

2. A method of forming a solar cell as defined in claim 1, wherein the first substrate is removed by grinding or lapping.

3. A method of forming a solar cell as defined in claim 1, further comprising removing the surrogate substrate.

4. A method of forming a solar cell as defined in claim 1, wherein the bonding elements are approximately 50 microns in length.

5. A method of forming a solar cell as defined in claim 1, wherein the bonding elements are spaced apart by approximately 20 microns.

6. A method of forming a solar cell as defined in claim 1, wherein the bonding elements are approximately 2 to 4 microns in thickness.

7. A method of forming a solar cell as defined in claim 1, wherein the bonding elements are substantially square in shape.

8. A method of forming a solar cell as defined in claim 1, wherein the bonding elements are linearly aligned in parallel rows and uniformly distributed over the back metal contact.

9. A method of forming a solar cell as defined in claim 1, wherein the bonding elements include a AuSn, SnAgCu, or PbSn solder.

10. A method of forming a solar cell as defined in claim 1, wherein the attaching is performed by soldering, and further comprising a non-wetting material peripherally surrounding each of the bonding elements for controlling the spread of the liquid solder during the attaching step.

11. A method of forming a solar cell as defined in claim 10, wherein the non-wetting material peripherally surrounding each of the bonding elements is composed of Ni or Nb.

12. A method of forming a solar cell as defined in claim 1, wherein the back metal contact has a coefficient of thermal expansion within a range of 0 to 10 ppm per degree Kelvin different from that of the adjacent semiconductor material of the semiconductor solar cell.

13. A method as defined in claim 1, wherein the coefficient of thermal expansion of the back metal contact is in the range of 5 to 7 ppm per degree Kelvin.

14. A method of forming a solar cell as defined in claim 1 comprising:
providing a first substrate;
depositing on a first substrate a sequence of layers of semiconductor material forming a solar cell including a top subcell and a bottom subcell;
forming a metal back contact over the bottom subcell;
forming a group of discrete, spaced-apart first bonding elements over the surface of the back metal contact;
attaching a surrogate substrate on top of the back metal contact using the bonding elements; and
removing the first substrate to expose the surface of the top subcell, wherein depositing the sequence of layers comprises:
forming a top first solar subcell on said first substrate having a first band gap;
forming a middle second solar subcell over said first solar subcell having a second band gap smaller than said first band gap;
forming a grading interlayer having a third band gap over said second solar subcell; and
forming a bottom third solar subcell over said grading interlayer having a fourth band gap smaller than said second band gap such that said third subcell is lattice mismatched with respect to said second subcell.

* * * * *